US012707752B2

(12) United States Patent
Tomekawa et al.

(10) Patent No.: US 12,707,752 B2
(45) Date of Patent: Aug. 11, 2026

(54) IMAGING DEVICE

(71) Applicant: Panasonic Intellectual Property Management Co., Ltd., Osaka (JP)

(72) Inventors: Yuuko Tomekawa, Osaka (JP); Kazuko Nishimura, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 475 days.

(21) Appl. No.: 18/303,604

(22) Filed: Apr. 20, 2023

(65) Prior Publication Data

US 2023/0268371 A1 Aug. 24, 2023

Related U.S. Application Data

(63) Continuation of application No. PCT/JP2021/038344, filed on Oct. 18, 2021.

(30) Foreign Application Priority Data

Nov. 13, 2020 (JP) ................................ 2020-189864

(51) Int. Cl.
*H10F 39/00* (2025.01)
*H04N 23/20* (2023.01)
*H10F 39/18* (2025.01)

(52) U.S. Cl.
CPC .......... *H10F 39/813* (2025.01); *H04N 23/20* (2023.01); *H10F 39/182* (2025.01);
(Continued)

(58) Field of Classification Search
CPC ........ H04N 23/20; H04N 25/76; H04N 25/77; H04N 25/70; H04N 25/134; H04N 25/704;
(Continued)

(56) References Cited

U.S. PATENT DOCUMENTS

2011/0019042 A1* 1/2011 Yamaguchi ......... H10F 39/1825
257/E31.127
2011/0216212 A1* 9/2011 Watanabe ........... H10F 39/8037
257/292
(Continued)

FOREIGN PATENT DOCUMENTS

JP 2011-243704 12/2011
WO 2011/145153 11/2011
(Continued)

OTHER PUBLICATIONS

International Search Report of PCT application No. PCT/JP2021/038344 dated Dec. 28, 2021.

*Primary Examiner* — Mouloucoulaye Inoussa
(74) *Attorney, Agent, or Firm* — Rimon P.C.

(57) ABSTRACT

An imaging device includes a first photoelectric converter, a second photoelectric converter, and a first capacitive element. The first photoelectric converter converts light having a wavelength in a first wavelength region into first electric charge. The second photoelectric converter converts light having a wavelength in a second wavelength region into second electric charge. The second photoelectric converter is arranged at a different height from the first photoelectric converter in a thickness direction of the imaging device. The first capacitive element accumulates the first electric charge and the second electric charge.

15 Claims, 21 Drawing Sheets

(52) U.S. Cl.
CPC ......... *H10F 39/184* (2025.01); *H10F 39/189* (2025.01); *H10F 39/803* (2025.01)

(58) Field of Classification Search
CPC .... H10F 39/189; H10F 39/184; H10F 39/182; H10F 39/813; H10F 39/12; H10F 39/8053; H10F 39/8037; H10F 39/10; H10F 39/8033; H10F 39/803; H10F 39/191; H10F 39/1847; H10F 39/1825; H10F 77/143; H10F 39/8063; H10F 77/413; H10F 39/806; H10F 39/024; H10F 39/811; H10D 84/038; H10K 39/32
See application file for complete search history.

(56) References Cited

U.S. PATENT DOCUMENTS

| | | | | |
|---|---|---|---|---|
| 2013/0001730 | A1* | 1/2013 | Miyanami | H10F 39/199 257/443 |
| 2015/0070556 | A1* | 3/2015 | Joei | H10K 39/32 348/311 |
| 2015/0091123 | A1* | 4/2015 | Chang | H10F 39/103 257/448 |
| 2015/0325606 | A1* | 11/2015 | Togashi | H04N 25/63 257/443 |
| 2016/0133865 | A1* | 5/2016 | Yamaguchi | H10F 39/8057 257/40 |
| 2016/0204156 | A1* | 7/2016 | Togashi | H01L 23/481 257/292 |
| 2017/0148838 | A1* | 5/2017 | Togashi | H10F 39/191 |
| 2017/0148841 | A1* | 5/2017 | Matsumoto | H10F 39/199 |
| 2017/0287982 | A1* | 10/2017 | Joei | H10F 39/8023 |
| 2017/0373107 | A1 | 12/2017 | Koga | |
| 2018/0047766 | A1* | 2/2018 | Pyo | H10F 39/807 |
| 2018/0175114 | A1* | 6/2018 | Lee | H04N 25/133 |
| 2018/0277604 | A1* | 9/2018 | Joei | H10K 19/201 |
| 2018/0342558 | A1* | 11/2018 | Hirata | H10K 39/32 |
| 2019/0081251 | A1* | 3/2019 | Obana | H10K 85/6574 |
| 2020/0105837 | A1* | 4/2020 | Hirata | H10F 39/813 |
| 2020/0286934 | A1* | 9/2020 | Hirase | H04N 25/57 |
| 2020/0322556 | A1 | 10/2020 | Tokuhara et al. | |
| 2020/0374475 | A1* | 11/2020 | Fukuoka | H10K 39/32 |
| 2021/0013254 | A1* | 1/2021 | Ikehara | H10K 30/88 |
| 2021/0029317 | A1* | 1/2021 | Ando | H10F 39/8023 |
| 2021/0242271 | A1* | 8/2021 | Park | H10F 39/1847 |
| 2023/0007192 | A1* | 1/2023 | Lee | H04N 25/532 |

FOREIGN PATENT DOCUMENTS

| | | |
|---|---|---|
| WO | 2016/121521 | 8/2016 |
| WO | 2019/131028 | 7/2019 |

* cited by examiner

FBOUT
46
47
42
41
SIG
45
40
FBOUT
46
47
42
41
SIG
45
40
HORIZONTAL SIGNAL READ-OUT CIRCUIT
54

12

17

15

13

60
61
65
63
66
62

102
17e
15e
13e
19e
23
27
9
8
7
1g
1
21e
12e
31e
4e
37e
36e
23
5e
60e
102
17d
15d
13d
19d
21d
12d
31d
4d
37d
36d
5d
60d
102
17c
15c
13c
19c
21c
12c
31c
4c
37c
36c
5c
60c

OB
L2
L1
502
500
100A
IMAGING DEVICE
INFRARED LIGHT SOURCE
501
VISIBLE LIGHT DATA
INFRARED LIGHT DATA
506
503
504
505
EDGE PROCESSING CIRCUIT
ISP
SIGNAL PROCESSING CIRCUIT
EDGE PROCESSING CIRCUIT
508a
CLOUD/EXTERNAL DEVICE
CLOUD/EXTERNAL DEVICE
508b
EXTERNAL DISPLAY
EXTERNAL DISPLAY
EXTERNAL DISPLAY
509a
509b
509c

IMAGING DEVICE

BACKGROUND

1. Technical Field

The present disclosure relates to an imaging device.

2. Description of the Related Art

Imaging devices are widely used in various fields of products such as video cameras, digital still cameras, surveillance cameras, and vehicle-mounted cameras. As the imaging devices, charge-coupled device (CCD) imaging devices or complementary metal-oxide semiconductor (CMOS) imaging devices are used.

An imaging device includes a photoelectric converter. An example of the photoelectric converter includes a photodiode. Another example of the photoelectric converter includes a pair of electrodes and a photoelectric conversion layer sandwiched between these electrodes.

In recent years, imaging devices have increased in pixel density, and pixels have tended to become smaller in size. In line with this, the areas of photoelectric converters have tended to be reduced.

Japanese Unexamined Patent Application Publication No. 2011-243704 discloses an imaging device that has a plurality of photoelectric converters that are stacked. This type of imaging device may be referred to as a multilayer imaging device. Multilayer imaging devices are advantageous in terms of realization of higher pixel density.

SUMMARY

In one general aspect, the techniques disclosed here feature an imaging device including a first photoelectric converter that converts light having a wavelength in a first wavelength region into first electric charge, a second photoelectric converter that is arranged at a different height from the first photoelectric converter in a thickness direction of the imaging device and that converts light having a wavelength in a second wavelength region into second electric charge, and a first capacitive element that accumulates the first electric charge and the second electric charge.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTIONS

Figure 1:
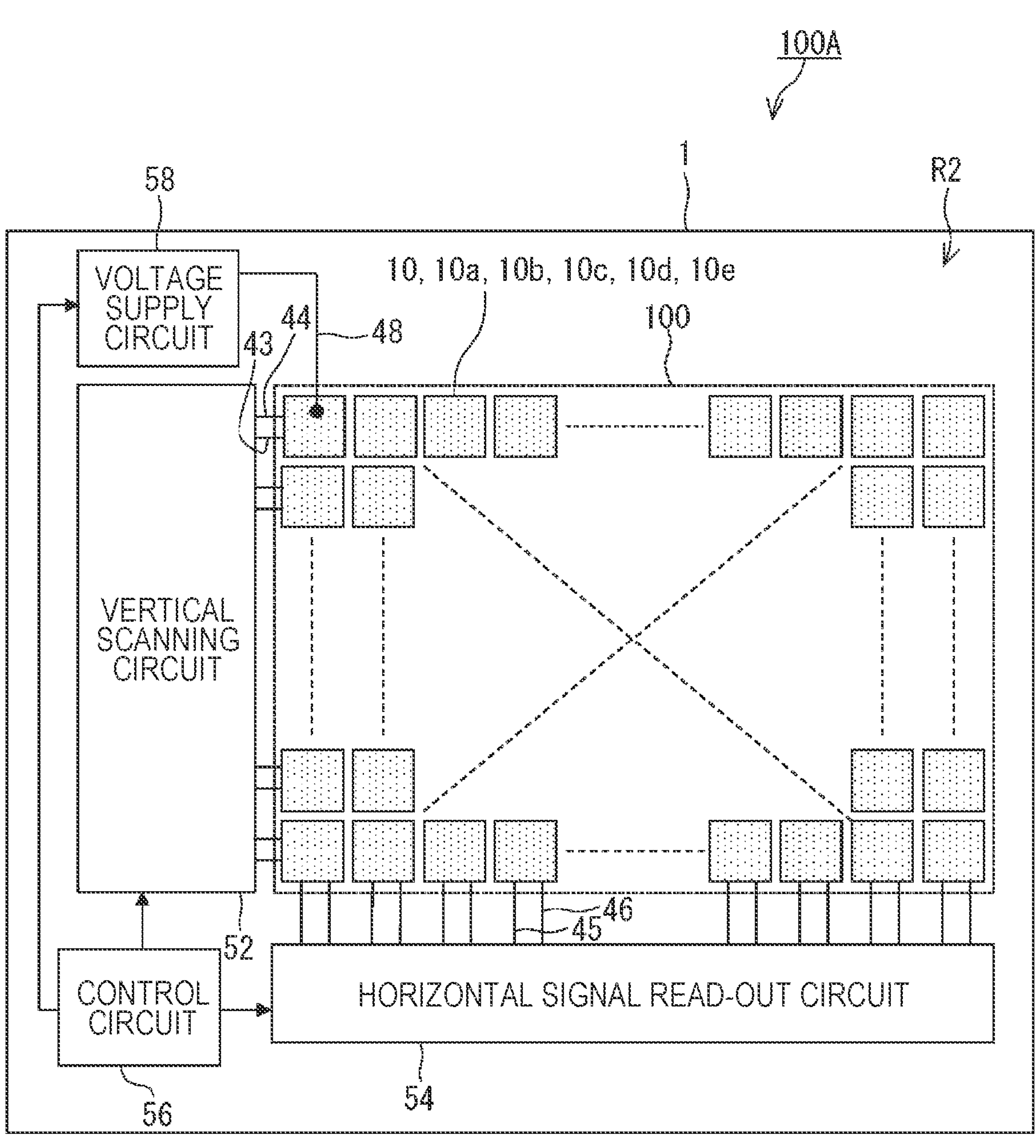
FIG. 1 is a configuration diagram of an imaging device according to a first embodiment.

Summary of One Embodiment According to Present Disclosure

An imaging device according to a first aspect of the present disclosure includes

- a first photoelectric converter that converts light having a wavelength in a first wavelength region into first electric charge,
- a second photoelectric converter that is arranged at a different height from the first photoelectric converter in a thickness direction of the imaging device and that converts light having a wavelength in a second wavelength region into second electric charge, and
- a first capacitive element that accumulates the first electric charge and the second electric charge. The imaging device may have a plurality of layers, and the second photoelectric converter may be arranged in a different layer from the first photoelectric converter among the plurality of layers.

The technology according to the first aspect is suitable for realization of a wide dynamic range.

In a second aspect of the present disclosure, for example, in the imaging device according to the first aspect, the first capacitive element may have a metal-insulator-metal (MIM) structure.

According to the second aspect, the first capacitive element, which has high capacitance density, can be realized.

In a third aspect of the present disclosure, for example, the imaging device according to the first or second aspect may further include a first switching device, and the first photoelectric converter and the first capacitive element may be connected to each other via the first switching device.

According to the third aspect, the first switching device can be used to switch whether to allow first electric charge to flow from the first photoelectric converter to the first capacitive element.

In a fourth aspect of the present disclosure, for example, in the imaging device according to the first or second aspect, the first photoelectric converter and the first capacitive element may be connected to each other without a switching device between the first photoelectric converter and the first capacitive element.

In the fourth aspect, a connection configuration between the first photoelectric converter and the first capacitive element can be made simple.

In a fifth aspect of the present disclosure, for example, the imaging device according to any one out of the first to fourth aspects may further include a second switching device, and the second photoelectric converter and the first capacitive element may be connected to each other via the second switching device.

According to the fifth aspect, the second switching device can be used to switch whether to allow second electric charge to flow from the second photoelectric converter to the first capacitive element.

In a sixth aspect of the present disclosure, for example, the imaging device according to any one out of the first to fourth aspects, the second photoelectric converter and the first capacitive element may be connected to each other without a switching device between the second photoelectric converter and the first capacitive element.

In the sixth aspect, a connection configuration between the second photoelectric converter and the first capacitive element can be made simple.

In a seventh aspect of the present disclosure, for example, in the imaging device according to any one out of the first to sixth aspects, the first photoelectric converter may include a first photoelectric conversion layer that generates the first electric charge, the first photoelectric converter may include a first pixel electrode that collects the first electric charge, the second photoelectric converter may include a second photoelectric conversion layer that generates the second electric charge, and the second photoelectric converter may include a second pixel electrode that collects the second electric charge.

According to the seventh aspect, electric charge corresponding to the amount of light may be collected by the pixel electrodes.

In an eighth aspect of the present disclosure, for example, in the imaging device according to the seventh aspect, in a plan view, the first pixel electrode may have a larger area than the second pixel electrode.

The imaging device according to the eighth aspect easily collects, using the first pixel electrode, the first electric charge even when light of the first wavelength region is low.

In a ninth aspect of the present disclosure, for example, in the imaging device according to the seventh aspect or the eighth aspect, the first photoelectric converter may further include a first counter electrode, the first photoelectric conversion layer may be arranged between the first counter electrode and the first pixel electrode, the second photoelectric converter may further include a second counter electrode, the second photoelectric conversion layer may be arranged between the second counter electrode and the second pixel electrode, and the first counter electrode and the second counter electrode may be electrically separated from each other.

According to the ninth aspect, a period in which the first photoelectric converter may generate the first electric charge and a period in which the second photoelectric conversion layer may generate the second electric charge can be switched.

In a tenth aspect of the present disclosure, for example, in the imaging device according to any one out of the first to ninth aspects, in a case where, out of the first photoelectric converter and the second photoelectric converter, a photoelectric converter closer to a light receiving surface of the imaging device is defined as a proximal photoelectric converter, and a photoelectric converter farther from the light receiving surface is defined as a distal photoelectric converter, a central wavelength of a wavelength region of light that the proximal photoelectric converter photoelectrically converts may be shorter than a central wavelength of a wavelength region of light that the distal photoelectric converter photoelectrically converts.

Short wavelength light is more likely to be attenuated than long wavelength light. However, according to the tenth aspect, attenuation of short wavelength light can be reduced.

In an eleventh aspect of the present disclosure, for example, in the imaging device according to any one out of the first to tenth aspects, the first wavelength region may include a wavelength region of infrared light.

The first photoelectric converter according to the eleventh aspect can convert infrared light into electric charge.

In a twelfth aspect of the present disclosure, for example, in the imaging device according to any one out of the first to tenth aspects, the first wavelength region may include a wavelength region of ultraviolet light.

The first photoelectric converter according to the twelfth aspect can convert ultraviolet light into electric charge.

In a thirteenth aspect of the present disclosure, for example, in the imaging device according to any one out of the first to twelfth aspects, the second wavelength region may include a wavelength region of visible light.

The second photoelectric converter according to the thirteenth aspect can convert visible light into electric charge.

In a fourteenth aspect of the present disclosure, for example, the imaging device according to any one out of the first to thirteenth aspects may further include a plurality of unit pixels arranged in a matrix shape, each of the plurality of unit pixels may include the first photoelectric converter, the second photoelectric converter, the first capacitive element, a third photoelectric converter, and a second capacitive element, the first wavelength region may include a wavelength region of infrared light or ultraviolet light, the second wavelength region may include a wavelength region of first color light, the third photoelectric converter may convert the first color light into third electric charge, and the second capacitive element may accumulate the third electric charge.

According to the fourteenth aspect, electric charge corresponding to infrared light or ultraviolet light and electric charge corresponding to the first color light can be accumulated in different respective capacitive elements in the same period.

In a fifteenth aspect of the present disclosure, for example, in the imaging device according to the fourteenth aspect, each of the plurality of unit pixels may further include a fourth photoelectric converter, a fifth photoelectric converter, a third capacitive element, a fourth capacitive element, a first switching device, and a second switching device, the fourth photoelectric converter may convert second color light into fourth electric charge, the fifth photoelectric converter may convert third color light into fifth electric charge, the third capacitive element may accumulate the fourth electric charge, the fourth capacitive element may accumulate the fifth electric charge, the second photoelectric converter, the third photoelectric converter, the fourth photoelectric converter, and the fifth photoelectric converter may be configured such that whether to allow the second photoelectric converter, the third photoelectric converter, the fourth photoelectric converter, and the fifth photoelectric converter to be sensitive to light is controlled in a collective manner, the first photoelectric converter and the first capacitive element may be connected to each other via the first switching device, and the second photoelectric converter and the first capacitive element may be connected to each other via the second switching device.

According to the fifteenth aspect, electric charge corresponding to infrared light or ultraviolet light, electric charge corresponding to the first color light, electric charge corresponding to the second color light, and electric charge corresponding to the third color light can be accumulated in different respective capacitive elements in the same period.

In embodiments, words such as "above" and "below" are used to specify arrangement of members only in relation to one another in an imaging device and are not intended to limit the orientation of the imaging device when the imaging device is used. In the illustrated examples, "upward" and "downward" directions are determined with respect to a semiconductor substrate. A direction away from the semiconductor substrate is an upward direction. A direction toward the semiconductor substrate is a downward direction.

In the embodiments, a "plan view" refers to a view seen from the thickness direction of the semiconductor substrate.

In the embodiments, the wavelength region of visible light refers to a wavelength range of greater than or equal to 400 nm and less than 780 nm. The wavelength region of red light refers to a wavelength range of greater than or equal to 610 nm and less than 780 nm. The wavelength region of green light refers to a wavelength range of greater than or equal to 500 nm and less than 570 nm. The wavelength region of blue light refers to a wavelength range of greater than or equal to 460 nm and less than 500 nm. The wavelength region of infrared light refers to a wavelength range of greater than or equal to 780 nm and less than 2000 nm. The wavelength region of ultraviolet light refers to a wavelength range of greater than or equal to 200 nm and less than 400 nm. In the embodiments, "a certain wavelength region including a specific wavelength region" refers to the certain wavelength region including at least part of the specific wavelength region. For example, "the first wavelength region including the wavelength region of infrared light" refers to the first wavelength region including at least part of the wavelength region of infrared light.

In the embodiments, "have translucency" refers to the property of having a light transmittance of 40% or higher for a wavelength region of greater than or equal to 380 nm and less than or equal to 780 nm. This transmittance is based on the Japanese Industrial Standards (JIS) R1635 (1998). In a case where an electrode has translucency, visible light can pass through the electrode. Moreover, in this case, infrared light and ultraviolet light also tend to be more likely to pass through the electrode.

In the embodiments, "permittivity" corresponds to values at 25° C. and at 100 Hz.

In the embodiments, "materials being the same" refers to elements used as the materials being the same and also the composition ratios of the elements being the same. "Materials being different" refers to not only a case where elements used as the materials are different but also a case where the composition ratios of the elements are different even though the elements used as the materials are the same.

In the embodiments, individual elements may be adjusted, as needed, due to change of positive-negative of signal charge such as change of the conductivity type of an impurity region. Moreover, terms may be read differently, as needed, due to change of positive-negative of signal charge.

In the embodiments, ordinal numerals such as first, second, and third may be used. In a case where an ordinal numeral is assigned to a certain element, an element of the same kind and having a smaller ordinal numeral does not have to be present. For example, use of a term such as a "second color filter" does not necessarily mean that a first color filter is present together with the second color filter every time. Moreover, an ordinal numeral may be changed to another ordinal numeral, an ordinal numeral may be removed, or an ordinal numeral may be added as needed.

Embodiments of the present disclosure will be described below with reference to the drawings. The present disclosure is not limited to the following embodiments.

First Embodiment

FIG. 1 illustrates the configuration of an imaging device 100A according to a first embodiment of the present disclosure. The imaging device 100A includes an imaging element 100.

The imaging element 100 includes at least one unit pixel 10, which is formed using a semiconductor substrate 1. In the present embodiment, a plurality of unit pixels 10 are formed using the semiconductor substrate 1. The semiconductor substrate 1 is, for example, a silicon substrate.

In the present embodiment, each unit pixel 10 includes a first pixel 10*a*, a second pixel 10*b*, a third pixel 10*c*, a fourth pixel 10*d*, and a fifth pixel 10*e*. Note that the unit pixel 10 does not have to include all of these pixels. Moreover, the unit pixel 10 may include other pixels in addition to these pixels.

In the present embodiment, the central wavelengths of wavelength regions of light that the first pixel 10*a*, the second pixel 10*b*, the fourth pixel 10*d*, and the fifth pixel 10*e* photoelectrically convert are different from each other. In contrast, the central wavelengths of wavelength regions of light that the second pixel 10*b* and the third pixel 10*c* photoelectrically convert are equal to each other or have values close to each other.

The first pixel 10*a* is a pixel for generating data based on light of a first wavelength region. In the present embodiment, the first wavelength region includes the wavelength region of infrared light.

The second pixel 10*b* is a pixel for generating data based on light of a second wavelength region. In the present embodiment, the second wavelength region includes the wavelength region of visible light. Specifically, the second wavelength region includes the wavelength region of first color light. More specifically, the first color light is green light.

The third pixel 10*c* is a pixel for generating data based on light of a third wavelength region. In the present embodiment, the third wavelength region includes the wavelength region of visible light. Specifically, the third wavelength region includes the wavelength region of the first color light. More specifically, the first color light is green light.

The fourth pixel 10*d* is a pixel for generating data based on light of a fourth wavelength region. In the present embodiment, the fourth wavelength region includes the wavelength region of visible light. Specifically, the fourth wavelength region includes the wavelength region of second color light. More specifically, the second color light is red light.

The fifth pixel 10*e* is a pixel for generating data based on light of a fifth wavelength region. In the present embodiment, the fifth wavelength region includes the wavelength region of visible light. Specifically, the fifth wavelength region includes the wavelength region of third color light. More specifically, the third color light is blue light.

Data to be generated by the unit pixels 10 is typically image data. Images based on visible light can be obtained by the second pixels 10*b*, the third pixels 10*c*, the fourth pixels 10*d*, and the fifth pixels 10*e*. In the present embodiment, images based on visible light are full-color images. Note that images based on visible light may also be monochrome images. Images based on infrared light can be obtained by the first pixels 10*a*.

Each pixel in each unit pixel 10 includes a photoelectric converter. The photoelectric converter generates, upon receiving incident light, positive charge and negative charge. The photoelectric converter typically generates electron-hole pairs. In FIG. 1, the unit pixels 10 are illustrated so as to be spatially separated from each other. Note that this is just for the sake of explanatory convenience. The plurality of unit pixels 10 may be continuously arranged so as not to have a spacing therebetween. Similarly, the photoelectric converters of each unit pixel 10 may be arranged so as to be spatially separated from each other or may be continuously arranged so as not to have a spacing therebetween.

In FIG. 1, the unit pixels 10 are arranged in a plurality of rows (m rows) and a plurality of columns (n columns), where m and n are independent of each other and are integers greater than or equal to 1. The unit pixels 10 form an imaging region by being arranged, for example, two-dimensionally. When the imaging device 100A is viewed in a plan view, the imaging element 100 may be defined as a region where the photoelectric converters are present.

The number of unit pixels 10 and the layout of the unit pixels 10 are not specifically limited. In FIG. 1, the center of each unit pixel 10 is positioned at a grid point of a square grid. The plurality of unit pixels 10 may be arranged such that the center of each unit pixel 10 is positioned at a grid point of, for example, a triangular grid, a hexagonal grid, or the like. The imaging element 100 may be used as a line sensor that is obtained by arranging the unit pixels 10 one-dimensionally.

In the present embodiment, the number of pixels is equal to the number of photoelectric converters. In the present embodiment, each pixel has one pixel electrode. Thus, the number of pixels is equal to the number of pixel electrodes.

In the imaging device 100A, a peripheral circuit is formed using the semiconductor substrate 1.

The peripheral circuit includes a vertical scanning circuit 52, a horizontal signal read-out circuit 54, a control circuit 56, and a voltage supply circuit 58. The peripheral circuit may further include a signal processing circuit, an output circuit, and so forth. Each circuit is formed using the semiconductor substrate 1. The unit pixels 10 may be formed using the semiconductor substrate 1, and part or the entirety of the peripheral circuit may be formed using another substrate.

In the present embodiment, the first pixels 10*a* are arranged in a matrix shape. The same applies to the second pixels 10*b*, the third pixels 10*c*, the fourth pixels 10*d*, and the fifth pixels 10*e*.

The first pixels 10*a* and the second pixels 10*b* share common configurations 97. First circuit configurations 98*ab* include the common configurations 97, the photoelectric converters of the first pixels 10*a*, and the photoelectric converters of the second pixels 10*b*. The first circuit configurations 98*ab* can be regarded as being arranged in a matrix shape.

The third pixels 10*c*, the fourth pixels 10*d*, and the fifth pixels 10*e* each have a circuit configuration 99. Hereinafter the circuit configurations 99 of the third pixels 10*c* may be referred to as second circuit configurations 99*c*. The circuit configurations 99 of the fourth pixels 10*d* may be referred to as third circuit configurations 99*d*. The circuit configurations 99 of the fifth pixels 10*e* may be referred to as fourth circuit configurations 99*e*. The second circuit configurations 99*c* can be regarded as being arranged in a matrix shape. The third circuit configurations 99*d* can be regarded as being arranged in a matrix shape. The fourth circuit configurations 99*e* can be regarded as being arranged in a matrix shape.

The matrix of the first circuit configurations 98*ab* is associated with the vertical scanning circuit 52 and the horizontal signal read-out circuit 54. The same applies to the matrix of the second circuit configurations 99*c*, that of the third circuit configurations 99*d*, and that of the fourth circuit configurations 99*e*. The vertical scanning circuit 52 is also referred to as a row scanning circuit. The horizontal signal read-out circuit 54 is also referred to as a column scanning circuit.

Regarding the plurality of rows of the first circuit configurations 98*ab*, address signal lines 44 are provided so as to correspond to the respective rows, and the address signal lines 44 are connected to the vertical scanning circuit 52. Regarding the plurality of rows of the first circuit configurations 98*ab*, reset signal lines 43 are provided so as to correspond to the respective rows, and the reset signal lines 43 are connected to the vertical scanning circuit 52. Regarding the plurality of columns of the first circuit configurations 98*ab*, vertical signal lines 45 are provided so as to correspond to the respective columns, and the vertical signal lines 45 are connected to the horizontal signal read-out circuit 54. Regarding the plurality of columns of the first circuit configurations 98*ab*, feedback lines 46 are provided so as to correspond to the respective columns, and the feedback lines 46 are connected to the horizontal signal read-out circuit 54. In these respects, the same applies to the second circuit configurations 99*c*, the third circuit configurations 99*d*, and the fourth circuit configurations 99*e*.

Regarding the first circuit configurations 98*ab*, the vertical scanning circuit 52 outputs a predetermined voltage to the address signal lines 44 to select, on a row basis, the first circuit configurations 98*ab* arranged in the rows. As a result, signal voltages are read out from the first pixels 10*a* or the second pixels 10*b* related to the selected first circuit configurations 98*ab*, and the pixel electrodes of the selected first circuit configurations 98*ab* are reset.

Regarding the second circuit configurations 99*c*, the vertical scanning circuit 52 outputs a predetermined voltage to the address signal lines 44 to select, on a row basis, the second circuit configurations 99*c* arranged in the rows. As a result, signal voltages are read out from the selected second circuit configurations 99*c*, and the pixel electrodes of the selected second circuit configurations 99*c* are reset. In these respects, the same applies to the third circuit configurations 99*d* and the fourth circuit configurations 99*e*.

The address signal lines 44 provided so as to correspond to the respective rows of the plurality of first circuit configurations 98*ab* can be referred to as first address signal lines 44. The reset signal lines 43 provided so as to correspond to the respective rows of the plurality of first circuit configurations 98*ab* can be referred to as first reset signal lines 43. The vertical signal lines 45 provided so as to correspond to the respective columns of the first circuit configurations 98*ab* can be referred to as first vertical signal lines 45. The feedback lines 46 provided so as to correspond to the respective columns of the first circuit configurations 98*ab* can be referred to as first feedback lines 46.

The address signal lines 44 provided so as to correspond to the respective rows of the plurality of second circuit configurations 99*c* can be referred to as second address signal lines 44. The reset signal lines 43 provided so as to correspond to the respective rows of the plurality of second circuit configurations 99*c* can be referred to as second reset signal lines 43. The vertical signal lines 45 provided so as to correspond to the respective columns of the plurality of second circuit configurations 99*c* can be referred to as second vertical signal lines 45. The feedback lines 46 provided so as to correspond to the respective columns of the plurality of second circuit configurations 99*c* can be referred to as second feedback lines 46. Description can also be valid that is obtained by changing, in these descriptions, an ordinal numeral of "second" to "third" and changing "c" to "d" at the ends of the reference numerals. Description can also be valid that is obtained by changing, in these descriptions, an ordinal numeral of "second" to "fourth" and changing "c" to "e" at the ends of the reference numerals.

Signal lines provided so as to correspond to the individual rows of the plurality of first circuit configurations 98*ab* are not limited to the first address signal lines 44 and the first reset signal lines 43. Regarding each of the rows of the first pixels 10*a*, signal lines of other kinds may be connected to the vertical scanning circuit 52. Signal lines provided so as to correspond to the individual columns of the plurality of first circuit configurations 98*ab* are not limited to the first vertical signal lines 45 and the first feedback lines 46. Regarding each of the columns of the first pixels 10*a*, signal lines of other kinds may be connected to the horizontal signal read-out circuit 54. In these respects, the same applies to the second circuit configurations 99*c*, the third circuit configurations 99*d*, and the fourth circuit configurations 99*e*.

In FIG. 1, from the point of view of drawing simplification, one address signal line 44 is illustrated for each row of the unit pixels 10. One reset signal line 43 is illustrated for each row of the unit pixels 10. One vertical signal line 45 is illustrated for each column of the unit pixels 10. One feedback line 46 is illustrated for each column of the unit pixels 10.

The control circuit 56 controls the entirety of the imaging device 100A by receiving command data input from outside the imaging device 100A, a clock signal, or the like. Typically, the control circuit 56 has a timing generator and supplies a driving signal to the vertical scanning circuit 52, the horizontal signal read-out circuit 54, the voltage supply circuit 58, and so forth. The control circuit 56 may be realized by, for example, a microcontroller including one or more processors. The functions of the control circuit 56 may be realized using a combination of a general-purpose processing circuit and software or using hardware specific to such processing.

The voltage supply circuit 58 supplies a predetermined voltage to the first circuit configuration 98*ab*, the second circuit configuration 99*c*, the third circuit configuration 99*d*, and the fourth circuit configuration 99*e* of each unit pixel 10 via a power wiring line 48. The voltage supply circuit 58 is not limited to a specific power supply circuit. The voltage supply circuit 58 may be a circuit that converts a voltage supplied from a power source such as a battery into a predetermined voltage, or a circuit that generates a predetermined voltage. The voltage supply circuit 58 may also be part of the vertical scanning circuit 52 described above. These circuits constituting the peripheral circuit may be arranged in a peripheral region R2 outside the imaging element 100.

Figure 2:
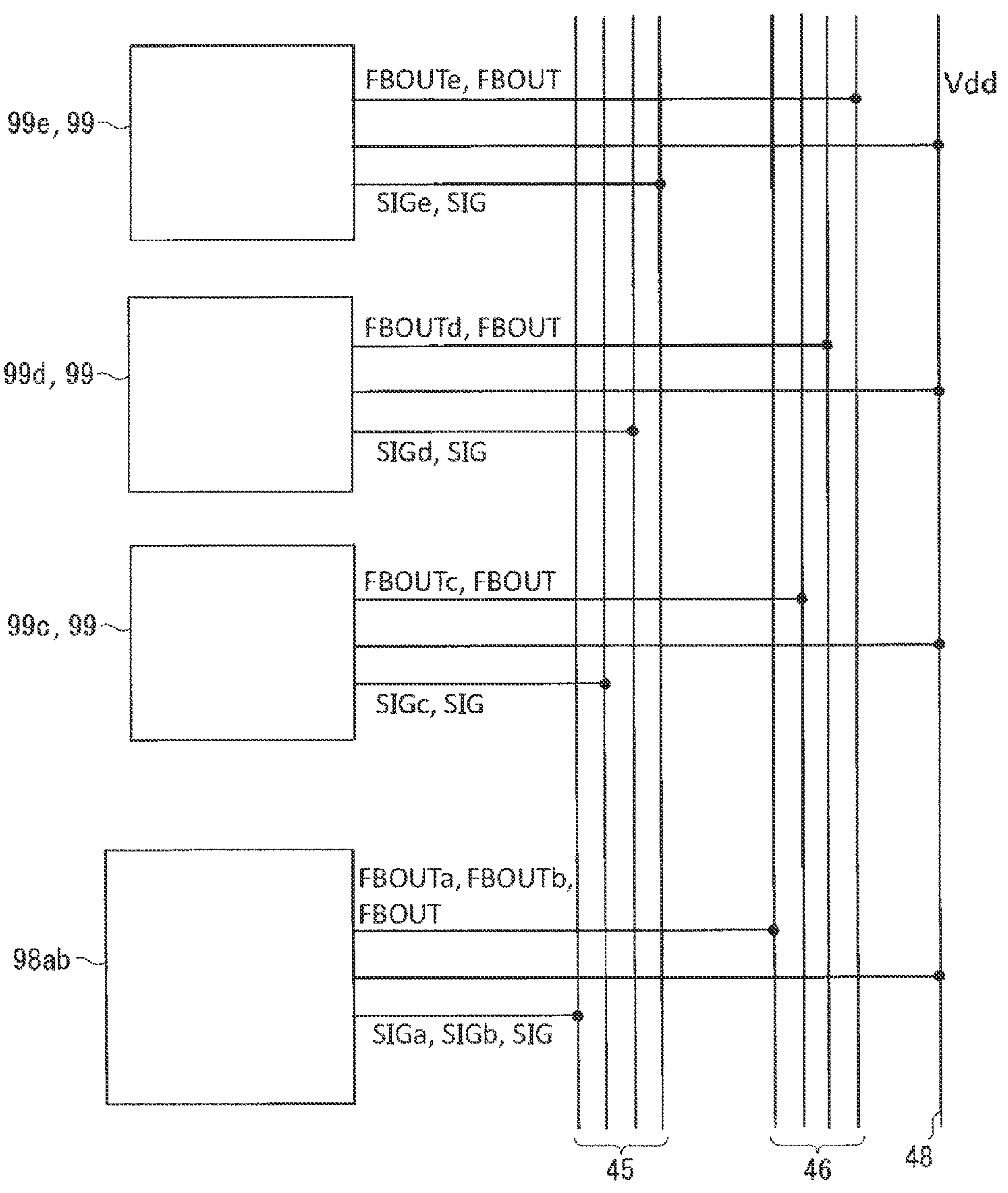
FIG. 2 is a circuit diagram of a unit pixel according to the first embodiment.

FIG. 2 illustrates a circuit diagram of the unit pixel 10.

A predetermined power supply voltage Vdd is supplied from the power wiring line 48 to the first circuit configuration 98*ab*. The power supply voltage Vdd is, for example, about 3.3 V. An output signal SIG is output from the first circuit configuration 98*ab* to a first vertical signal line 45 corresponding to the column to which the first circuit configuration 98*ab* belongs. A feedback signal FBOUT is supplied to the first circuit configuration 98*ab* from a first feedback line 46 corresponding to the column to which the first circuit configuration 98*ab* belongs. In these respects, the same applies to the second circuit configuration 99*c*, the third circuit configuration 99*d*, and the fourth circuit configuration 99*e*.

Figure 3:
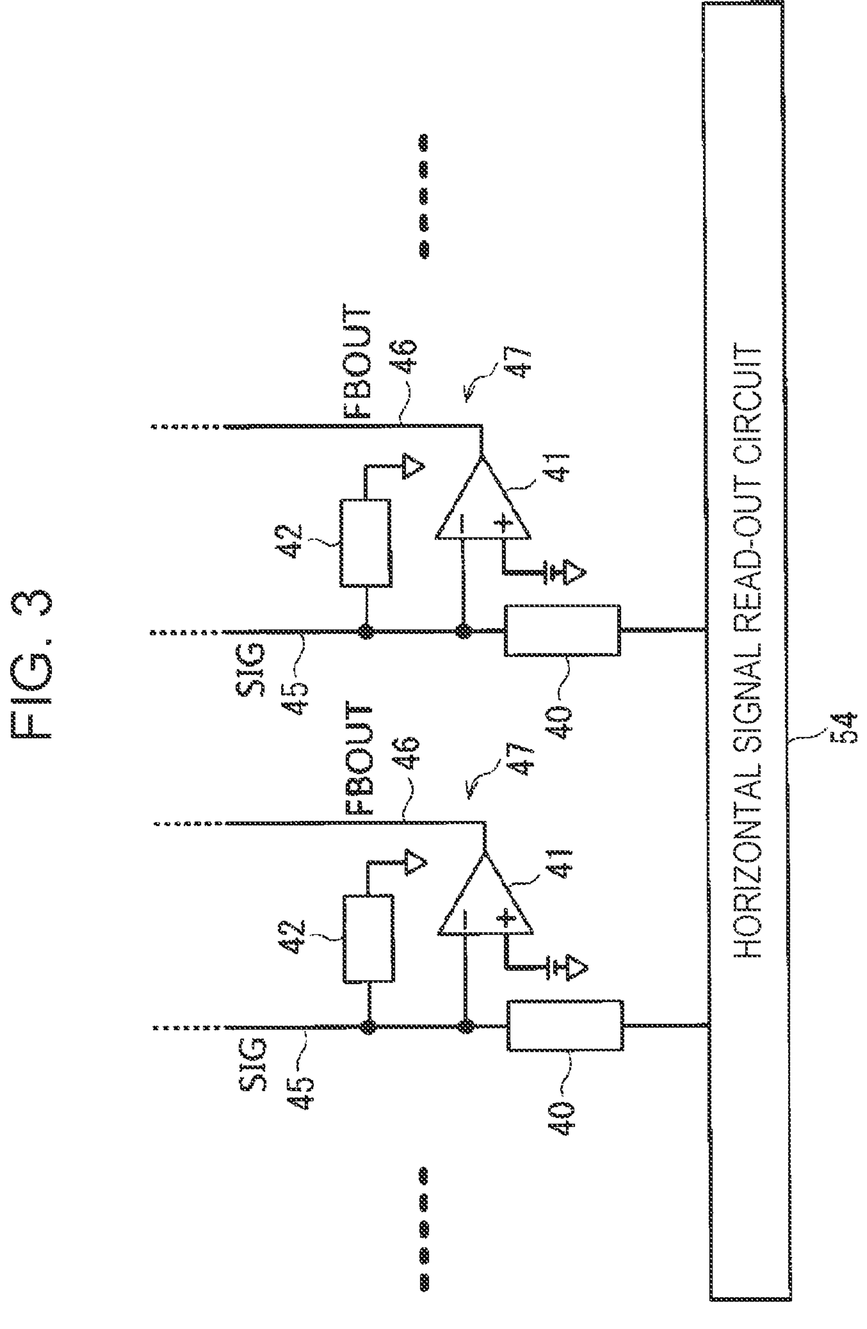
FIG. 3 is a circuit diagram for describing feedback.

FIG. 3 is a circuit diagram for describing feedback regarding each pixel. FIG. 3 illustrates part of a peripheral circuit. The peripheral circuit includes a plurality of load circuits 42, a plurality of column signal processing circuits 40, and a plurality of inverting amplifiers 41.

The plurality of load circuits 42, the plurality of column signal processing circuits 40, and the plurality of inverting amplifiers 41 are divided into groups, each of which includes one of the load circuits 42, one of the column signal processing circuits 40, and one of the inverting amplifiers 41. Each column of the first circuit configurations 98*ab* is provided with one of the groups. Each column of the second circuit configurations 99*c* is provided with one of the groups. Each column of the third circuit configurations 99*d* is provided with one of the groups. Each column of the fourth circuit configurations 99*e* is provided with one of the groups. For each column, the load circuit 42, the column signal processing circuit 40, and the inverting amplifier 41 are connected to the vertical signal line 45.

The column signal processing circuits 40 may also be referred to as row signal accumulation circuits. The inverting amplifiers 41 may also be referred to as feedback amplifiers.

The column signal processing circuits 40 perform, for example, noise reduction signal processing and analog-to-digital (AD) conversion. Noise reduction signal processing is, for example, correlated double sampling. The horizontal signal read-out circuit 54 is connected to the column signal processing circuits 40. The horizontal signal read-out circuit 54 sequentially reads out output signals SIG from each column signal processing circuit 40 to a horizontal common signal line, which is not illustrated.

The negative input terminals of the inverting amplifiers 41 are connected to the vertical signal lines 45. A predetermined voltage is supplied to the positive input terminals of the inverting amplifiers 41. The predetermined voltage is, for example, 1 V or a positive voltage near 1 V. Moreover, the output terminals of the inverting amplifiers 41 are connected to the feedback lines 46.

The load circuits 42 provided so as to correspond to the respective columns of the first circuit configurations 98*ab* can be referred to as first load circuits 42. The column signal processing circuits 40 provided so as to correspond to the respective columns of the first circuit configurations 98*ab* can be referred to as first column signal processing circuits 40. The inverting amplifiers 41 provided so as to correspond to the respective columns of the first circuit configurations 98*ab* can be referred to as first inverting amplifiers 41. Among the output signals SIG output from the first circuit configurations 98*ab* to the first vertical signal lines 45 corresponding to the columns to which the first circuit configurations 98*ab* belong, signals that originate from the first pixels 10*a* can be referred to as first output signals SIGa. Among the output signals SIG, signals that originate from the second pixels 10*b* can be referred to as second output signals SIGb. Among the feedback signals FBOUT supplied to the first circuit configurations 98*ab* from the first feedback lines 46 corresponding to the columns to which the first circuit configurations 98*ab* belong, feedback signals for the first pixels 10*a* can be referred to as first feedback signals FBOUTa. Among the feedback signals FBOUT, feedback signals for the second pixels 10*b* can be referred to as second feedback signals FBOUTb.

As is understood from the above description using FIG. 3, the first output signals SIGa or the second output signals SIGb are output from the first circuit configurations 98*ab* to the first vertical signal lines 45. The first output signals SIGa or the second output signals SIGb are input to the negative input terminals of the first inverting amplifiers 41. The first feedback signals FBOUTa or the second feedback signals FBOUTb are supplied from the output terminals of the first inverting amplifiers 41 to the first circuit configurations 98*ab* via the first feedback lines 46. In this manner, feedback circuits 47 for the first pixels 10*a* or the second pixels 10*b* are formed, the feedback circuits 47 negatively feeding back the first output signals SIGa or the second output signals SIGb of the first circuit configurations 98*ab*. Each first inverting amplifier 41 is part of a corresponding one of the feedback circuits 47.

The load circuits 42 provided so as to correspond to the respective columns of the second circuit configurations 99*c* can be referred to as second load circuits 42. The column signal processing circuits 40 provided so as to correspond to the respective columns of the second circuit configurations 99*c* can be referred to as second column signal processing circuits 40. The inverting amplifiers 41 provided so as to correspond to the respective columns of the second circuit configurations 99*c* can be referred to as second inverting amplifiers 41. The output signals SIG output from the second circuit configurations 99*c* to the vertical signal lines 45 corresponding to the columns to which the second circuit configurations 99*c* belong can be referred to as third output signals SIGc. The feedback signals FBOUT supplied to the second circuit configurations 99*c* from the feedback lines 46 corresponding to the columns to which the second circuit configurations 99*c* belong can be referred to as third feedback signals FBOUTc. Description can also be valid that is obtained by changing, in these descriptions, an ordinal numeral of "third" to "fourth" and an ordinal numeral of "second" to "third" and changing "c" to "d" at the ends of the reference numerals. Description can also be valid that is obtained by changing, in these descriptions, an ordinal numeral of "third" to "fifth" and an ordinal numeral of "second" to "fourth" and changing "c" to "e" at the ends of the reference numerals. For example, the above description regarding the second circuit configurations 99*c*, the third output signals SIGc, and the third feedback signals FBOUTc similarly applies to the third circuit configurations 99*d*, fourth signal output signals SIGd, and fourth feedback signals FBOUTd as well as the fourth circuit configurations 99*e*, fifth output signals SIGe, and fifth feedback signals FBOUTe.

As is understood from the above description using FIG. 3, the third output signals SIGc are output from the second circuit configurations 99*c* to the second vertical signal lines 45. The third output signals SIGc are input to the negative input terminals of the second inverting amplifiers 41. The third feedback signals FBOUTc are supplied from the output terminals of the second inverting amplifiers 41 to the second circuit configurations 99*c* via the second feedback lines 46. In this manner, feedback circuits 47 are formed that negatively feed back, to the second circuit configurations 99*c*, the third output signals SIGc of the second circuit configurations 99*c*. Each second inverting amplifier 41 is part of a corresponding one of the feedback circuits 47. Description can also be valid that is obtained by changing, in these descriptions, an ordinal numeral of "third" to "fourth" and an ordinal numeral of "second" to "third" and changing "c" to "d" at the ends of the reference numerals. Description can also be valid that is obtained by changing, in these descriptions, an ordinal numeral of "third" to "fifth" and an ordinal numeral of "second" to "fourth" and changing "c" to "e" at the ends of the reference numerals.

Figures 5, 6:
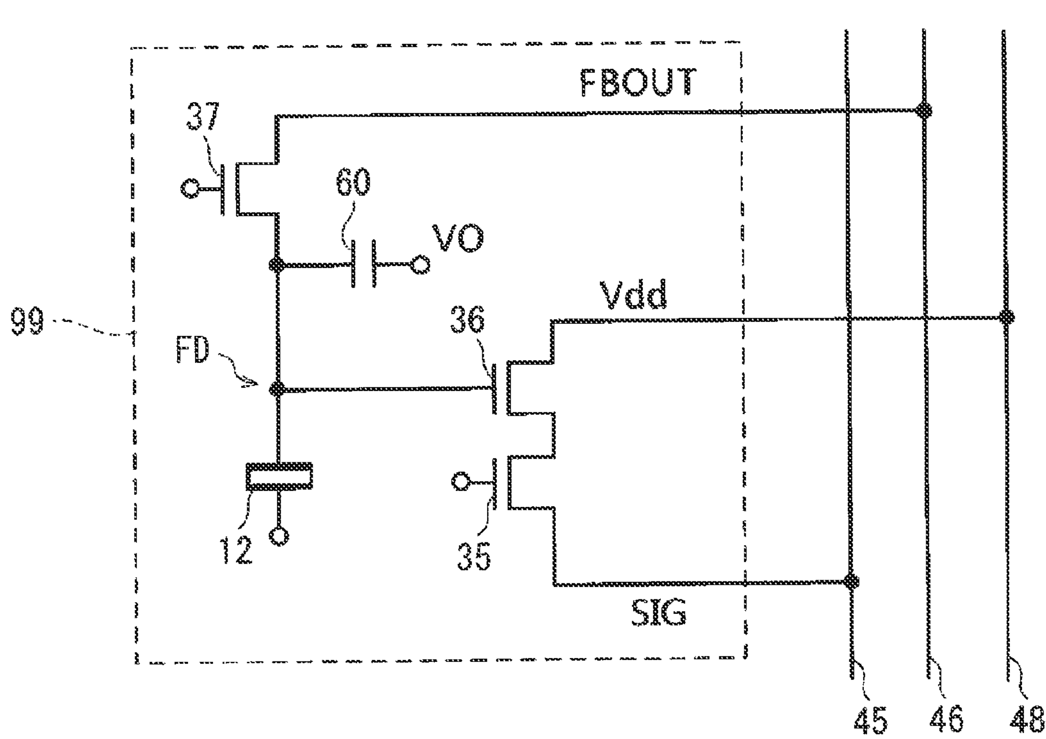
FIG. 5 is a circuit diagram of a circuit configuration according to the first embodiment.
FIG. 6 is a configuration diagram of a photoelectric converter according to the first embodiment.

FIG. 5 illustrates a circuit diagram of the circuit configuration 99 in each of the third pixels 10*c*, the fourth pixels 10*d*, and the fifth pixels 10*e*. FIG. 5 can be regarded as illustrating each of the second circuit configurations 99*c*, the third circuit configurations 99*d*, and the fourth circuit configurations 99*e*.

The circuit configuration 99 includes a photoelectric converter 12, an address transistor 35, an amplification transistor 36, a reset transistor 37, and a capacitive element 60.

In the present embodiment, the address transistor 35, the amplification transistor 36, and the reset transistor 37 are metal oxide semiconductor field-effect transistors (MOSFETs). Note that these transistors may be transistors of different types from MOSFETs. Examples of the transistors include bipolar transistors.

Specifically, in the present embodiment, the photoelectric converter 12 generates positive charge as signal charge.

Specifically, this positive charge is positive holes. The address transistor 35, the amplification transistor 36, and the reset transistor 37 are n-channel MOSFETs.

In another example, the photoelectric converter 12 generates negative charge as signal charge. Specifically, this negative charge is electrons. The address transistor 35, the amplification transistor 36, and the reset transistor 37 are p-channel MOSFETs.

Figure 11:
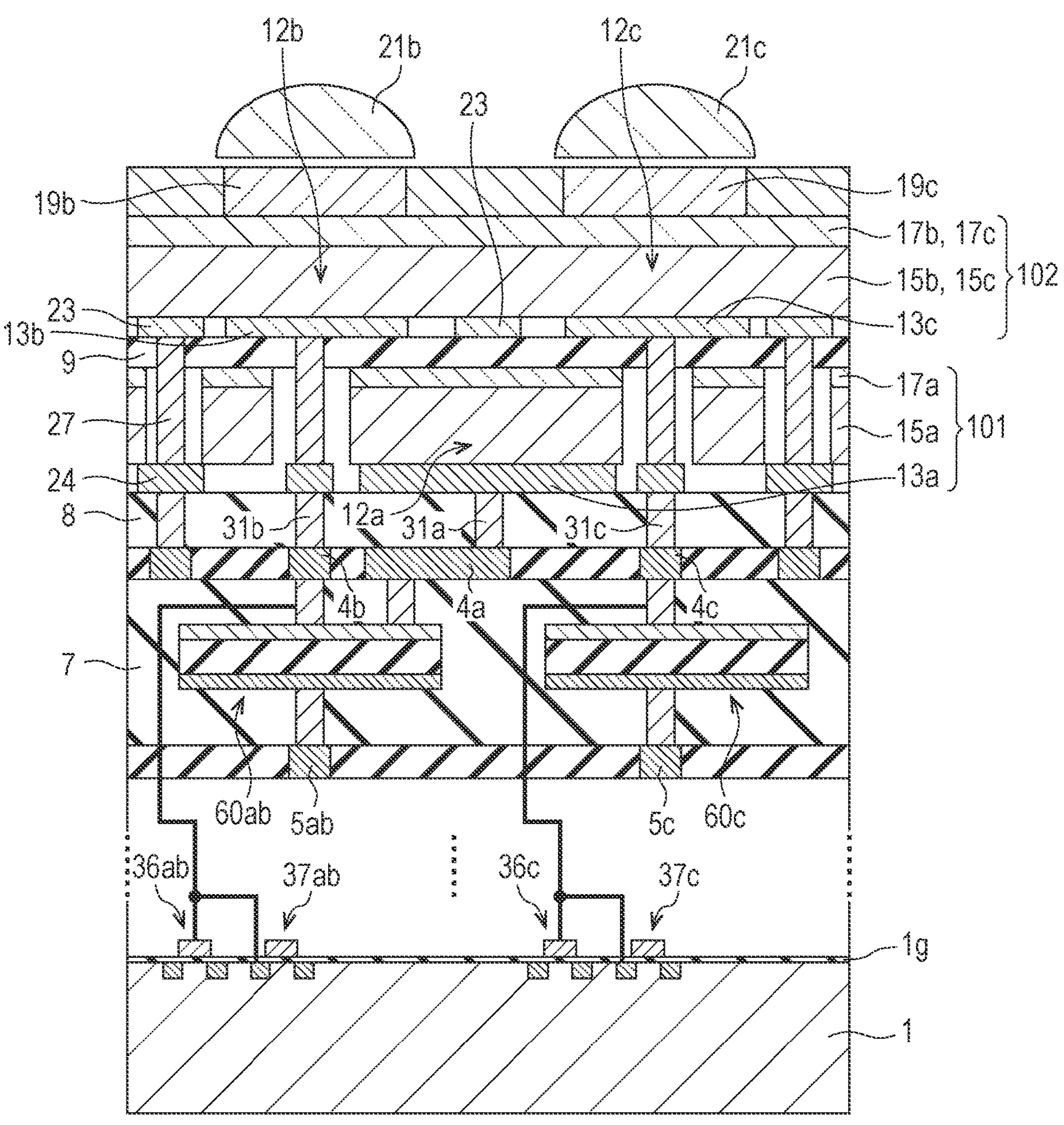
FIG. 11 is a cross-sectional view of an imaging element according to the first embodiment, the view illustrating a first cross section.
Figure 12:
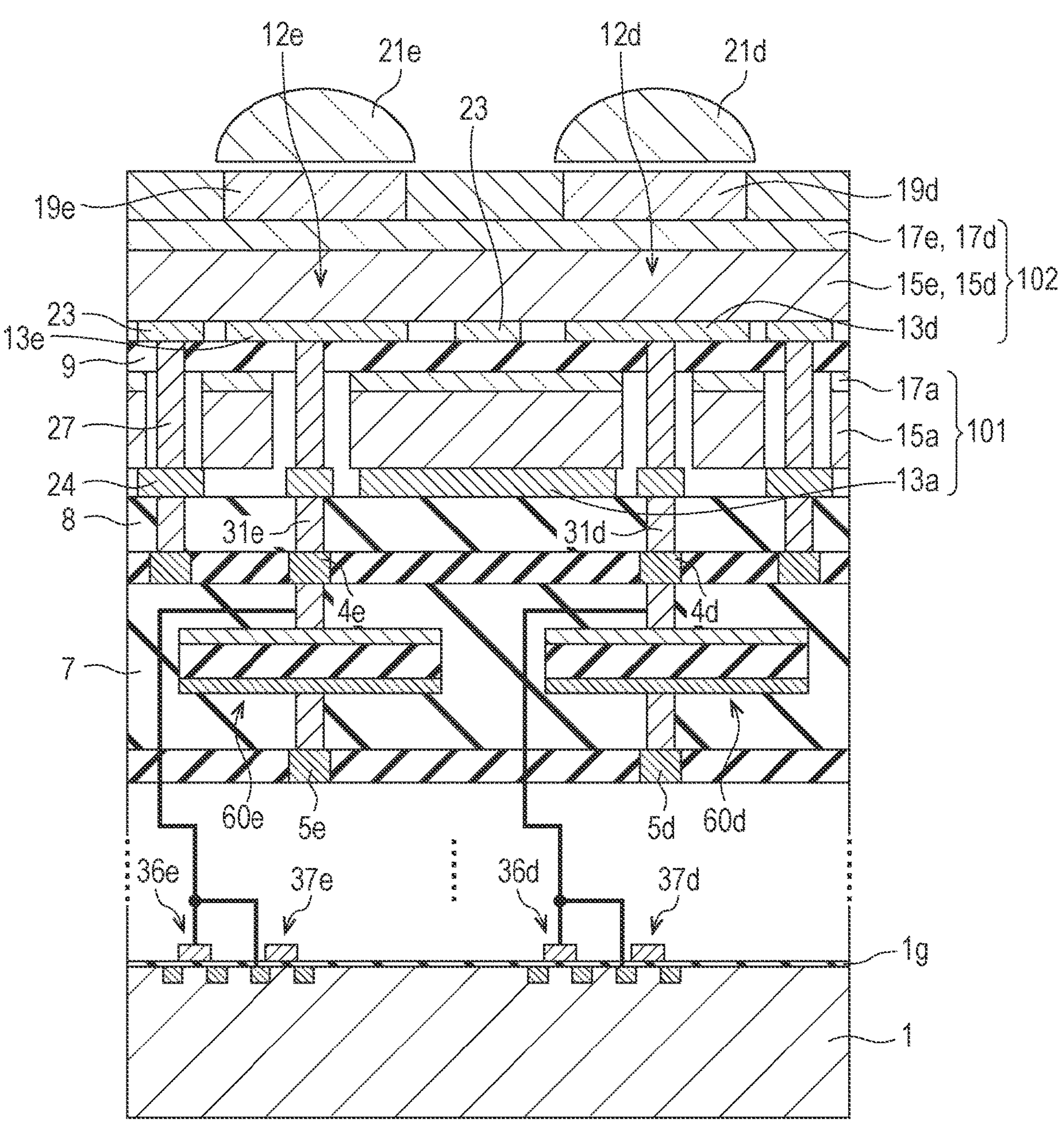
FIG. 12 is a cross-sectional view of the imaging element according to the first embodiment, the view illustrating a second cross section.

In the present embodiment, the address transistor 35 includes a source, a drain, a gate electrode, and a gate insulating film. The gate insulating film is interposed between the semiconductor substrate 1 and the gate electrode. The gate insulating film of the address transistor 35 is part of an insulating layer 1*g*, which is illustrated in FIGS. 11 and 12 to be described later. In these respects, the same also applies to the amplification transistor 36 and the reset transistor 37. The insulating layer 1*g* is provided on the surface of the semiconductor substrate 1. In a typical example, the insulating layer 1*g* is an oxide of a semiconductor material of the semiconductor substrate 1.

The photoelectric converter 12, one of the source or the drain of the reset transistor 37, one end of the capacitive element 60, and the gate electrode of the amplification transistor 36 are electrically connected to each other. The other one of the source or the drain of the reset transistor 37 is electrically connected to the feedback line 46. One of the source or the drain of the amplification transistor 36 is electrically connected to the power wiring line 48. The other one of the source or the drain of the amplification transistor 36 is electrically connected to one of the source or the drain of the address transistor 35. The other one of the source or the drain of the address transistor 35 is electrically connected to the vertical signal line 45.

FIG. 6 illustrates the configuration of the photoelectric converter 12 according to the present embodiment. In the present embodiment, the photoelectric converter 12 is arranged outside the semiconductor substrate 1. Specifically, the entirety of the photoelectric converter 12 is arranged outside the semiconductor substrate 1. In the present embodiment, the photoelectric converter 12 is arranged above the semiconductor substrate 1.

The photoelectric converter 12 includes a pixel electrode 13, a counter electrode 17, and a photoelectric conversion layer 15. The photoelectric conversion layer 15 is arranged between the counter electrode 17 and the pixel electrode 13. The photoelectric conversion layer 15 generates electric charge through photoelectric conversion. The pixel electrode 13 collects the electric charge.

In the present embodiment, the counter electrode 17 is a transparent electrode. The transparent electrode is composed of a transparent conducting oxide such as indium tin oxide (ITO).

In the present embodiment, the photoelectric conversion layer 15 is composed of a photoelectric conversion material. The photoelectric conversion material is typically an organic material. Note that the photoelectric conversion material may be an inorganic material such as amorphous silicon. The photoelectric conversion material may also be quantum dots.

In the present embodiment, the photoelectric conversion layer 15 contains a donor material and an acceptor material. When the photoelectric conversion layer 15 is irradiated with light, electric charge is generated in the donor material, and carrier separation occurs. This carrier moves from the donor material to the acceptor material and passes through the acceptor material, and the electrode receives the carrier. Photoelectric conversion is achieved in this manner.

Specifically, in the present embodiment, an electric field is applied between the pixel electrode 13 and the counter electrode 17, that is, the photoelectric conversion layer 15. As a result, electrons are transported toward the positive electrode, and holes are transported toward the negative electrode. In this manner, ON-OFF of the photoelectric conversion function can be controlled by the voltage applied between the electrodes.

Typically, a voltage is applied to the counter electrode 17 from an external power supply, which is not illustrated. As a result, an electric field is applied between the pixel electrode 13 and the counter electrode 17.

A blocking layer that prevents electric charge from flowing to the pixel electrode 13 in a dark period may be provided between the pixel electrode 13 and the photoelectric conversion layer 15.

Figures 7, 8:
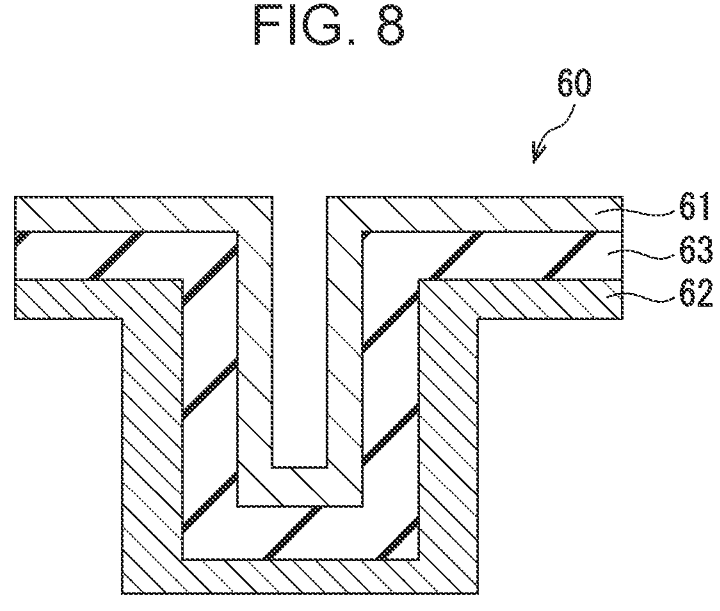
FIG. 7 is a configuration diagram of a capacitive element according to the first embodiment.
FIG. 8 is a configuration diagram of a capacitive element that has a trench structure.

FIG. 7 illustrates the configuration of the capacitive element 60 according to the present embodiment. In the present embodiment, the capacitive element 60 is arranged outside the semiconductor substrate 1. Specifically, the entirety of the capacitive element 60 is arranged outside the semiconductor substrate 1. Note that the capacitive element 60 may be arranged within the semiconductor substrate 1.

In the present embodiment, specifically, the capacitive element 60 is arranged in an insulating layer. The insulating layer corresponds to an insulating layer 7 illustrated in FIGS. 11 and 12.

The present embodiment is described under the concept that a capacitive element does not contain the parasitic capacitance of a diffusion region or the like. That is, the capacitive element 60, which is not a parasitic capacitor, accumulates electric charge generated by the photoelectric converter 12. When the capacitive element 60, which is not a parasitic capacitor, is used, its capacitance is easily ensured.

In the present embodiment, the capacitive element 60 has an electrode 61 and an electrode 62. A dielectric 63 is placed between the electrode 61 and the electrode 62. With such a configuration, the capacitance of the capacitive element 60 is easily ensured, and a large amount of electric charge is easily accumulated in the capacitive element 60. That is, with such a configuration, the capacitive element 60 having a high saturated charge amount is realized, and a wide dynamic range regarding the wavelength region of light that the photoelectric converter 12 photoelectrically converts is easily achieved.

Specifically, the electrode 61 has an opposing surface 65. The electrode 62 has an opposing surface 66. The opposing surface 65 and the opposing surface 66 face each other. The dielectric 63 is placed between the opposing surface 65 and the opposing surface 66.

The dielectric 63 of the capacitive element 60 may be an insulator. Moreover, the dielectric 63 of the capacitive element 60 may have a film shape. That is, the dielectric 63 of the capacitive element 60 may be an insulating film.

In the present embodiment, the permittivity of the dielectric 63 is higher than the permittivity of the oxide of the semiconductor material of the semiconductor substrate 1. With this configuration, the capacitance of the capacitive element 60 is easily ensured. In the example illustrated in FIGS. 11 and 12 to be described later, the insulating layer 1*g* provided on the surface of the semiconductor substrate 1 may correspond to the oxide of the semiconductor material of the semiconductor substrate 1. Note that the expression "the permittivity of the dielectric 63 is higher than the permittivity of the oxide of the semiconductor material of the semiconductor substrate 1" does not intend to mean that the oxide has to be present in the imaging element 100.

In the present embodiment, the permittivity of the dielectric 63 is higher than that of silicon oxide. The permittivity of the dielectric 63 is higher than that of silicon nitride. The permittivity of the dielectric 63 is higher than that of the insulating layer 7, that of an insulating layer 8, and that of an insulating layer 9. The insulating layers 7, 8, and 9 will be described later.

An example of a material of the dielectric 63 is a high-k material. An example of the high-k material is a metal oxide. Examples of the metal oxide include hafnium oxide ($HfO_2$) and zirconia ($ZrO_2$). When the material of the dielectric 63 is a high-k material, the capacitance of the capacitive element 60 is easily ensured even when the opposing surface 65 and the opposing surface 66 have small areas.

A merit in using a high-k material as a material of the dielectric 63 will be further described. Suppose that silicon oxide is used as a material of the dielectric 63. In this case, even when the capacitive element 60 is formed which has a three-dimensional structure obtained by bending the opposing surface 65 and the opposing surface 66, it is not easy to ensure the capacitance of the capacitive element 60. In order to facilitate achievement of a higher degree of integration in an imaging element, there is a limit to how much the degree of integration can be increased only through changing the structure of the capacitive element 60. In this regard, it is easier to realize the capacitive element 60, which has a small area and a large capacitance, in a case where a material having high permittivity such as a high-k material is used as a material of the dielectric 63 than in a case where silicon oxide is used as a material of the dielectric 63.

Note that silicon oxide may be used as a material of the dielectric 63. Another example of a material of the dielectric 63 is silicon nitride. The dielectric 63 may be a composite film of silicon oxide and silicon nitride.

The dielectric 63 has, for example, a thickness of greater than or equal to 10 nm and less than or equal to 45 nm. When the dielectric 63 is excessively thin, the capacitive element 60 tends to have insufficient withstand voltage. When manufacturing variations and the like are also taken into consideration, it can be said that the reliability of the capacitive element 60 is ensured by using the dielectric 63 having a reasonable thickness. In contrast, when the dielectric 63 is excessively thick, it is difficult to ensure the capacitance of the capacitive element 60. In this regard, when the thickness of the dielectric 63 is in the range of greater than or equal to 10 nm and less than or equal to 45 nm, both of the reliability and capacitance of the capacitive element 60 are easily ensured. The thickness of the dielectric 63 may be greater than or equal to 15 nm and less than or equal to 45 nm or may be greater than or equal to 20 nm and less than or equal to 40 nm. In one numerical example, the thickness of the dielectric 63 is 30 nm.

Examples of a material of the electrode 61 include metals, metal compounds, and polysilicon. The electrode 61 may be part of the semiconductor substrate 1. Examples of the metal compounds include a metal nitride and a metal oxide. Examples of the metal nitride include titanium nitride (TiN) and tantalum nitride (TaN). Examples of the metal oxide include ITO.

When the material of the electrode 61 is titanium nitride or tantalum nitride, the surface roughness of the electrode 61 is easily reduced. As a result, the dielectric 63 is less likely to become locally thin due to unevenness of the electrode 61, so that current leakage is less likely to occur in the dielectric 63.

As a material of the electrode 62, materials that can be used as a material of the electrode 61 can be used. The material of the electrode 62 may be the same as or different from the material of the electrode 61.

The electrode 61 has, for example, a thickness of greater than or equal to 5 nm and less than or equal to 45 nm. The thickness of the electrode 61 may be, for example, greater than or equal to 10 nm and less than or equal to 40 nm. In one numerical example, the thickness of the electrode 61 is 30 nm.

As the thickness of the electrode 62, thicknesses that can be used as the thickness of the electrode 61 can be used. The thickness of the electrode 62 may be equal to or different from the thickness of the electrode 61.

The sheet resistance of the electrode 61 is, for example, less than or equal to 10000Ω/□ and may be less than or equal to 1000Ω/□. The sheet resistance of the electrode 61 is, for example, greater than or equal to 5Ω/□ and may be greater than or equal to 50Ω/□.

As the sheet resistance of the electrode 62, sheet resistances that can be used as the sheet resistance of the electrode 61 can be used. The sheet resistance of the electrode 62 may be equal to or different from the sheet resistance of the electrode 61.

The area of the opposing surface 65 is, for example, greater than or equal to $1\times10^4$ nm$^2$ and less than or equal to $1\times10^8$ nm$^2$ and may be greater than or equal to $5\times10^4$ nm$^2$ and less than or equal to $1\times10^7$ nm$^2$.

As the area of the opposing surface 66, areas that can be used as the area of opposing surface 65 can be used. The area of the opposing surface 66 may be equal to or different from the area of the opposing surface 65.

The capacitive element 60 may have a trench structure. FIG. 8 is a configuration diagram of a capacitive element 60 that has a trench structure. The trench structure is advantageous in that the capacitance of the capacitive element 60 is ensured. In this case, the trench structure refers to a structure including a bend. Specifically, in FIG. 8, the electrode 61, the electrode 62, and the dielectric 63 of the capacitive element 60 include bends.

In one example, in both of two cross sections parallel to the thickness direction of the semiconductor substrate 1, the capacitive element 60 includes bends. In one specific example, these two cross sections are orthogonal to each other. Note that the capacitive element 60 may include a bend only in one of the two cross sections that are orthogonal to each other.

Figure 9:
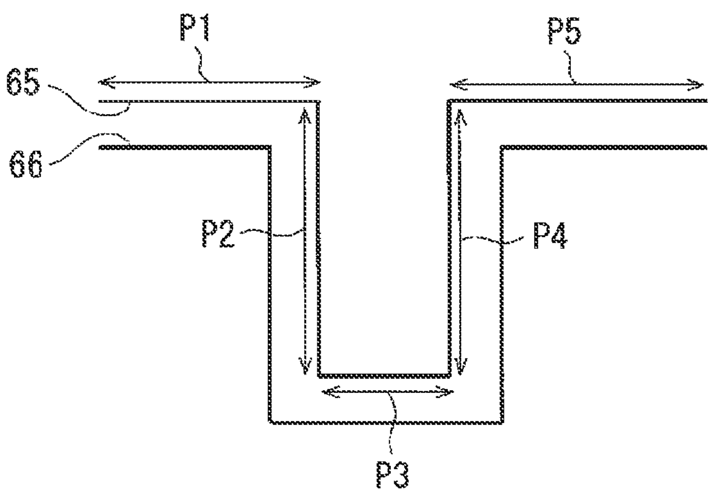
FIG. 9 is a diagram for describing the area of an opposing surface.

In the following, the area of the opposing surface 65 and the area of the opposing surface 66 will be described. FIG. 9 is a diagram for describing the area of the opposing surface 65 and the area of the opposing surface 66. FIG. 9 schematically illustrates only the opposing surface 65 and the opposing surface 66. Although not illustrated, the dielectric 63 is present between the opposing surface 65 and the opposing surface 66. In the example illustrated in FIG. 9, the opposing surface 65 is bent. Specifically, the opposing surface 65 has a plane P1, a plane P2, a plane P3, a plane P4, and a plane P5. In the example illustrated in FIG. 9, the area of the opposing surface 65 is the total of the areas of the planes P1, P2, P3, P4, and P5. In this manner, in a case where the opposing surface 65 is bent, the area of the opposing surface 65 refers not to the area of the opposing surface 65 that is seen in a plan view but to the area of the opposing surface 65 that is bent and extends. In other words, in this case, the area of the opposing surface 65 refers to the area of the opposing surface 65 obtained when the opposing surface 65 is stretched out on a single plane. In these respects, the same applies to the area of the opposing surface 66.

In the present embodiment, the capacitive element 60 has a metal-insulator-metal (MIM) structure. With the MIM structure, the capacitive element 60 having high capacitance density can be realized. Note that "M" of MIM refers to at least one of a metal or a metal compound. "I" of MIM refers to an insulator such as an oxide. That is, MIM is based on the concept including metal oxide metal (MOM). When description is made using the elements of FIG. 7, the capacitive element 60 having a MIM structure is obtained by interposing an insulator, which may be an oxide, between the two electrodes 61 and 62, which are composed of at least one of a metal or a metal compound.

When the imaging element 100 is irradiated with light, positive charge and negative charge, typically, electron-hole pairs are generated in the photoelectric conversion layer 15. For example, suppose that a voltage is applied between the counter electrode 17 and the pixel electrode 13 such that the counter electrode 17 has a higher potential than the pixel electrode 13. In this case, positive charge is collected at the pixel electrode 13, and negative charge is collected at the counter electrode 17. The positive charge collected at the pixel electrode 13 is accumulated in the capacitive element 60.

Returning to FIG. 5, in the circuit configuration 99, a charge accumulation region FD is formed. In the charge accumulation region FD, electric charge generated through photoelectric conversion performed by the photoelectric converter 12 is accumulated. The charge accumulation region may also be referred to as a floating diffusion node.

In the present embodiment, the charge accumulation region FD includes the gate electrode of the amplification transistor 36. The charge accumulation region FD includes the capacitive element 60. The charge accumulation region FD includes one of the source or the drain of the reset transistor 37. The charge accumulation region FD includes the pixel electrode 13.

The charge accumulation region FD may include a wiring line electrically connected to the photoelectric converter 12. The charge accumulation region FD may include at least one of the source or the drain of a transistor other than the reset transistor 37.

In the present embodiment, the proportion of a capacitance $C_{CAP}$ of the capacitive element 60 in a capacitance $C_{FD}$ of the entire charge accumulation region FD, which is a proportion $C_{CAP}/C_{FD}$, is greater than 50%. The proportion $C_{CAP}/C_{FD}$ may be greater than or equal to 70% or may also be greater than or equal to 90%.

An external potential VO is applied to the electrode 62 of the capacitive element 60. Specifically, the external potential VO is a DC potential. The DC potential may be a potential biased from a ground potential or may also be the ground potential.

When the imaging device 100A is in operation, the power supply voltage Vdd is supplied from the power wiring line 48 to one of the source or the drain of the amplification transistor 36. The amplification transistor 36 outputs, as the output signal SIG, a signal voltage corresponding to the amount of signal charge generated by the photoelectric converter 12.

The other one of the source or the drain of the address transistor 35 is connected, with the vertical signal line 45 interposed therebetween, to the load circuit 42 and the column signal processing circuit 40 illustrated in FIG. 3. The load circuit 42 and the amplification transistor 36 form a source follower circuit.

The address signal line 44 is connected to the gate electrode of the address transistor 35. The address signal line 44 is connected to the vertical scanning circuit 52. The vertical scanning circuit 52 applies, to the address signal line 44, a row selection signal for controlling ON and OFF of the address transistor 35. As a result, read-out target lines are scanned in the vertical direction, that is, the column direction, and a certain read-out target row is selected. By controlling ON and OFF of the address transistor 35 via the address signal line 44, the vertical scanning circuit 52 can read out, into the corresponding vertical signal line 45, the output signal SIG from the amplification transistor 36 of the circuit configuration 99 that is selected. The arrangement of the address transistor 35 is not limited to the example illustrated in FIG. 5. The address transistor 35 may be placed between the drain of the amplification transistor 36 and the power wiring line 48.

The output signal SIG, that is, a signal voltage passes through the address transistor 35 and the vertical signal line 45 in this order and is then input to the column signal processing circuit 40.

The reset signal line 43 is connected to the gate electrode of the reset transistor 37. By applying a row selection signal to an address signal line 44 among the address signal lines 44, the vertical scanning circuit 52 can select, in units of row, circuit configurations 99 to be reset. Moreover, the vertical scanning circuit 52 can turn on the reset transistors 37 of the selected row by applying, to the gate electrodes of the reset transistors 37, a reset signal for controlling ON and OFF of the reset transistors 37 via the reset signal line 43. The potentials of the charge accumulation regions FD are reset by turning on the reset transistors 37.

In this example, the other one of the source or the drain of the reset transistor 37 is connected to the feedback line 46. In this example, as a reset voltage, the voltage of the feedback line 46 is supplied to the charge accumulation region FD. As a result, the potential of the charge accumulation region FD is initialized. In this example, the feedback line 46 is connected to the output terminal of the inverting amplifier 41.

As is understood from FIGS. 2, 3, and 5, an input terminal of the inverting amplifier 41 is connected to the vertical signal line 45. Moreover, the output terminal of the inverting amplifier 41 is connected to the circuit configuration 99 with the feedback line 46 interposed therebetween. When the imaging device 100A is in operation, a predetermined voltage Vref is supplied to the non-inverting input terminal of the inverting amplifier 41. The voltage Vref is, for example, 1 V or a positive voltage near 1 V. A feedback path for negatively feeding back the output signal SIG from the circuit configuration 99 can be formed by turning on the address transistor 35 and the reset transistor 37. Formation of the feedback path causes the voltage of the vertical signal line 45 to be the voltage Vref, which is an input voltage to the non-inverting input terminal of the inverting amplifier 41. In other words, formation of the feedback path causes the voltage of the charge accumulation region FD to be reset to a certain voltage with which the voltage of the vertical signal line 45 becomes Vref. As the voltage Vref, a freely chosen voltage whose magnitude is within the range between the power supply voltage and a ground voltage may be used. In this manner, the imaging device 100A includes the feedback circuits 47, which include the inverting amplifiers 41 partway along the feedback paths. The power supply voltage is, for example, 3.3 V. The ground voltage is 0 V.

As is well known, as a transistor is turned on or off, thermal noise called kTC noise is generated. Noise that is generated by turning on or off a reset transistor is called reset noise. After the charge accumulation region FD is reset, reset noise that is generated by turning off the reset transistor 37 remains in the charge accumulation region FD, which is to accumulate signal charge. However, with the illustrated configuration, the feedback path is formed, so that the alternating-current component of kTC noise is fed back to the source of the reset transistor 37. With the illustrated configuration, the formed feedback path is retained until just before the reset transistor 37 is turned off, and thus reset noise that is generated as the reset transistor 37 is turned off can be reduced.

The photoelectric converter 12 of each second circuit configuration 99*c*, that is, the photoelectric converter 12 of each third pixel 10*c* can be referred to as a third photoelectric converter 12*c*. The pixel electrode 13 of the third photoelectric converter 12*c* can be referred to as a third pixel electrode 13*c*. The counter electrode 17 of the third photoelectric converter 12*c* can be referred to as a third counter electrode 17*c*. The photoelectric conversion layer 15 of the third photoelectric converter 12*c* can be referred to as a third photoelectric conversion layer 15*c*. The address transistor 35 of the second circuit configuration 99*c* can be referred to as a second address transistor 35. The amplification transistor 36 of the second circuit configuration 99*c* can be referred to as a second amplification transistor 36*c*. The reset transistor 37 of the second circuit configuration 99*c* can be referred to as a second reset transistor 37*c*. The charge accumulation region FD of the second circuit configuration 99*c* can be referred to as a second charge accumulation region FD. The capacitive element 60 of the second circuit configuration 99*c* can be referred to as a second capacitive element 60*c*. The external potential VO that is applied to the second capacitive element 60*c* can be referred to as a second external potential VO. The third photoelectric converter 12*c* converts light of the third wavelength region into third electric charge. The second capacitive element 60*c* accumulates the third electric charge. Specifically, the third photoelectric conversion layer 15*c* generates the third electric charge. The third pixel electrode 13*c* collects the third electric charge. Description can also be valid that is obtained by changing, in these descriptions, an ordinal numeral of "third" to "fourth" and an ordinal numeral of "second" to "third" and changing "c" to "d" at the ends of the reference numerals. Description can also be valid that is obtained by changing, in these descriptions, an ordinal numeral of "third" to "fifth" and an ordinal numeral of "second" to "fourth" and changing "c" to "e" at the ends of the reference numerals.

The electrode 61 of the second capacitive element 60*c* can be referred to as a third electrode 61. The electrode 62 of the second capacitive element 60*c* can be referred to as a fourth electrode 62. The opposing surface 65 of the third electrode 61 can be referred to as a third opposing surface 65. The opposing surface 66 of the fourth electrode 62 can be referred to as a fourth opposing surface 66. The dielectric 63 of the second capacitive element 60*c* can be referred to as a second dielectric 63.

The electrode 61 of a third capacitive element 60*d* can be referred to as a fifth electrode 61. The electrode 62 of the third capacitive element 60*d* can be referred to as a sixth electrode 62. The opposing surface 65 of the fifth electrode 61 can be referred to as a fifth opposing surface 65. The opposing surface 66 of the sixth electrode 62 can be referred to as a sixth opposing surface 66. The dielectric 63 of the third capacitive element 60*d* can be referred to as a third dielectric 63.

The electrode 61 of a fourth capacitive element 60*e* can be referred to as a seventh electrode 61. The electrode 62 of the fourth capacitive element 60*e* can be referred to as an eighth electrode 62. The opposing surface 65 of the seventh electrode 61 can be referred to as a seventh opposing surface 65. The opposing surface 66 of the eighth electrode 62 can be referred to as an eighth opposing surface 66. The dielectric 63 of the fourth capacitive element 60*e* can be referred to as a fourth dielectric 63.

Figure 4:
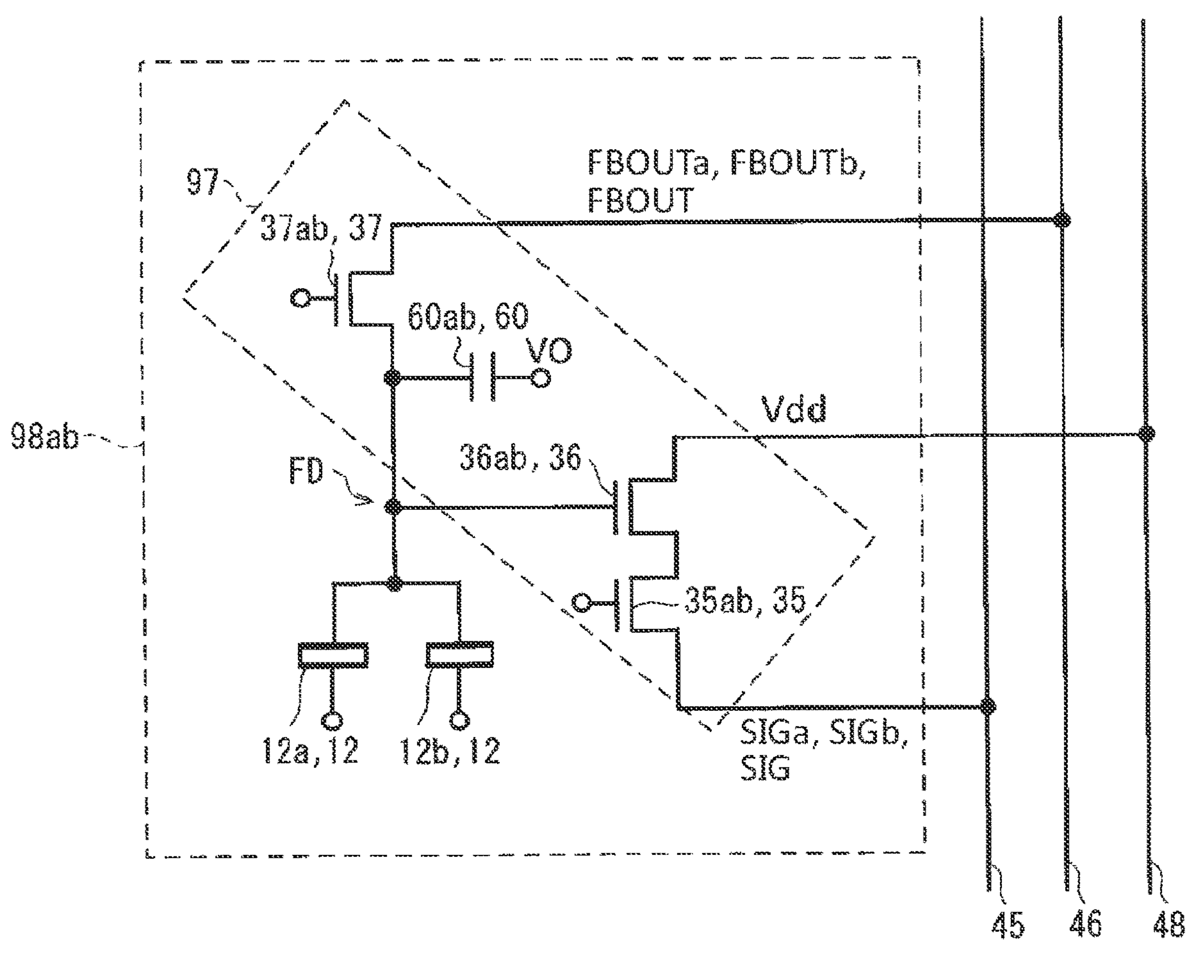
FIG. 4 is a circuit diagram of a circuit configuration according to the first embodiment.

FIG. 4 illustrates a circuit diagram of the first circuit configuration 98*ab*. In the following description of the first circuit configuration 98*ab*, substantially the same constituent elements as those of the circuit configuration 99 illustrated in FIG. 5 will be denoted by the same reference numerals, and description thereof may be omitted.

The first circuit configuration 98*ab* includes the address transistor 35, the amplification transistor 36, the reset transistor 37, and the capacitive element 60. Moreover, the first circuit configuration 98*ab* includes two photoelectric converters 12. One of the two photoelectric converters 12 belongs to the first pixel 10*a*. The other one of the two photoelectric converters 12 belongs to the second pixel 10*b*.

The photoelectric converter 12 of the first pixel 10*a* can be referred to as a first photoelectric converter 12*a*. The pixel electrode 13 of the first photoelectric converter 12*a* can be referred to as a first pixel electrode 13*a*. The counter electrode 17 of the first photoelectric converter 12*a* can be referred to as a first counter electrode 17*a*. The photoelectric conversion layer 15 of the first photoelectric converter 12*a* can be referred to as a first photoelectric conversion layer 15*a*.

The photoelectric converter 12 of the second pixel 10*b* can be referred to as a second photoelectric converter 12*b*. The pixel electrode 13 of the second photoelectric converter 12*b* can be referred to as a second pixel electrode 13*b*. The counter electrode 17 of the second photoelectric converter 12*b* can be referred to as a second counter electrode 17*b*. The photoelectric conversion layer 15 of the second photoelectric converter 12*b* can be referred to as a second photoelectric conversion layer 15*b*.

The capacitive element 60 of the first circuit configuration 98*ab* can be referred to as a first capacitive element 60*ab*. The electrode 61 of the first capacitive element 60*ab* can be referred to as a first electrode 61. The electrode 62 of the first capacitive element 60*ab* can be referred to as a second electrode 62. The opposing surface 65 of the first electrode 61 can be referred to as a first opposing surface 65. The opposing surface 66 of the second electrode 62 can be referred to as a second opposing surface 66. The dielectric 63 of the first capacitive element 60*ab* can be referred to as a first dielectric 63. The external potential VO that is applied to the first capacitive element 60*ab* can be referred to as a first external potential VO.

The first photoelectric converter 12*a* converts light of the first wavelength region into first electric charge. The first capacitive element 60*ab* accumulates the first electric charge. Specifically, the first photoelectric conversion layer 15*a* generates the first electric charge. The first pixel electrode 13*a* collects the first electric charge.

The second photoelectric converter 12*b* converts light of the second wavelength region into second electric charge. The first capacitive element 60*ab* accumulates the second electric charge. Specifically, the second photoelectric conversion layer 15_b_ generates the second electric charge. The second pixel electrode 13_b_ collects the second electric charge.

The address transistor 35 of the first circuit configuration 98_ab_ can be referred to as a first address transistor 35_ab_. The amplification transistor 36 of the first circuit configuration 98_ab_ can be referred to as a first amplification transistor 36_ab_. The reset transistor 37 of the first circuit configuration 98_ab_ can be referred to as a first reset transistor 37_ab_.

Similarly to as in the circuit configuration 99, the charge accumulation region FD is also formed in the first circuit configuration 98_ab_. The charge accumulation region FD of the first circuit configuration 98_ab_ can also be referred to as a first charge accumulation region FD.

The first address transistor 35_ab_, the first amplification transistor 36_ab_, the first reset transistor 37_ab_, and the first capacitive element 60_ab_ are shared by the first pixel 10_a_ and the second pixel 10_b_. That is, the first address transistor 35_ab_, the first amplification transistor 36_ab_, the first reset transistor 37_ab_, and the first capacitive element 60_ab_ are the common configuration 97 of the first pixel 10_a_ and the second pixel 10_b_. The first pixel 10_a_ has the common configuration 97 and the first photoelectric converter 12_a_. The second pixel 10_b_ has the common configuration 97 and the second photoelectric converter 12_b_.

In this manner, in the present embodiment, the first capacitive element 60_ab_ is shared by the first pixel 10_a_ and the second pixel 10_b_. Thus, the charge accumulation region FD that has a required capacitance and that is for the first pixel 10_a_ and the second pixel 10_b_ is more easily formed in a limited space than in a case where the first capacitive element 60_ab_ is not shared by the first pixel 10_a_ and the second pixel 10_b_. Thus, even when the imaging device 100A is irradiated with light of a high intensity, the charge accumulation region FD is less likely to become saturated, and blown highlights in images are less likely to occur. In a typical example, in the imaging device 100A, the number of capacitive elements 60 is smaller than the number of photoelectric converters 12.

The first photoelectric converter 12_a_, the second photoelectric converter 12_b_, one of the source or the drain of the first reset transistor 37_ab_, one end of the first capacitive element 60_ab_, and the gate electrode of the first amplification transistor 36_ab_ are electrically connected to each other. The other one of the source or the drain of the first reset transistor 37_ab_ is electrically connected to the first feedback line 46. One of the source or the drain of the first amplification transistor 36_ab_ is electrically connected to the power wiring line 48. The other one of the source or the drain of the first amplification transistor 36_ab_ is electrically connected to one of the source or the drain of the first address transistor 35_ab_. The other one of the source or the drain of the first address transistor 35_ab_ is electrically connected to the first vertical signal line 45.

In the present embodiment, the first photoelectric converter 12_a_ and the first capacitive element 60_ab_ are connected to each other without a switching device interposed therebetween. Specifically, the first photoelectric converter 12_a_ and the first capacitive element 60_ab_ are electrically connected to each other through an electric path that done not have a switching device. The second photoelectric converter 12_b_ and the first capacitive element 60_ab_ are connected to each other without a switching device interposed therebetween. Specifically, the second photoelectric converter 12_b_ and the first capacitive element 60_ab_ are electrically connected to each other through an electric path that done not have a switching device.

When the imaging element 100 is irradiated with light, positive charge and negative charge, typically, electron-hole pairs are generated in the first photoelectric conversion layer 15_a_ or the second photoelectric conversion layer 15_b_. For example, suppose that a voltage is applied between the first counter electrode 17_a_ and the first pixel electrode 13_a_ such that the first counter electrode 17_a_ has a higher potential than the first pixel electrode 13_a_. In this case, positive charge is collected at the first pixel electrode 13_a_, and negative charge is collected at the first counter electrode 17_a_. The positive charge collected at the first pixel electrode 13_a_ is accumulated in the first capacitive element 60_ab_. Moreover, for example, suppose that a voltage is applied between the second counter electrode 17_b_ and the second pixel electrode 13_b_ such that the second counter electrode 17_b_ has a higher potential than the second pixel electrode 13_b_. In this case, positive charge is collected at the second pixel electrode 13_b_, and negative charge is collected at the second counter electrode 17_b_. The positive charge collected at the second pixel electrode 13_b_ is accumulated in the first capacitive element 60_ab_.

In the present embodiment, both of the first pixel electrode 13_a_ and the second pixel electrode 13_b_ are electrically connected to the first electrode 61 of the first capacitive element 60_ab_. Thus, both of the electric charge generated by the first photoelectric converter 12_a_ and the electric charge generated by the second photoelectric converter 12_b_ may flow into the first electrode 61 of the first capacitive element 60_ab_. If proper control is not performed, it is difficult to distinguish whether the charge that has flowed into the first capacitive element 60_ab_ originated from the first photoelectric converter 12_a_ or the second photoelectric converter 12_b_.

In this regard, in the present embodiment, the first counter electrode 17_a_ is electrically separated from the second counter electrode 17_b_. Thus, the potential of the first counter electrode 17_a_ and the potential of the second counter electrode 17_b_ can be controlled independently of each other. Thus, a period during which the first photoelectric converter 12_a_ is allowed to be sensitive to light and a period during which the second photoelectric converter 12_b_ is allowed to be sensitive to light can be switched. This enables the first capacitive element 60_ab_ to accumulate, in a selective manner, either one of the first electric charge generated by the first photoelectric converter 12_a_ and the second electric charge generated by the second photoelectric converter 12_b_. Moreover, this enables the distinction described above.

Specifically, when the first photoelectric converter 12_a_ is allowed to be sensitive to light while the second photoelectric converter 12_b_ is prevented from being sensitive to light, the electric charge that originates from the first photoelectric converter 12_a_ is accumulated in the first capacitive element 60_ab_, and the electric charge that originates from the second photoelectric converter 12_b_ is not accumulated in the first capacitive element 60_ab_. As a result, an image can be formed that has a component originating from the first wavelength region and does not have a component originating from the second wavelength region.

Moreover, when the first photoelectric converter 12_a_ is prevented from being sensitive to light while the second photoelectric converter 12_b_ is allowed to be sensitive to light, the electric charge that originates from the first photoelectric converter 12_a_ is not accumulated in the first capacitive element 60_ab_, and the electric charge that originates from the second photoelectric converter 12_b_ is accumulated in the first capacitive element 60_ab_. As a result, an image can be formed that does not have a component originating from the first wavelength region and has a component originating from the second wavelength region.

"The photoelectric converter 12 is allowed to be sensitive to light" can also be expressed as "the photoelectric converter 12 is allowed to execute a photoelectric conversion function" instead. Switching as to whether to allow the photoelectric converter 12 to be sensitive to light can be realized by switching a voltage to be applied to the counter electrode 17. In order to allow the photoelectric converter to be sensitive to light, for example, it is sufficient that a voltage other than 0 V be applied to the counter electrode 17. In order to prevent the photoelectric converter from being sensitive to light, for example, it is sufficient that 0 V be applied to the counter electrode 17.

Returning to FIG. 4, in the first circuit configuration 98*ab* according to the present embodiment, the first charge accumulation region FD includes the gate electrode of the first amplification transistor 36*ab*. The first charge accumulation region FD includes the first capacitive element 60*ab*. The first charge accumulation region FD includes one of the source or the drain of the first reset transistor 37*ab*. The first charge accumulation region FD includes the first pixel electrode 13*a*. The first charge accumulation region FD includes the second pixel electrode 13*b*.

In the first circuit configuration 98*ab* according to the present embodiment, the proportion of a capacitance $C_{CAP1}$ of the first capacitive element 60*ab* in a capacitance $C_{FD1}$ of the entire first charge accumulation region FD, which is a proportion $C_{CAP1}/C_{FD1}$, is greater than 50%. The proportion $C_{CAP1}/C_{FD1}$ may be greater than or equal to 70% or may also be greater than or equal to 90%.

When the imaging device 100A is in operation, the power supply voltage Vdd is supplied from the power wiring line 48 to one of the source or the drain of the first amplification transistor 36*ab*. The first amplification transistor 36*ab* outputs the first output signal SIGa or the second output signal SIGb. The first output signal SIGa is a signal voltage corresponding to the amount of signal charge generated by the first photoelectric converter 12*a*. The second output signal SIGb is a signal voltage corresponding to the amount of signal charge generated by the second photoelectric converter 12*b*.

The other one of the source or the drain of the first address transistor 35*ab* is connected, with the first vertical signal line 45 interposed therebetween, to a first load circuit 42 and a first column signal processing circuit 40 illustrated in FIG. 3. The first load circuit 42 and the first amplification transistor 36*ab* form a source follower circuit.

The first address signal line 44 is connected to the gate electrode of the first address transistor 35*ab*. The first address signal line 44 is connected to a vertical scanning circuit 52. The vertical scanning circuit 52 applies, to the first address signal line 44, a row selection signal for controlling ON and OFF of the first address transistor 35*ab*. As a result, read-out target lines are scanned in the vertical direction, that is, the column direction, and a certain read-out target row is selected. By controlling, via the first address signal line 44, ON and OFF of the first address transistor 35*ab*, the vertical scanning circuit 52 can read out, into the corresponding first vertical signal line 45, the first output signal SIGa or the second output signal SIGb from the amplification transistor 36*ab* of the first circuit configuration 98*ab* that is selected. The arrangement of the first address transistor 35*ab* is not limited to the example illustrated in FIG. 4. The first address transistor 35*ab* may be placed between the drain of the first amplification transistor 36*ab* and the power wiring line 48.

A signal voltage, which is the first output signal SIGa or the second output signal SIGb, passes through the first address transistor 35*ab* and the first vertical signal line 45 in this order and is then input to the first column signal processing circuit 40.

The first reset signal line 43 is connected to the gate electrode of the first reset transistor 37*ab*. By applying the row selection signal to a first address signal line 44 among the first address signal lines 44, the vertical scanning circuit 52 can select, in units of row, first circuit configurations 98*ab* to be reset. Moreover, the vertical scanning circuit 52 can turn on the first reset transistors 37*ab* of the selected row by applying, to the gate electrodes of the first reset transistors 37*ab*, a reset signal for controlling ON and OFF of the first reset transistors 37*ab* via the first reset signal line 43. The potentials of the first charge accumulation regions FD are reset by turning on the first reset transistors 37*ab*.

In this example, the other one of the source or the drain of the first reset transistor 37*ab* is connected to the first feedback line 46. In this example, as a reset voltage, the voltage of the first feedback line 46 is supplied to the first charge accumulation region FD. As a result, the potential of the first charge accumulation region FD is initialized. In this example, the first feedback line 46 is connected to the output terminal of the first inverting amplifier 41.

As is understood from FIGS. 2, 3, and 4, an input terminal of the first inverting amplifier 41 is connected to the first vertical signal line 45. Moreover, the output terminal of the first inverting amplifier 41 is connected to the first circuit configuration 98*ab* with the first feedback line 46 interposed therebetween. When the imaging device 100A is in operation, the predetermined voltage Vref is supplied to the non-inverting input terminal of the first inverting amplifier 41. A feedback path for negatively feeding back the first output signal SIGa or the second output signal SIGb from the first circuit configuration 98*ab* can be formed by turning on the first address transistor 35*ab* and the first reset transistor 37*ab*. Formation of the feedback path causes the voltage of the first vertical signal line 45 to be the voltage Vref, which is an input voltage to the non-inverting input terminal of the first inverting amplifier 41. In other words, formation of the feedback path causes the voltage of the first charge accumulation region FD to be reset to a certain voltage with which the voltage of the first vertical signal line 45 becomes Vref. In this manner, the imaging device 100A includes the feedback circuits 47, which include the inverting amplifiers 41 partway along the feedback paths.

In the present embodiment, in a plan view, the area of the first pixel electrode 13*a* is larger than that of the second pixel electrode 13*b*. In a plan view, the area of the first pixel electrode 13*a* is larger than that of the third pixel electrode 13*c*. In a plan view, the area of the first pixel electrode 13*a* is larger than that of a fourth pixel electrode 13*d*. In a plan view, the area of the first pixel electrode 13*a* is larger than that of a fifth pixel electrode 13*e*. According to these characteristics, even when light of the first wavelength region is weak, the first electric charge can be easily collected using the first pixel electrode 13*a*. In other words, even when light of the first wavelength region is weak, sensitivity can be easily achieved with which the light can be detected.

In the present embodiment, the first counter electrode 17*a* is electrically separated from the second counter electrode 17*b*, the third counter electrode 17*c*, a fourth counter electrode 17*d*, and a fifth counter electrode 17*e*. Thus, switching as to whether light of the first wavelength region is to be reflected in an image and switching as to whether light of the second to fifth wavelength regions is to be reflected in an image can be performed independently of each other. In the present embodiment, the second counter electrode 17*b*, the third counter electrode 17*c*, the fourth counter electrode 17*d*, and the fifth counter electrode 17*e* are electrically connected to each other.

Figure 10:
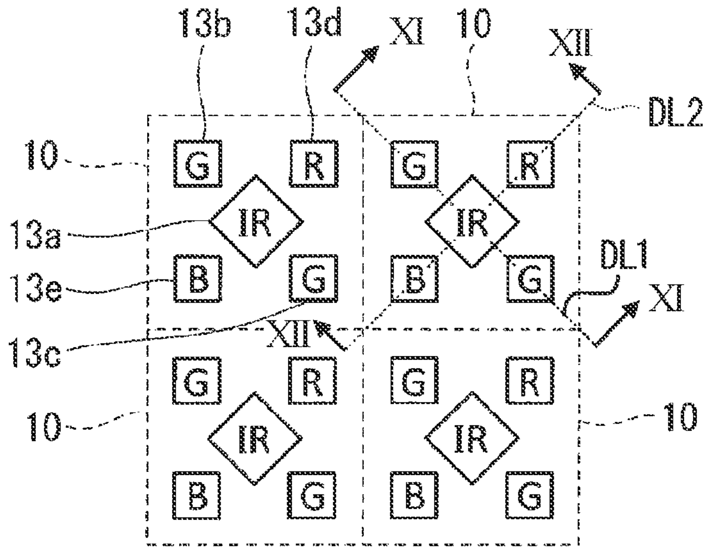
FIG. 10 is a plan view of a plurality of pixel electrodes according to the first embodiment.

FIG. 10 illustrates, in a plan view, the first pixel electrodes 13*a*, the second pixel electrodes 13*b*, the third pixel electrodes 13*c*, the fourth pixel electrodes 13*d*, and the fifth pixel electrodes 13*e*. In FIG. 10, signs "IR", "G", "R", and "B" denote wavelength regions (colors) of light that the photoelectric conversion layers 15 associated with the individual pixel electrodes 13 photoelectrically convert. Specifically, "IR" denotes infrared light. "G" denotes green light. "R" denotes red light. "B" denotes blue light. Considering the visibility of the drawing, in FIG. 10, the first pixel electrodes 13*a*, the second pixel electrodes 13*b*, the third pixel electrodes 13*c*, the fourth pixel electrodes 13*d*, and the fifth pixel electrodes 13*e* are illustrated in a non-overlapping manner. In a plan view, in each unit pixel 10, the first pixel electrode 13*a* may overlap the second pixel electrode 13*b*, the third pixel electrode 13*c*, the fourth pixel electrode 13*d*, and the fifth pixel electrode 13*e*.

As described above, in the present embodiment, the first wavelength region includes the wavelength region of infrared light. The first photoelectric conversion layer 15*a* converts light of the first wavelength region into first electric charge. The first electric charge generated in this manner is collected by the first pixel electrode 13*a*.

The second wavelength region includes the wavelength region of green light. The second photoelectric conversion layer 15*b* converts light of the second wavelength region into second electric charge. The second electric charge generated in this manner is collected by the second pixel electrode 13*b*.

The third wavelength region includes the wavelength region of green light. The third photoelectric conversion layer 15*c* converts light of the third wavelength region into third electric charge. The third electric charge generated in this manner is collected by the third pixel electrode 13*c*.

The fourth wavelength region includes the wavelength region of red light. A fourth photoelectric conversion layer 15*d* converts light of the fourth wavelength region into fourth electric charge. The fourth electric charge generated in this manner is collected by the fourth pixel electrode 13*d*.

The fifth wavelength region includes the wavelength region of blue light. A fifth photoelectric conversion layer 15*e* converts light of the fifth wavelength region into fifth electric charge. The fifth electric charge generated in this manner is collected by the fifth pixel electrode 13*e*.

FIG. 11 is a cross-sectional view of the imaging element 100, the view illustrating a first cross section parallel to the thickness direction of the semiconductor substrate 1 and taken along line XI-XI, which is a first dotted line DL1 of FIG. 10. FIG. 12 is a cross-sectional view of the imaging element 100, the view illustrating a second cross section parallel to the thickness direction of the semiconductor substrate 1 and taken along line XII-XII, which is a second dotted line DL2 of FIG. 10.

As is understood from FIGS. 11 and 12, in the present embodiment, the first capacitive element 60*ab*, the second capacitive element 60*c*, the third capacitive element 60*d*, and the fourth capacitive element 60*e* are arranged in the same layer. This may make manufacturing of the imaging element 100 easy.

"A plurality of elements are arranged in the same layer" refers to existence of a cross section that is perpendicular to the thickness direction of the semiconductor substrate 1 and passes through the plurality of elements. In contrast, "a plurality of elements are arranged in different layers" refers to non-existence of a cross section that is perpendicular to the thickness direction of the semiconductor substrate 1 and passes through the plurality of elements.

The second photoelectric converter 12*b*, the third photoelectric converter 12*c*, a fourth photoelectric converter 12*d*, and a fifth photoelectric converter 12*e* are arranged in the same layer. In the following, the layer in which the second photoelectric converter 12*b*, the third photoelectric converter 12*c*, the fourth photoelectric converter 12*d*, and the fifth photoelectric converter 12*e* are arranged may be referred to as a second layer 102.

The first photoelectric converter 12*a* is arranged in a different layer from the layer of the second photoelectric converter 12*b*, the third photoelectric converter 12*c*, the fourth photoelectric converter 12*d*, and the fifth photoelectric converter 12*e*. In the following, the layer in which the first photoelectric converter 12*a* is arranged may be referred to as a first layer 101.

Specifically, the semiconductor substrate 1, a wiring layer including wiring lines 5*ab*, 5*c*, 5*d* and 5*e*, the insulating layer 7, a wiring layer including wiring lines 4*a*, 4*b*, 4*c*, 4*d* and 4*e*, an insulating layer 8, the first layer 101, an insulating layer 9, and the second layer 102 are arranged from below to above in this order.

As described above, the first photoelectric converter 12*a* has the first counter electrode 17*a*, the first pixel electrode 13*a*, and the first photoelectric conversion layer 15*a*. The second photoelectric converter 12*b* has the second counter electrode 17*b*, the second pixel electrode 13*b*, and the second photoelectric conversion layer 15*b*. The third photoelectric converter 12*c* has the third counter electrode 17*c*, the third pixel electrode 13*c*, and the third photoelectric conversion layer 15*c*. The fourth photoelectric converter 12*d* has the fourth counter electrode 17*d*, the fourth pixel electrode 13*d*, and the fourth photoelectric conversion layer 15*d*. The fifth photoelectric converter 12*e* has the fifth counter electrode 17*e*, the fifth pixel electrode 13*e*, and the fifth photoelectric conversion layer 15*e*.

The second counter electrode 17*b*, the third counter electrode 17*c*, the fourth counter electrode 17*d*, and the fifth counter electrode 17*e* constitute a single integrated electrode. The second photoelectric conversion layer 15*b*, the third photoelectric conversion layer 15*c*, the fourth photoelectric conversion layer 15*d*, and the fifth photoelectric conversion layer 15*e* constitute a single integrated film. In contrast, the first pixel electrode 13*a*, the second pixel electrode 13*b*, the third pixel electrode 13*c*, the fourth pixel electrode 13*d*, and the fifth pixel electrode 13*e* are separated from each other.

Note that the second counter electrode 17*b*, the third counter electrode 17*c*, the fourth counter electrode 17*d*, and the fifth counter electrode 17*e* may be separated from each other. The second photoelectric conversion layer 15*b*, the third photoelectric conversion layer 15*c*, the fourth photoelectric conversion layer 15*d*, and the fifth photoelectric conversion layer 15*e* may be separated from each other.

In the present embodiment, the semiconductor substrate 1, the first layer 101, the second layer 102, and a light receiving surface are arranged from below to above in this order. In the present embodiment, the light receiving surface includes condenser lenses 21*b*, 21*c*, 21*d*, and 21*e*, which will be described later. In this case, the light receiving surface is the light receiving surface of the imaging device or the light receiving surface of the imaging element 100.

Out of the first photoelectric converter 12*a* and the second photoelectric converter 12*b*, the photoelectric converter closer to the light receiving surface is defined as a proximal photoelectric converter, and the photoelectric converter farther from the light receiving surface is defined as a distal photoelectric converter. In this case, the central wavelength of the wavelength region of light that the proximal photoelectric converter photoelectrically converts is shorter than the central wavelength of the wavelength region of light that the distal photoelectric converter photoelectrically converts. Short wavelength light is more likely to be attenuated than long wavelength light. However, with such a configuration, attenuation of short wavelength light can be reduced.

In the present embodiment, the proximal photoelectric converter is the one farther from the semiconductor substrate 1 out of the first photoelectric converter 12*a* and the second photoelectric converter 12*b*. The distal photoelectric converter is the one closer to the semiconductor substrate 1 out of the first photoelectric converter 12*a* and the second photoelectric converter 12*b*.

As is understood from the description above, in the present embodiment, the second photoelectric converter 12*b*, the third photoelectric converter 12*c*, the fourth photoelectric converter 12*d*, and the fifth photoelectric converter 12*e* are arranged closer to the light receiving surface than the first photoelectric converter 12*a* is. Note that the first photoelectric converter 12*a* may be arranged closer to the light receiving surface than the second photoelectric converter 12*b*, the third photoelectric converter 12*c*, the fourth photoelectric converter 12*d*, and the fifth photoelectric converter 12*e* are.

In the present embodiment, the second pixel electrode 13*b*, the third pixel electrode 13*c*, the fourth pixel electrode 13*d*, and the fifth pixel electrode 13*e* are transparent electrodes that have translucency and conductivity. The transparent electrodes are composed of an oxide and are specifically composed of ITO. The first pixel electrode 13*a* is a non-transparent electrode that does not have translucency but has conductivity. As materials of the non-transparent electrode, metals, metal oxides, metal nitrides, and conductive polysilicon are taken as examples. When the second pixel electrode 13*b*, the third pixel electrode 13*c*, the fourth pixel electrode 13*d*, and the fifth pixel electrode 13*e* are composed of a material having translucency, it is more likely that light of the first wavelength region passes through the second pixel electrode 13*b*, the third pixel electrode 13*c*, the fourth pixel electrode 13*d*, and the fifth pixel electrode 13*e* and is absorbed by the first photoelectric conversion layer 15*a*. As a result, the sensitivity of the first photoelectric converter 12*a* can be sufficiently ensured.

The insulating layers 7, 8, and 9 are composed of insulating materials such as $SiO_2$. The wiring lines 4*a*, 4*b*, 4*c*, 4*d*, 4*e*, 5*ab*, 5*c*, 5*d*, and 5*e* are composed of metal. Examples of the metal include aluminum (Al) and copper (Cu).

The first counter electrode 17*a*, the second counter electrode 17*b*, the third counter electrode 17*c*, the fourth counter electrode 17*d*, and the fifth counter electrode 17*e* are each a transparent electrode having translucency and conductivity. The transparent electrodes are composed of an oxide and are specifically composed of ITO.

The positional relationship of the second pixel electrode 13*b*, the third pixel electrode 13*c*, the fourth pixel electrode 13*d*, and the fifth pixel electrode 13*e* with respect to the second counter electrode 17*b*, the third counter electrode 17*c*, the fourth counter electrode 17*d*, and the fifth counter electrode 17*e* may be switched. In this case, the second counter electrode 17*b*, the third counter electrode 17*c*, the fourth counter electrode 17*d*, and the fifth counter electrode 17*e* and the first counter electrode 17*a* can be formed so as to be integrated with each other by omitting the insulating layer 9. In other words, a single counter electrode may be provided between the first photoelectric conversion layer 15*a* and the second to fifth photoelectric conversion layers 15*b* to 15*e*, the single counter electrode being electrically in contact with the first photoelectric conversion layer 15*a* and with the second to fifth photoelectric conversion layers 15*b* to 15*e*.

Each unit pixel 10 has a first plug 31*a*, a second plug 31*b*, a third plug 31*c*, a fourth plug 31*d*, and a fifth plug 31*e*. The first plug 31*a*, the second plug 31*b*, the third plug 31*c*, the fourth plug 31*d*, and the fifth plug 31*e* are conductors. That is, the first plug 31*a*, the second plug 31*b*, the third plug 31*c*, the fourth plug 31*d*, and the fifth plug 31*e* are composed of conductive materials. Examples of the conductive materials include metals, metal oxides, metal nitrides, and conductive polysilicon.

In the present embodiment, the first plug 31*a*, the second plug 31*b*, the third plug 31*c*, the fourth plug 31*d*, and the fifth plug 31*e* extend in the thickness direction of the semiconductor substrate 1.

The first pixel electrode 13*a*, the first capacitive element 60*ab*, the gate electrode of the first amplification transistor 36*ab*, and one of the source or the drain of the first reset transistor 37*ab* are electrically connected to each other by using the first plug 31*a* and the wiring line 4*a*. The second pixel electrode 13*b*, the first capacitive element 60*ab*, the gate electrode of the first amplification transistor 36*ab*, and one of the source or the drain of the first reset transistor 37*ab* are electrically connected to each other by using the second plug 31*b* and the wiring line 4*b*. The third pixel electrode 13*c*, the second capacitive element 60*c*, the gate electrode of the second amplification transistor 36*c*, and one of the source or the drain of the second reset transistor 37*c* are electrically connected to each other by using the third plug 31*c* and the wiring line 4*c*. The fourth pixel electrode 13*d*, the third capacitive element 60*d*, the gate electrode of a third amplification transistor 36*d*, and one of the source or the drain of a third reset transistor 37*d* are electrically connected to each other by using the fourth plug 31*d* and the wiring line 4*d*. The fifth pixel electrode 13*e*, the fourth capacitive element 60*e*, the gate electrode of a fourth amplification transistor 36*e*, and one of the source or the drain of a fourth reset transistor 37*e* are electrically connected to each other by using the fifth plug 31*e* and the wiring line 4*e*.

Through the wiring line 5*ab*, the first external potential VO is supplied to the second electrode 62 of the first capacitive element 60*ab*. Through the wiring line 5*c*, the second external potential VO is supplied to the fourth electrode 62 of the second capacitive element 60*c*. Through the wiring line 5*d*, a third external potential VO is supplied to the sixth electrode 62 of the third capacitive element 60*d*. Through the wiring line 5*e*, a fourth external potential VO is supplied to the eighth electrode 62 of the fourth capacitive element 60*e*. The first external potential VO, the second external potential VO, the third external potential VO, and the fourth external potential VO may be equal to each other or may be different from each other.

The insulating layer 1*g* is provided on the surface of the semiconductor substrate 1. In a typical example, the insulating layer 1*g* is an oxide of a semiconductor material of the semiconductor substrate 1. The insulating layer 1*g* forms the gate insulating films of the first amplification transistor 36*ab*, the second amplification transistor 36*c*, the third amplification transistor 36*d*, the fourth amplification transistor 36*e*, the first reset transistor 37*ab*, the second reset transistor 37*c*, the third reset transistor 37*d*, and the fourth reset transistor 37*e*. Note that, in FIGS. 11 and 12, illustration of first to fourth address transistors 35 is omitted. The insulating layer 1*g* also forms the gate insulating films of these address transistors 35.

In FIGS. 11 and 12, a vertical dotted line is drawn between the insulating layer 1*g* and the wiring layer in which the wiring lines 5*ab*, 5*c*, 5*d*, and 5*e* are provided. Elements that are not described in the present embodiment may be provided in the layer(s) schematically illustrated using the vertical dotted line.

Moreover, in FIGS. 11 and 12, thick lines are connected to the gate electrodes of the first amplification transistor 36*ab*, the second amplification transistor 36*c*, the third amplification transistor 36*d*, and the fourth amplification transistor 36*e*. The thick lines are also connected to one of the source or the drain of each of the first reset transistor 37*ab*, the second reset transistor 37*c*, the third reset transistor 37*d*, and the fourth reset transistor 37*e*. The thick lines are also connected to the first plug 31*a*, the second plug 31*b*, the third plug 31*c*, the fourth plug 31*d*, and the fifth plug 31*e*. In FIGS. 11 and 12, the thick lines schematically represent electrical connection.

The imaging element 100 according to the present embodiment has a multilayer structure. "Multilayer" refers to existence of a plurality of photoelectric converters in the thickness direction of the semiconductor substrate 1. With a multilayer structure, the areas of pixel electrodes can be sufficiently ensured, and thus use of a multilayer structure is advantageous to improve the sensitivities of pixels. In the present embodiment, it can be said that the imaging element 100 has a two-layer structure since the second photoelectric converter 12*b*, the third photoelectric converter 12*c*, the fourth photoelectric converter 12*d*, and the fifth photoelectric converter 12*e* provided in the second layer 102 and the first photoelectric converter 12*a* provided in the first layer 101, which is positioned below the second layer 102, are present.

In general, the band gap of a material that is sensitive to infrared light is narrower than the band gap of a material (panchromatic material) that is sensitive to visible light. Thus, when a photoelectric conversion layer is formed using a material that is sensitive to infrared light, the amount of dark current due to thermal excitation at normal temperatures theoretically increases. In the present embodiment, the first photoelectric conversion layer 15*a* is electrically insulated from the second photoelectric conversion layer 15*b*, the third photoelectric conversion layer 15*c*, the fourth photoelectric conversion layer 15*d*, and the fifth photoelectric conversion layer 15*e*. Thus, a dark current generated in the first photoelectric conversion layer 15*a* can be prevented from flowing into the second photoelectric conversion layer 15*b*, the third photoelectric conversion layer 15*c*, the fourth photoelectric conversion layer 15*d*, and the fifth photoelectric conversion layer 15*e*. As a result, degradation of image quality due to a dark current can be prevented.

The imaging element 100 has a second color filter 19*b*, a third color filter 19*c*, a fourth color filter 19*d*, and a fifth color filter 19*e*. The second color filter 19*b*, the third color filter 19*c*, the fourth color filter 19*d*, and the fifth color filter 19*e* are arranged above the second layer 102.

The wavelength region of light that the second color filter 19*b* allows to pass therethrough is the second wavelength region. The wavelength region of light that the third color filter 19*c* allows to pass therethrough is the third wavelength region. The wavelength region of light that the fourth color filter 19*d* allows to pass therethrough is the fourth wavelength region. The wavelength region of light that the fifth color filter 19*e* allows to pass therethrough is the fifth wavelength region.

In the present embodiment, the second color filter 19*b*, the third color filter 19*c*, the fourth color filter 19*d*, and the fifth color filter 19*e* constitute a Bayer filter. By using the second color filter 19*b*, the third color filter 19*c*, the fourth color filter 19*d*, and the fifth color filter 19*e*, blue, green, and red color information is acquired from the second photoelectric conversion layer 15*b*, the third photoelectric conversion layer 15*c*, the fourth photoelectric conversion layer 15*d*, and the fifth photoelectric conversion layer 15*e*, so that a full-color image can be formed.

The imaging element 100 has a second condenser lens 21*b*, a third condenser lens 21*c*, a fourth condenser lens 21*d*, and a fifth condenser lens 21*e*. The second condenser lens 21*b*, the third condenser lens 21*c*, the fourth condenser lens 21*d*, and the fifth condenser lens 21*e* are arranged above the second color filter 19*b*, the third color filter 19*c*, the fourth color filter 19*d*, and the fifth color filter 19*e*, respectively. The second condenser lens 21*b*, the third condenser lens 21*c*, the fourth condenser lens 21*d*, and the fifth condenser lens 21*e* constitute the light receiving surface of the imaging element 100. The amount of obliquely incident light can be reduced by using the second condenser lens 21*b*, the third condenser lens 21*c*, the fourth condenser lens 21*d*, and the fifth condenser lens 21*e*. As a result, color blending due to obliquely incident light can be suppressed.

The second photoelectric conversion layer 15*b* is irradiated with light that has passed through the second condenser lens 21*b* and the second color filter 19*b* in this order. The third photoelectric conversion layer 15*c* is irradiated with light that has passed through the third condenser lens 21*c* and the third color filter 19*c* in this order. The fourth photoelectric conversion layer 15*d* is irradiated with light that has passed through the fourth condenser lens 21*d* and the fourth color filter 19*d* in this order. The fifth photoelectric conversion layer 15*e* is irradiated with light that has passed through the fifth condenser lens 21*e* and the fifth color filter 19*e* in this order.

In the present embodiment, the second condenser lens 21*b*, the third condenser lens 21*c*, the fourth condenser lens 21*d*, and the fifth condenser lens 21*e* constitute a group of lenses that is formed in an integrated manner. This group of lenses that is formed in an integrated manner has a surface with a plurality of convex portions. Regarding the surface, the convex portions belong to the second condenser lens 21*b*, the third condenser lens 21*c*, the fourth condenser lens 21*d*, and the fifth condenser lens 21*e* on a one-to-one basis.

The imaging element 100 has a first shield electrode 23 and a second shield electrode 24. The first shield electrode 23 is arranged in the same layer as the second pixel electrode 13*b*, the third pixel electrode 13*c*, the fourth pixel electrode 13*d*, and the fifth pixel electrode 13*e*. The second shield electrode 24 is arranged in the same layer as the first pixel electrode 13*a*.

In a plan view, the first shield electrode 23 includes a portion that extends between the second pixel electrode 13*b* and the fourth pixel electrode 13*d*. In a plan view, the first shield electrode 23 includes a portion that extends between the second pixel electrode 13*b* and the fifth pixel electrode 13*e*. In a plan view, the first shield electrode 23 includes a portion that extends between the third pixel electrode 13*c* and the fourth pixel electrode 13*d*. In a plan view, the first shield electrode 23 includes a portion that extends between the third pixel electrode 13*c* and the fifth pixel electrode 13*e*.

In a plan view, one of two adjacent unit pixels 10 is defined as a first unit pixel 10, and the other one is defined as a second unit pixel 10. In this case, in a plan view, the second shield electrode 24 includes a portion that extends between the first pixel electrode 13*a* of the first unit pixel 10 and the first pixel electrode 13*a* of the second unit pixel 10.

Charge collection efficiency at each of the second pixel electrode 13*b*, the third pixel electrode 13*c*, the fourth pixel electrode 13*d*, and the fifth pixel electrode 13*e* is improved by provision of the first shield electrode 23. Specifically, as described above, the second photoelectric conversion layer 15*b*, the third photoelectric conversion layer 15*c*, the fourth photoelectric conversion layer 15*d*, and the fifth photoelectric conversion layer 15*e* constitute a single integrated film. By applying an appropriate bias voltage to the first shield electrode 23, an appropriate potential gradient is generated at a portion of the single integrated film, the portion overlapping the first shield electrode 23 in a plan view. By this potential gradient, the charge collection efficiency at each of the second pixel electrode 13*b*, the third pixel electrode 13*c*, the fourth pixel electrode 13*d*, and the fifth pixel electrode 13*e* is improved. Moreover, by this potential gradient, a phenomenon is suppressed in which charge that is supposed to flow into a certain pixel electrode flows into another pixel electrode. As a result, electrical color blending is prevented. Thus, high resolution and high sensitivity may be achieved at the same time.

Similarly, the charge collection efficiency at the first pixel electrode 13*a* is improved by provision of the second shield electrode 24. Specifically, by applying an appropriate bias voltage to the second shield electrode 24, an appropriate potential gradient is generated at a portion of the first photoelectric conversion layer 15*a*, the portion overlapping the second shield electrode 24 in a plan view. By this potential gradient, the charge collection efficiency at the first pixel electrode 13*a* is improved. Moreover, by this potential gradient, the phenomenon is suppressed in which charge that is supposed to flow into a certain pixel electrode flows into another pixel electrode. As a result, electrical color blending is prevented. Thus, high resolution and high sensitivity may be achieved at the same time.

The first shield electrode 23 is a transparent electrode that has translucency and conductivity. The transparent electrode is composed of an oxide and is specifically composed of ITO. The second shield electrode 24 is a non-transparent electrode that does not have translucency but has conductivity. As materials of the non-transparent electrode, metals, metal oxides, metal nitrides, and conductive polysilicon are taken as examples. The first shield electrode 23 may be composed of the same material as or a different material from the second pixel electrode 13*b*, the third pixel electrode 13*c*, the fourth pixel electrode 13*d*, and the fifth pixel electrode 13*e*. The second shield electrode 24 may be composed of the same material as or a different material from the first pixel electrode 13*a*.

In the present embodiment, the first shield electrode 23 is a single electrode having a single electric potential. Note that the first shield electrode 23 may have a plurality of portions that are insulated from each other. The plurality of portions of the first shield electrode 23 may have the same electric potential or may have different electric potentials from each other. These also apply to the second shield electrode 24.

The imaging element 100 further has at least one plug 27, which electrically connects the first shield electrode 23 to the second shield electrode 24. Each plug 27 is a conductor. That is, the plug 27 is composed of a conductive material. Examples of the conductive material include metals, metal oxides, metal nitrides, and conductive polysilicon. In a case where the first shield electrode 23 is electrically connected to the second shield electrode 24, when a voltage is applied to one of the first shield electrode 23 or the second shield electrode 24, the same voltage is applied to the other one of the first shield electrode 23 or the second shield electrode 24. That is, application and control of voltage is easy. In the present embodiment, the plug 27 extends in the thickness direction of the semiconductor substrate 1.

In the illustrated example, at least one of the insulating layer 8 or the insulating layer 9 is present in the space between the plug 27 and the first photoelectric conversion layer 15*a*. As a result, direct contact between the plug 27 and the first photoelectric conversion layer 15*a* is prevented, and a case may be prevented in which appropriate photoelectric conversion is prevented by the plug 27.

As described above, in the present embodiment, the second pixel electrode 13*b*, the third pixel electrode 13*c*, the fourth pixel electrode 13*d*, and the fifth pixel electrode 13*e* are composed of ITO. Note that the second pixel electrode 13*b*, the third pixel electrode 13*c*, the fourth pixel electrode 13*d*, and the fifth pixel electrode 13*e* may be composed of, for example, indium zinc oxide (IZO), aluminum-doped zinc oxide (AZO), gallium-doped zinc oxide (GZO), aluminum-magnesium co-doped zinc oxide (AlMgZnO), indium gallium oxide (IGO), indium gallium zinc oxide (IGZO), fluorine-doped indium oxide (IFO), antimony-doped tin oxide (ATO), fluorine-doped tin oxide (FTO), tin oxide ($SnO_2$), zinc oxide (ZnO), boron-doped zinc oxide (BZO), indium tin zinc oxide (ITZO), nickel oxide (NiO), or indium titanium oxide (ITiO) or may also be composed of ITO doped with HfO. These materials may also be used to form the transparent electrodes. Similarly, these materials may also be used to form the first counter electrode 17*a*, the second counter electrode 17*b*, the third counter electrode 17*c*, the fourth counter electrode 17*d*, and the fifth counter electrode 17*e* as well as the first shield electrode 23.

In the following, effects of the present embodiment will be further described.

Suppose a camera having the following characteristics.

The camera has a multilayer imaging device.

The multilayer imaging device has a first photoelectric conversion layer and a second photoelectric conversion layer.

The first photoelectric conversion layer is sensitive to infrared light.

The second photoelectric conversion layer is sensitive to visible light.

With such a camera, the second photoelectric conversion layer enables formation of an image based on visual information that the human eye can detect. The first photoelectric conversion layer enables formation of an image based on information that the human eye cannot detect. By superposing both of the images with each other, a combined image can be obtained that reflects information on a wide wavelength region. Such combined images may be used to perform, for example, robotics control. Such robotics control may be useful in, for example, the field of surveillance cameras, industrial fields, and the automotive field.

In a case where imaging is performed using infrared light, a dedicated light source usually needs to be prepared. This is because part of light of the infrared light region is hardly included in sunlight and general artificial illumination. In a case where imaging is performed inside a room, there is especially a substantial need for a dedicated light source being prepared.

However, imaging using a dedicated light source is not always easy. This is because the intensity of light reflected by a subject becomes too high depending on the position of the camera, the reflectivity of the subject, and so forth, so that blown highlights occur. A blown highlight occurs when accumulation of signal charge obtained by photoelectric conversion in a charge accumulation region reaches a saturation level. When blown highlights occur, it becomes difficult to express differences in the intensity of light reflected by a subject as differences in contrast.

In order to suppress blown highlights, a method is conceivable in which the capacitance of a charge accumulation region is increased to increase a dynamic range. In order to increase the capacitance of the charge accumulation region, increasing the size of the charge accumulation region can be considered. However, if the size of the charge accumulation region is increased, another problem may occur. Specifically, there has recently been a trend in which the sizes of pixels of an imaging device are reduced by integrating the pixels so as to have higher density. Increasing the size of the charge accumulation region does not follow this trend.

In this regard, according to the first embodiment, the first capacitive element 60*ab* is shared by the first pixel 10*a* and the second pixel 10*b*. Thus, while suppressing an increase in the size of the first pixel 10*a* and the second pixel 10*b*, the charge accumulation region FD for the first pixel 10*a* and the second pixel 10*b* can be easily increased in size than in the case where the first capacitive element 60*ab* is not shared by the first pixel 10*a* and the second pixel 10*b*.

Figure 13:
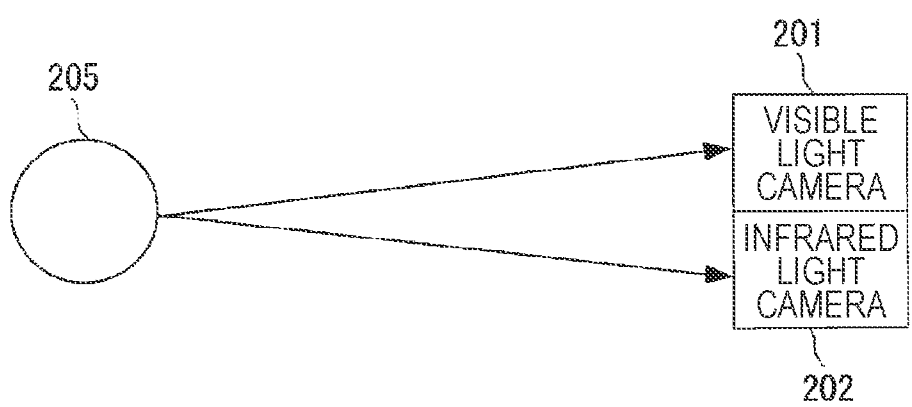
FIG. 13 is a schematic diagram illustrating an imaging mode according to a reference embodiment.
Figure 14:
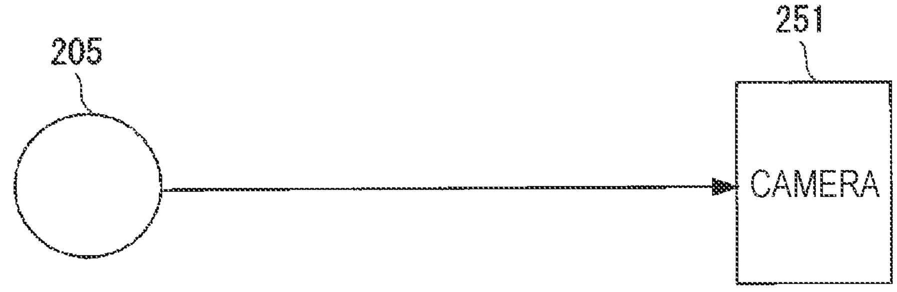
FIG. 14 is a schematic diagram illustrating an imaging mode according to the first embodiment.

Moreover, the imaging device 100A according to the first embodiment can obtain an image with low parallax regarding imaging information based on visible light and imaging information based on infrared light. In this regard, description will be made with reference to FIGS. 13 and 14. FIG. 13 is a schematic diagram illustrating an imaging mode according to a reference embodiment. FIG. 14 is a schematic diagram illustrating an imaging mode according to the first embodiment.

In the reference embodiment illustrated in FIG. 13, imaging is performed using a visible light camera 201 and an infrared light camera 202. The visible light camera 201 acquires imaging information based on visible light regarding an imaging target 205. The infrared light camera 202 acquires imaging information based on infrared light regarding the imaging target 205. In the reference embodiment, imaging information based on visible light and imaging information based on infrared light are obtained using the visible light camera 201 and the infrared light camera 202. Note that, in the reference embodiment, there is an unignorable shift between the optical axis of the visible light camera 201 and that of the infrared light camera 202. The shift between the optical axes causes parallax between these pieces of information.

In contrast, according to the first embodiment illustrated in FIG. 14, the imaging device 100A can be installed in one camera 251. That is, the one camera 251 can acquire, regarding the imaging target 205, imaging information based on visible light and imaging information based on infrared light. In this case, parallax between these pieces of information is less likely to occur. Moreover, since the one camera 251 can acquire these pieces of information, simultaneity of these pieces of information is easily ensured.

These pieces of information with low parallax and a high level of simultaneity may be useful for various applications.

For example, in medical applications, when cancer removal surgery is performed, a cancer-affected region is determined using a dye that is indocyanine green. This dye emits infrared fluorescence. Note that the human eye cannot detect infrared light. Thus, infrared fluorescence emitted by this dye is imaged using an infrared light camera. Along with this imaging, imaging information based on visible light is also acquired. In order to precisely grasp the position of a site to be removed, it is preferable that the parallax between the imaging information based on infrared light and the imaging information based on visible light be low. Thus, the technology in the first embodiment may be useful for this application.

Moreover, for example, in applications for autonomous driving of a motor vehicle, it is important to determine, through imaging, what objects are present around the vehicle. However, at nighttime, it is difficult to determine objects using imaging information based on visible light since there is not enough natural light. Thus, it is considered that imaging information based on infrared light is acquired by irradiating the objects with infrared light. Even in a case where there is not enough natural light, the parallax between imaging information based on infrared light and imaging information based on visible light may become noise when an object is to be determined. Thus, it is desirable that parallax be low. Moreover, motor vehicles involve temporal movements. Thus, it is preferable that the level of simultaneity between imaging information based on infrared light and imaging information based on visible light be high. Thus, the technology in the first embodiment may be useful for this application.

In the following, some other embodiments will be described. Elements common to the previous embodiment and its subsequent embodiments are denoted by the same reference numerals, and description thereof may be omitted. Description regarding each embodiment will be applied between the embodiments as long as the resulting description is technically consistent. Some or all of the individual embodiments may be combined to each other as long as combination of the embodiments is technically consistent.

Second Embodiment

In the following, an imaging device 100A according to a second embodiment will be described. In the following, elements that are substantially the same as those of the first embodiment will be denoted by the same reference numerals, and description thereof may be omitted.

Figure 15:
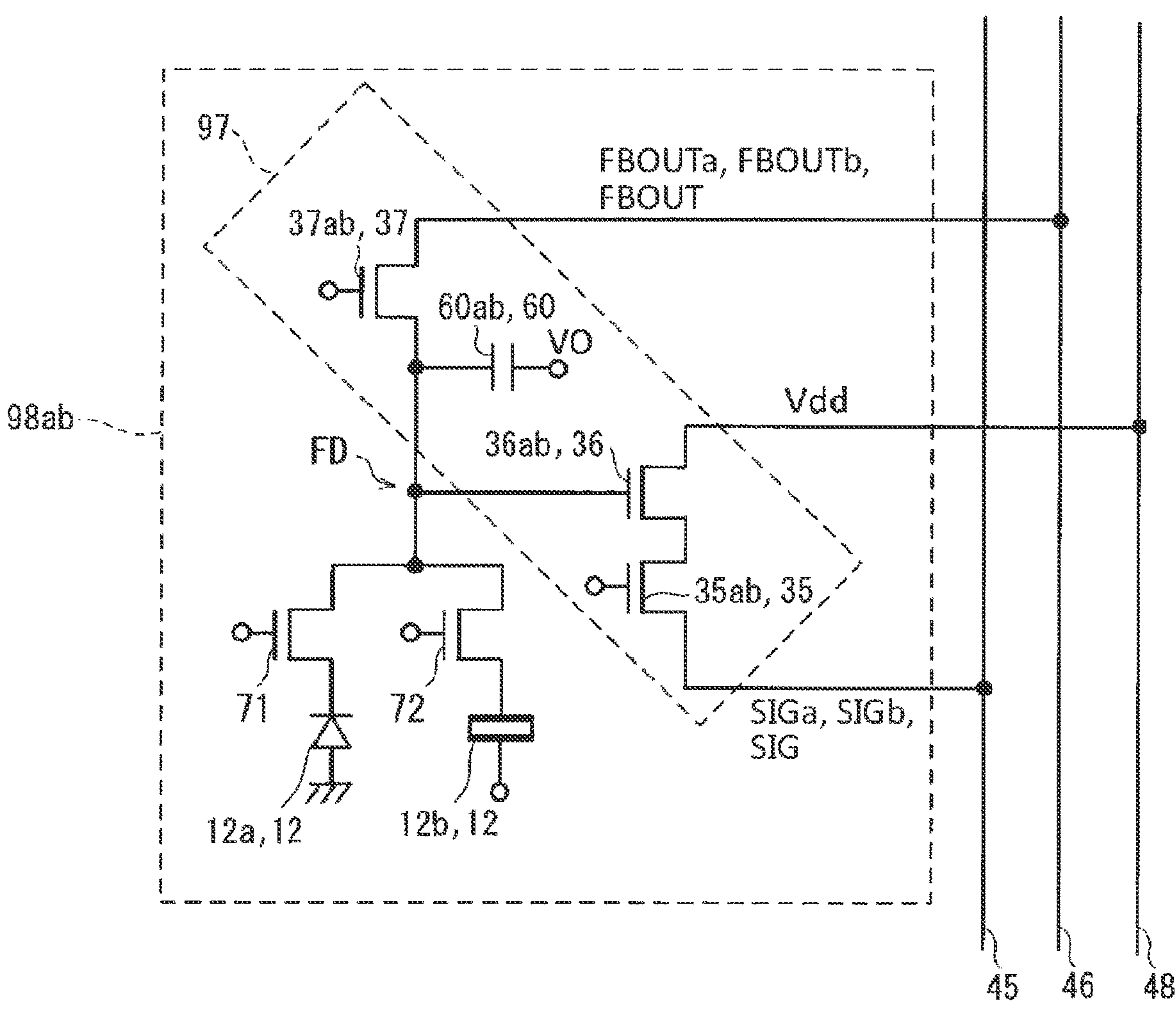
FIG. 15 is a circuit diagram of a circuit configuration according to a second embodiment.
Figure 16:
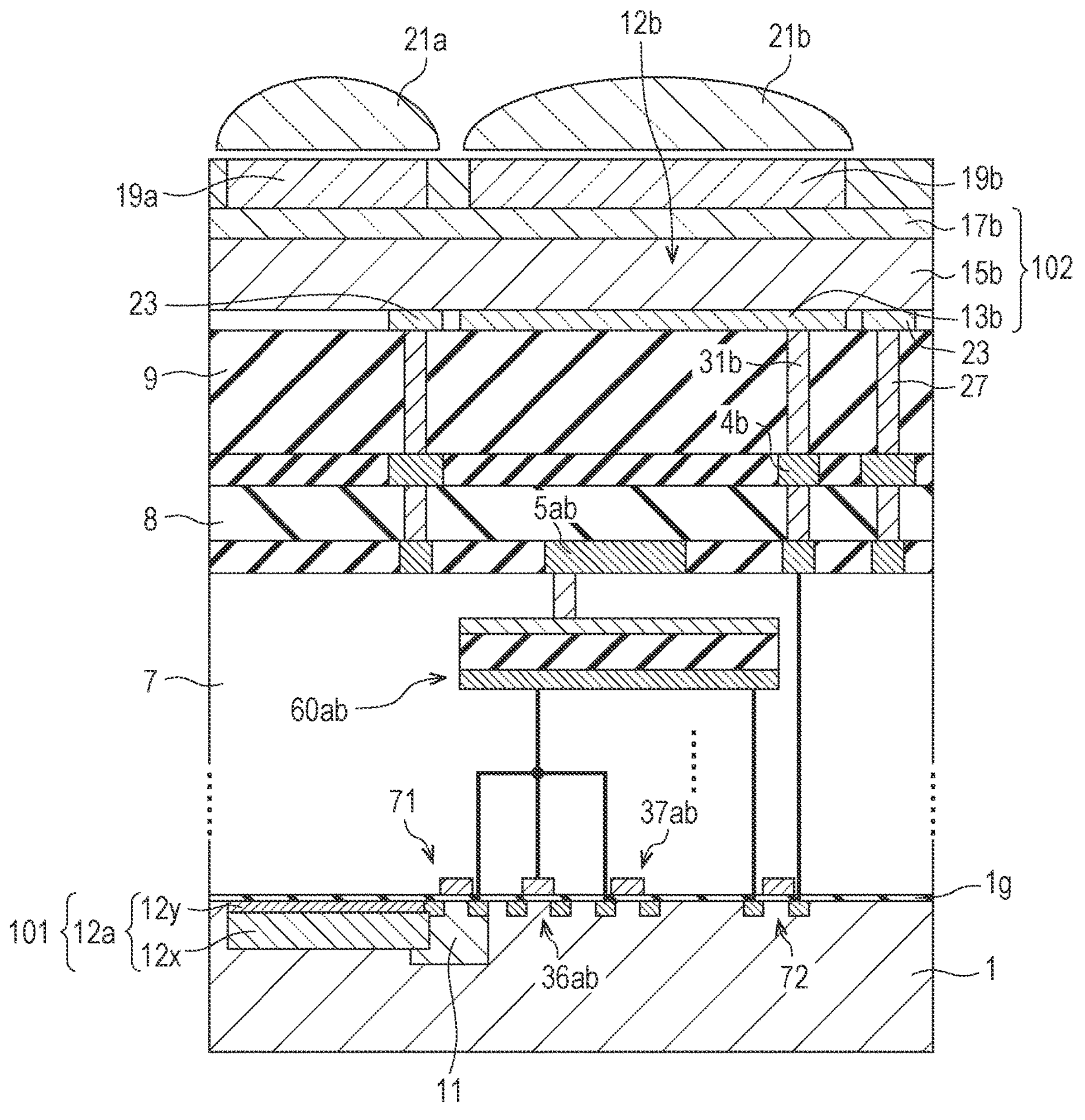
FIG. 16 is a cross-sectional view of an imaging element according to the second embodiment.
Figure 17:
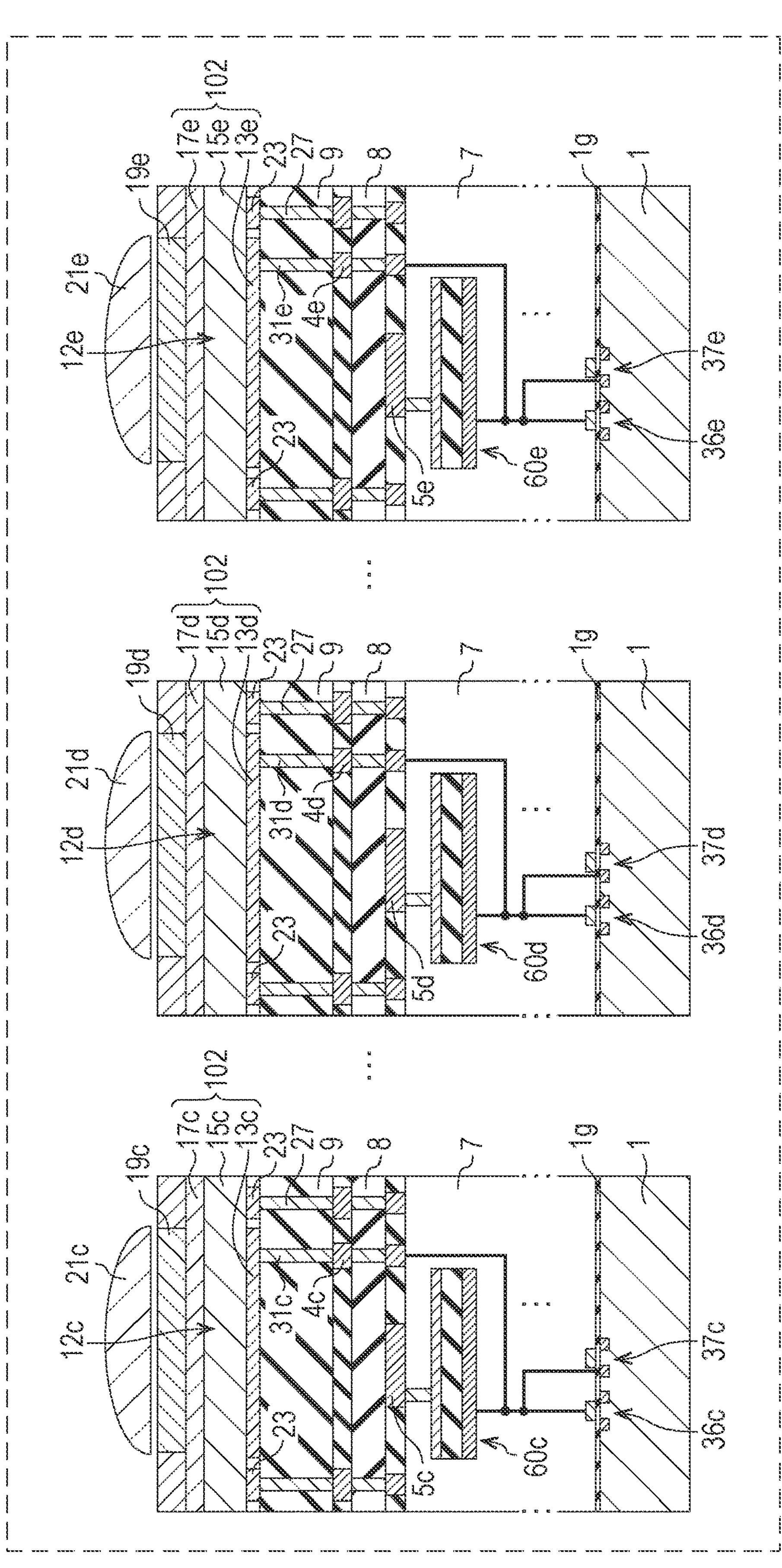
FIG. 17 is a cross-sectional view of the imaging element according to the second embodiment.
Figure 18:
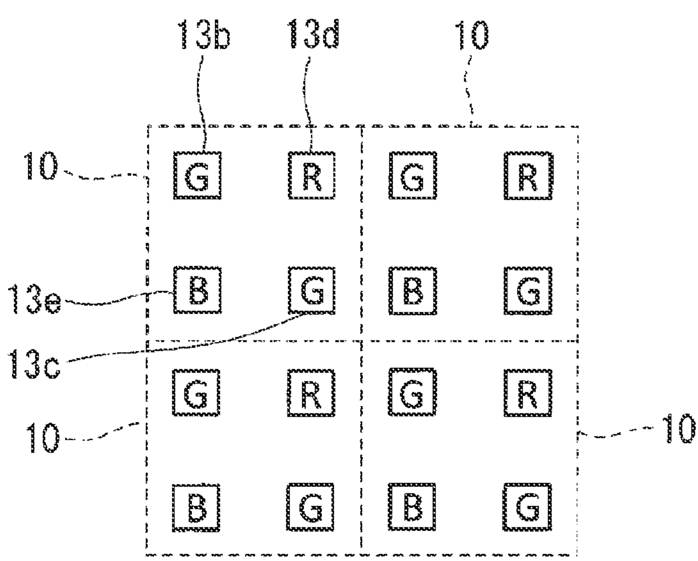
FIG. 18 is a plan view of a plurality of pixel electrodes according to the second embodiment.
Figure 19:
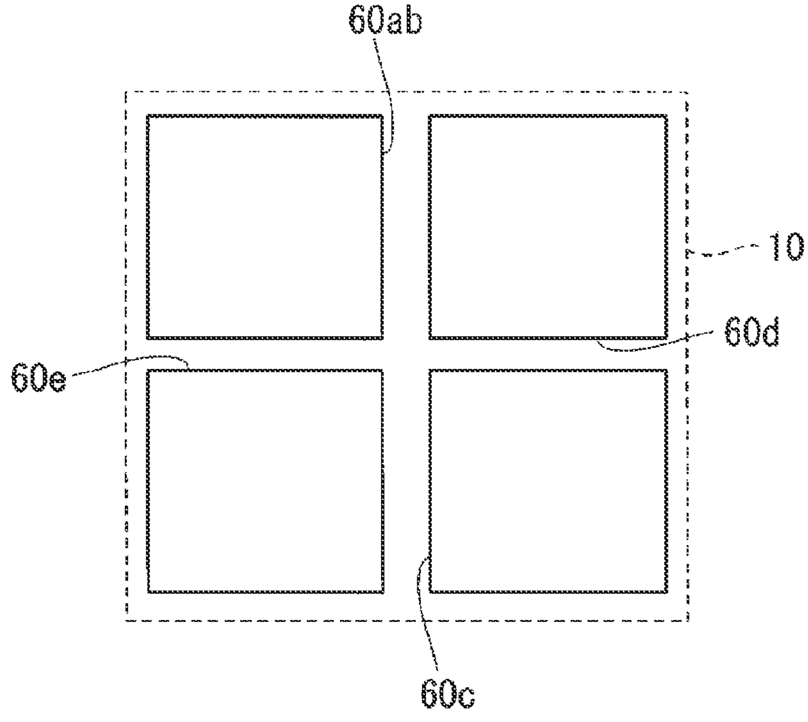
FIG. 19 is a plane view of a plurality of capacitive elements according to the second embodiment.

FIG. 15 is a circuit diagram of a first circuit configuration 98*ab* according to the second embodiment. A second circuit configuration 99*c*, a third circuit configuration 99*d*, and a fourth circuit configuration 99*e* of the second embodiment are substantially the same as those of the first embodiment. FIGS. 16 and 17 are cross-sectional views of an imaging element 100 according to the second embodiment, the views illustrating cross sections parallel to the thickness direction of the semiconductor substrate 1. FIG. 18 illustrates, in a plan view, the second pixel electrodes 13*b*, the third pixel electrodes 13*c*, the fourth pixel electrodes 13*d*, and the fifth pixel electrodes 13*e*. FIG. 19 illustrates, in a plan view, the first capacitive element 60*ab*, the second capacitive element 60*c*, the third capacitive element 60*d*, and the fourth capacitive element 60*e*. Specifically, FIG. 19 illustrates, in a plan view, the electrodes 61 of these capacitive elements 60*ab*, 60*c*, 60*d*, and 60*e*. Note that the imaging elements 100 according to the first embodiment and an imaging elements 100 according to a third embodiment may have a planar configuration illustrated in FIG. 19.

As illustrated in FIG. 16, in the second embodiment, the first photoelectric converter 12*a* is arranged in the semiconductor substrate 1. The first photoelectric converter 12*a* includes a photodiode 12*x* and a pinning region 12*y*. The photodiode 12*x* and the pinning region 12*y* are constituted by a diffusion region.

In the second embodiment, the imaging element 100 includes a first switching device 71 and a second switching device 72. The first photoelectric converter 12*a* and the first capacitive element 60*ab* are connected to each other with the first switching device 71 interposed therebetween. Thus, the first switching device 71 can be used to switch whether to allow first electric charge to flow from the first photoelectric converter 12*a* to the first capacitive element 60*ab*. Moreover, the second photoelectric converter 12*b* and the first capacitive element 60*ab* are connected to each other with the second switching device 72 interposed therebetween. Thus, the second switching device 72 can be used to switch whether to allow second electric charge to flow from the second photoelectric converter 12*b* to the first capacitive element 60*ab*.

In the second embodiment, the first switching device 71 and the second switching device 72 are MOSFETs. Note that these transistors may be transistors of different types from MOSFETs. Examples of the transistors include bipolar transistors.

Specifically, in the second embodiment, the first switching device 71 and the second switching device 72 are n-channel MOSFETs. Note that the first switching device 71 and the second switching device 72 may be p-channel MOSFETs.

In the second embodiment, the imaging element 100 has a first color filter 19*a* and a first condenser lens 21*a*. The wavelength region of light that the first color filter 19*a* allows to pass therethrough is the first wavelength region. The first wavelength region includes the wavelength region of infrared light.

Light passes through the first condenser lens 21*a* and the first color filter 19*a* in this order and is incident on the photodiode 12*x*. The photodiode 12*x* generates, upon receiving incident light, positive charge and negative charge. The photodiode 12*x* typically generates electron-hole pairs.

An accumulation control line, which is not illustrated, is connected to the anode of the photodiode 12*x*. When the imaging device 100A is in operation, a predetermined voltage is applied to the accumulation control line. By applying the predetermined voltage to the accumulation control line, one of positive charge or negative charge generated through photoelectric conversion is used as signal charge.

A well region 11, which contains impurities, is provided in the semiconductor substrate 1. The photodiode 12*x* is in contact with the well region 11. The pinning region 12*y* is in contact with the photodiode 12*x*. The pinning region 12*y* is positioned above the photodiode 12*x*.

The pinning region 12*y* is arranged between the photodiode 12*x* and the surface of the semiconductor substrate 1. As a result, a dark current that may be caused due to a defect at the interface between the photodiode 12*x* and the semiconductor substrate 1 is subjected to pinning. As a result, a dark current at the interface between the photodiode 12*x* and the semiconductor substrate 1 can be reduced.

One of the source or the drain of a switching transistor that constitutes the first switching device 71 is electrically connected to the photodiode 12*x*. Electric charge generated at the photodiode 12*x* passes through the source and the drain of the switching transistor that is the first switching device 71 and is transferred to the first capacitive element 60*ab*.

In the second embodiment, the photodiode 12*x* and one of the source or the drain of the switching transistor that is the first switching device 71 are directly electrically connected to each other. This configuration is advantageous in terms of reduction of a dark current. Moreover, this configuration is advantageous in terms of reduction of the sizes of pixels. This enables the size of the first photoelectric converter 12*a* and the dynamic range of the imaging device to be increased. Note that a transfer transistor may be interposed between the photodiode 12*x* and the one of the source or the drain of the switching transistor that is the first switching device 71.

It may be possible that neither a MIM structure nor a metal wiring line is provided at a position that is above the photodiode 12*x* and that overlaps the photodiode 12*x* in a plan view. In this manner, light can easily reach the photodiode 12*x*.

As described above, in the second embodiment, the first photoelectric converter 12*a* includes a photodiode. Note that, also in the second embodiment, the position of the first photoelectric converter 12*a* is different from the position of the second photoelectric converter 12*b* in the thickness direction of the semiconductor substrate 1. Thus, also in the present embodiment, the first photoelectric converter 12*a* and the second photoelectric converter 12*b* are arranged in different layers from each other.

As is understood from the description above, in the second embodiment, the wavelength region of light that the first color filter 19*a* allows to pass therethrough includes the wavelength region of infrared light, and the photodiode 12*x* converts infrared light into first electric charge. Note that the wavelength region of light that the first color filter 19*a* allows to pass therethrough may include the wavelength region of ultraviolet light, and the photodiode 12*x* may convert ultraviolet light into first electric charge.

In the second embodiment, the second color filter 19*b*, the third color filter 19*c*, the fourth color filter 19*d*, and the fifth color filter 19*e* constitute a Bayer filter. Moreover, in the second embodiment, the first switching device 71 and the second switching device 72 are provided. In the following, a merit of the imaging device 100A having both of the first and second switching devices will be described.

Since a Bayer filter is constituted, each unit pixel 10 includes the second pixel 10*b* and the third pixel 10*c*, which are two pixels that photoelectrically convert green light. In contrast, since the Bayer filter is constituted, the unit pixel 10 includes one fourth pixel 10*d*, which photoelectrically converts red light, and one fifth pixel 10*e*, which photoelectrically converts blue light. That is, in the matrix of the unit pixels 10, the number of pixels that photoelectrically convert green light is two times the number of pixels that photoelectrically convert red light and is two times the number of pixels that photoelectrically convert blue light. As a result, physiological characteristics of the human eye may be preferably modeled. This is because the human retina is the most sensitive to wavelengths of green light.

As described above, the first capacitive element 60*ab* is shared by the first pixel 10*a* and the second pixel 10*b*. In the unit pixel 10, the first pixel 10*a* is a pixel that photoelectrically converts infrared light. The second pixel 10*b* is one out of the two pixels that photoelectrically convert green light in the unit pixel 10. The first photoelectric converter 12*a* of the first pixel 10*a* is electrically connected to the first capacitive element 60*ab* with the first switching device 71 interposed therebetween. The second photoelectric converter 12*b* of the second pixel 10*b* is electrically connected to the first capacitive element 60*ab* with the second switching device 72 interposed therebetween. Thus, by operating the first switching device 71 and the second switching device 72, switching can be performed as to whether to allow electric charge corresponding to infrared light to flow from the first photoelectric converter 12*a* to the first capacitive element 60*ab* or electric charge corresponding to green light to flow from the second photoelectric converter 12*b* to the first capacitive element 60*ab*.

In a period in which the first switching device 71 is in the ON state, and the second switching device 72 is in the OFF state, electric charge corresponding not to green light but to infrared light may be allowed to flow from the first photoelectric converter 12*a* to the first capacitive element 60*ab*. Even in this period, electric charge corresponding to green light may be allowed to flow from the third photoelectric converter 12*c* to the second capacitive element 60*c*. Thus, information corresponding to infrared light and information corresponding to green light can be simultaneously acquired. By extension, information corresponding to infrared light and RGB information regarding red light, green light, and blue light can be simultaneously acquired.

Information corresponding to green light obtained in the above-described period in which the first switching device 71 is in the ON state, and the second switching device 72 is in the OFF state originates not from both of the second pixel 10*b* and the third pixel 10*c* but from only the third pixel 10*c*. Based on this, a third output signal SIGc, which originates from the third photoelectric converter 12*c*, may be amplified. The amplification factor of the third output signal SIGc is, for example, 2. In this manner, RGB information close to RGB information that the imaging device having the Bayer filter is supposed to acquire can be obtained.

As is understood from the description above, in the imaging device 100A, the plurality of unit pixels 10 are arranged in a matrix shape. Each unit pixel 10 has the first photoelectric converter 12*a*, the second photoelectric converter 12*b*, the first capacitive element 60*ab*, the third photoelectric converter 12*c*, and the second capacitive element 60*c*. The first photoelectric converter 12*a* photoelectrically converts infrared light or ultraviolet light. The second photoelectric converter 12*b* and the third photoelectric converter 12*c* photoelectrically convert the first color light. The first capacitive element 60*ab* accumulates the first electric charge generated through photoelectric conversion at the first photoelectric converter 12*a*. The first capacitive element 60*ab* accumulates the second electric charge generated through photoelectric conversion at the second photoelectric converter 12*b*. The second capacitive element 60*c* accumulates the third electric charge generated through photoelectric conversion at the third photoelectric converter 12*c*. With such a configuration, electric charge corresponding to infrared light or ultraviolet light and electric charge corresponding to the first color light can be accumulated in the first capacitive element 60*ab* and the second capacitive element 60*c*, respectively, in the same period. This enables information based on infrared light or ultraviolet light and information based on the first color light to be read out from the unit pixel 10 at the same timing.

Specifically, each unit pixel 10 further has the fourth photoelectric converter 12*d*, the fifth photoelectric converter 12*e*, the third capacitive element 60*d*, the fourth capacitive element 60*e*, the first switching device 71, and the second switching device 72. The fourth photoelectric converter 12*d* photoelectrically converts the second color light. The fifth photoelectric converter 12*e* photoelectrically converts the third color light. The third capacitive element 60*d* accumulates the fourth electric charge generated through photoelectric conversion at the fourth photoelectric converter 12*d*. The fourth capacitive element 60*e* accumulates the fifth electric charge generated through photoelectric conversion at the fifth photoelectric converter 12*e*. Whether to allow the second photoelectric converter 12*b*, the third photoelectric converter 12*c*, the fourth photoelectric converter 12*d*, and the fifth photoelectric converter 12*e* to be sensitive to light is controlled in a collective manner. The first photoelectric converter 12*a* and the first capacitive element 60*ab* are connected to each other with the first switching device 71 interposed therebetween. The second photoelectric converter 12*b* and the first capacitive element 60*ab* are connected to each other with the second switching device 72 interposed therebetween. With such a configuration, electric charge corresponding to infrared light or ultraviolet light, electric charge corresponding to the first color light, electric charge corresponding to the second color light, and electric charge corresponding to the third color light can be accumulated in the first capacitive element 60*ab*, the second capacitive element 60*c*, the third capacitive element 60*d*, and the fourth capacitive element 60*e*, respectively, in the same period. The first capacitive element 60*ab*, the second capacitive element 60*c*, the third capacitive element 60*d*, and the fourth capacitive element 60*e* are different from each other. This enables information based on infrared light or ultraviolet light, information based on the first color light, information based on the second color light, and information based on the third color light to be read out from the unit pixel 10 at the same timing.

In the second embodiment, the same potential is applied to the second photoelectric converter 12*b*, the third photoelectric converter 12*c*, the fourth photoelectric converter 12*d*, and the fifth photoelectric converter 12*e*. As a result, whether to allow these photoelectric converters to be sensitive to light is controlled in a collective manner. Specifically, the potential of the single integrated electrode constituted by the second counter electrode 17*b*, the third counter electrode 17*c*, the fourth counter electrode 17*d*, and the fifth counter electrode 17*e* is controlled. As a result, whether to allow the second photoelectric converter 12*b*, the third photoelectric converter 12*c*, the fourth photoelectric converter 12*d*, and the fifth photoelectric converter 12*e* to be sensitive to light is controlled in a collective manner.

In a case where the first electric charge is read out from the first capacitive element 60*ab*, the third electric charge read out from the second capacitive element 60*c* may be amplified. The amplification factor of the third electric charge is, for example, 2.

As is understood from the description above, in the second embodiment, the first wavelength region includes the wavelength region of infrared light. In the second embodiment, the first wavelength region may include not the wavelength region of infrared light but the wavelength region of ultraviolet light. In the second embodiment, the second wavelength region and the third wavelength region include the wavelength region of the first color light. The fourth wavelength region includes the wavelength region of the second color light. The fifth wavelength region includes the wavelength region of the third color light.

In the second embodiment, a first state, a second state, and a third state can be switched.

In the first state, the first switching device 71 is OFF, and the predetermined voltage is not applied from the accumulation control line to the photodiode 12*x*. In contrast, the second switching device 72 is ON, and a predetermined voltage is applied to the single integrated electrode constituted by the second counter electrode 17*b*, the third counter electrode 17*c*, the fourth counter electrode 17*d*, and the fifth counter electrode 17*e*. Thus, IR information that originates from the first photoelectric converter 12*a* is not obtained, whereas RGGB information that originates from the second photoelectric converter 12*b*, the third photoelectric converter 12*c*, the fourth photoelectric converter 12*d*, and the fifth photoelectric converter 12*e* is obtained.

In the second state, the first switching device 71 is ON, and the predetermined voltage is applied from the accumulation control line to the photodiode 12*x*. In contrast, the second switching device 72 is OFF, and the predetermined voltage is not applied to the single integrated electrode constituted by the second counter electrode 17*b*, the third counter electrode 17*c*, the fourth counter electrode 17*d*, and the fifth counter electrode 17*e*. Thus, IR information that originates from the first photoelectric converter 12*a* is obtained, whereas RGGB information that originates from the second photoelectric converter 12*b*, the third photoelectric converter 12*c*, the fourth photoelectric converter 12*d*, and the fifth photoelectric converter 12*e* is not obtained.

In the third state, the first switching device 71 is ON, and the predetermined voltage is applied from the accumulation control line to the photodiode 12*x*. The second switching device 72 is OFF, and the predetermined voltage is applied to the single integrated electrode constituted by the second counter electrode 17*b*, the third counter electrode 17*c*, the fourth counter electrode 17*d*, and the fifth counter electrode 17*e*. Thus, IR information that originates from the first photoelectric converter 12*a* and RGB information that originates from the third photoelectric converter 12*c*, the fourth photoelectric converter 12*d*, and the fifth photoelectric converter 12*e* are obtained, whereas G information that originates from the second photoelectric converter 12*b* is not obtained.

Third Embodiment

In the following, an imaging device 100A according to a third embodiment will be described.

Figure 20:
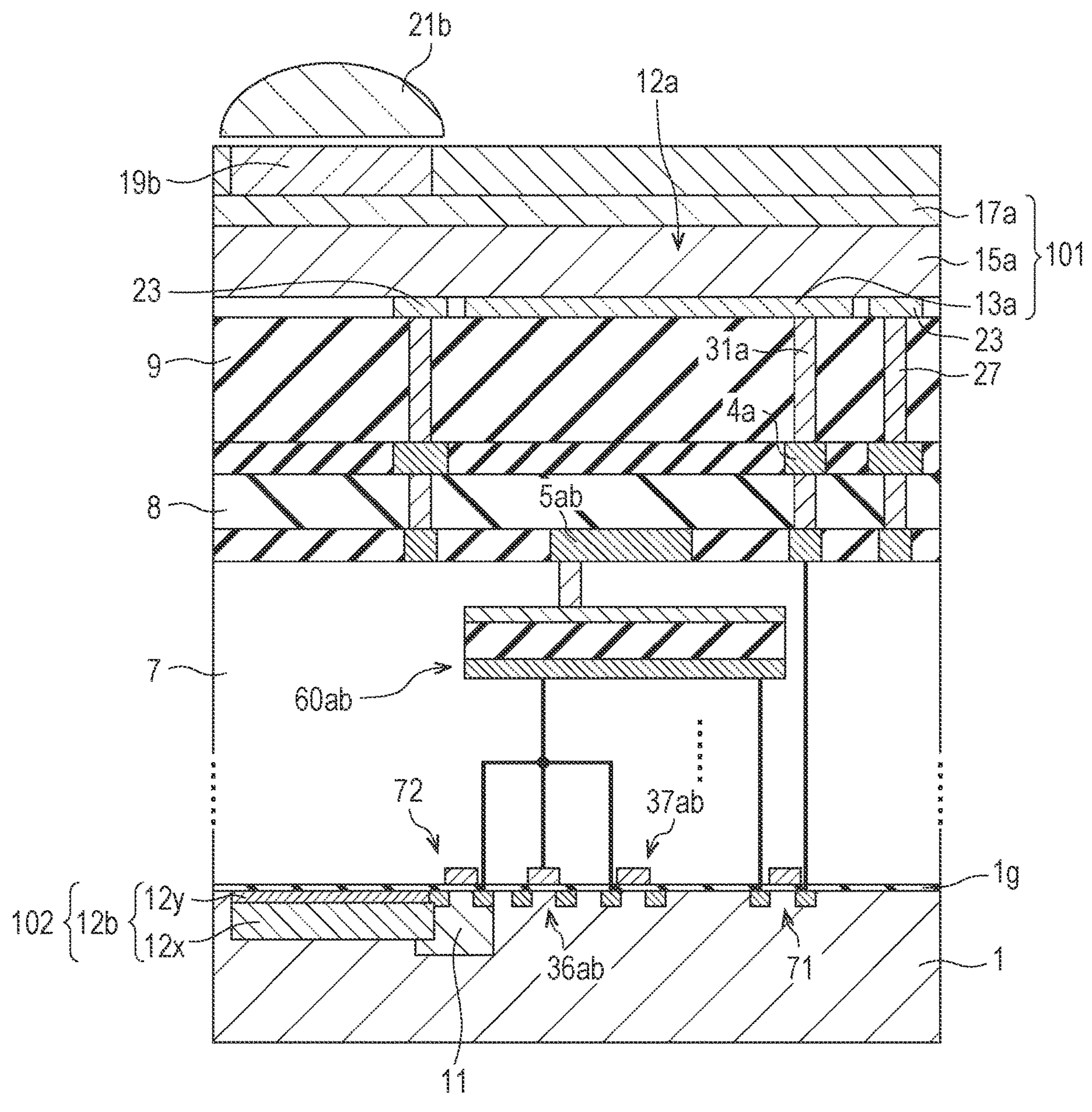
FIG. 20 is a cross-sectional view of an imaging element according to a third embodiment.
Figure 21:
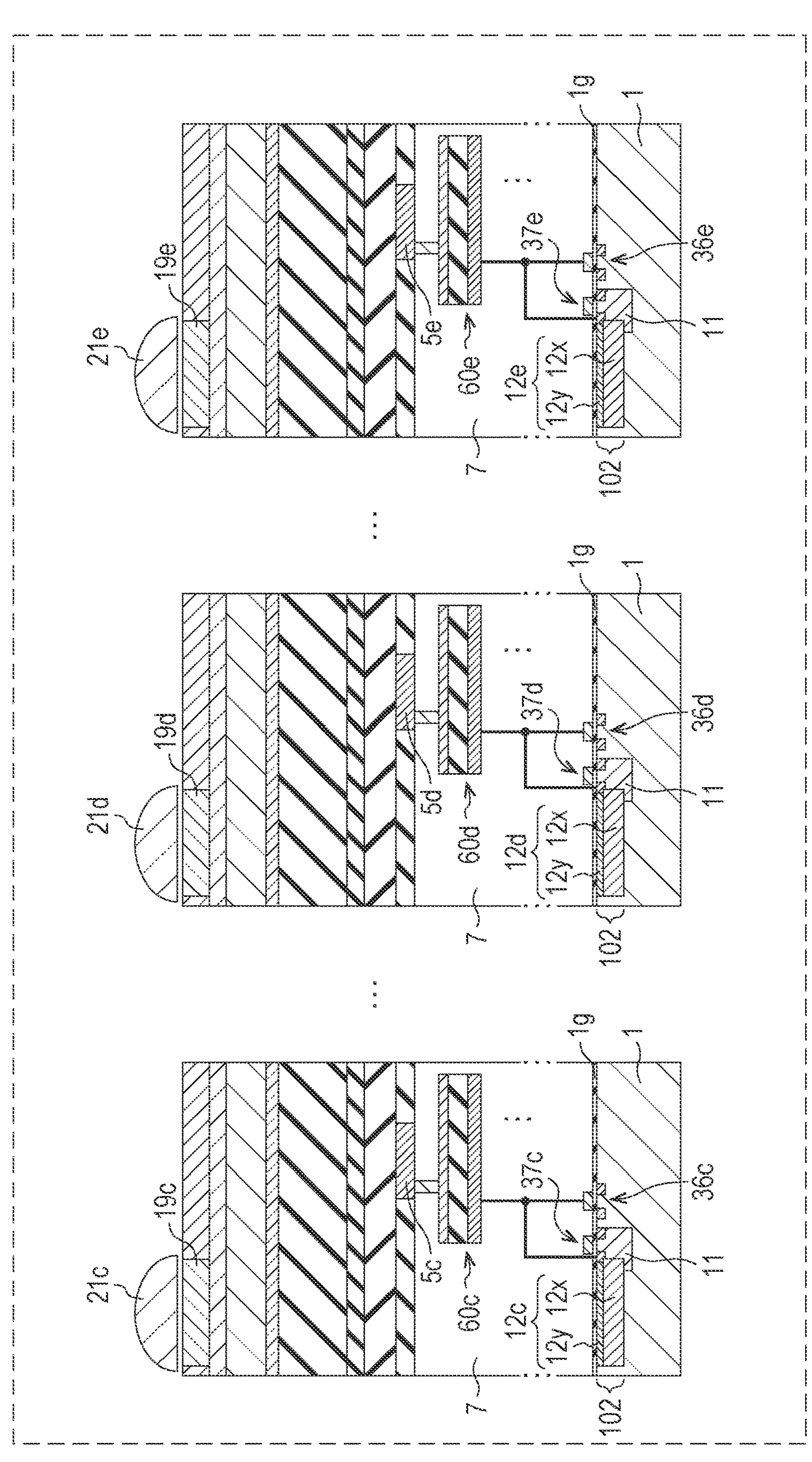
FIG. 21 is a cross-sectional view of the imaging element according to the third embodiment.

FIGS. 20 and 21 are cross-sectional views of an imaging element 100 according to the third embodiment, the views illustrating cross sections parallel to the thickness direction of the semiconductor substrate 1. In FIG. 21, illustration of various elements is omitted.

In the third embodiment, the first wavelength region includes the wavelength region of ultraviolet light. The first photoelectric converter 12*a* has the first pixel electrode 13*a*, the first counter electrode 17*a*, and the first photoelectric conversion layer 15*a*. The first photoelectric conversion layer 15*a* converts light of the first wavelength region into first electric charge. The first electric charge generated in this manner is collected by the first pixel electrode 13*a*.

The first photoelectric converter 12*a*, more specifically the first pixel electrode 13*a*, is connected to the first capacitive element 60*ab* with the first switching device 71 interposed therebetween. The first electric charge collected by the first pixel electrode 13*a* may be transferred to the first capacitive element 60*ab* via the first switching device 71.

Similarly to as in the first embodiment and the second embodiment, the second wavelength region includes the wavelength region of visible light. Specifically, the second wavelength region includes the wavelength region of the first color light. More specifically, the first color light is green light. The imaging element 100 has the second color filter 19*b* and the second condenser lens 21*b*. The second photoelectric converter 12*b* is arranged in the semiconductor substrate 1. The second photoelectric converter 12*b* includes a photodiode 12*x* and a pinning region 12*y*. The wavelength region of light that the second color filter 19*b* allows to pass therethrough is the second wavelength region. Light passes through the second condenser lens 21*b* and the second color filter 19*b* in this order and is incident on the photodiode 12*x* of the second photoelectric converter 12*b*. The photodiode 12*x* converts incident light into second electric charge.

Similarly to as in the first embodiment and the second embodiment, the third wavelength region includes the wavelength region of visible light. Specifically, the third wavelength region includes the wavelength region of the first color light. More specifically, the first color light is green light. The imaging element 100 has the third color filter 19*c* and the third condenser lens 21*c*. The third photoelectric converter 12*c* is arranged in the semiconductor substrate 1. The third photoelectric converter 12*c* includes a photodiode 12*x* and a pinning region 12*y*. The wavelength region of light that the third color filter 19*c* allows to pass therethrough is the third wavelength region. Light passes through the third condenser lens 21*c* and the third color filter 19*c* in this order and is incident on the photodiode 12*x* of the third photoelectric converter 12*c*. The photodiode 12*x* converts incident light into third electric charge.

Similarly to as in the first embodiment and the second embodiment, the fourth wavelength region includes the wavelength region of visible light. Specifically, the fourth wavelength region includes the wavelength region of the second color light. More specifically, the second color light is red light. The imaging element 100 has the fourth color filter 19*d* and the fourth condenser lens 21*d*. The fourth photoelectric converter 12*d* is arranged in the semiconductor substrate 1. The fourth photoelectric converter 12*d* includes a photodiode 12*x* and a pinning region 12*y*. The wavelength region of light that the fourth color filter 19*d* allows to pass therethrough is the fourth wavelength region. Light passes through the fourth condenser lens 21*d* and the fourth color filter 19*d* in this order and is incident on the photodiode 12*x* of the fourth photoelectric converter 12*d*. The photodiode 12*x* converts incident light into fourth electric charge.

Similarly to as in the first embodiment and the second embodiment, the fifth wavelength region includes the wavelength region of visible light. Specifically, the fifth wavelength region includes the wavelength region of the third color light. More specifically, the third color light is blue light. The imaging element 100 has the fifth color filter 19*e* and the fifth condenser lens 21*e*. The fifth photoelectric converter 12*e* is arranged in the semiconductor substrate 1. The fifth photoelectric converter 12*e* includes a photodiode 12*x* and a pinning region 12*y*. The wavelength region of light that the fifth color filter 19*e* allows to pass therethrough is the fifth wavelength region. Light passes through the fifth condenser lens 21*e* and the fifth color filter 19*e* in this order and is incident on the photodiode 12*x* of the fifth photoelectric converter 12*e*. The photodiode 12*x* converts incident light into fifth electric charge.

One of the source or the drain of a switching transistor that constitutes the second switching device 72 is electrically connected to the photodiode 12*x* of the second photoelectric converter 12*b*. The second electric charge generated at the photodiode 12*x* passes through the source and the drain of the switching transistor that constitutes the second switching device 72 and is transferred to the first capacitive element 60*ab*.

In the third embodiment, the photodiode 12*x* of the second photoelectric converter 12*b* and the one of the source or the drain of the switching transistor that constitutes the second switching device 72 are directly electrically connected to each other. Note that a transfer transistor may be interposed between the photodiode 12*x* and the one of the source or the drain of the switching transistor that constitutes the second switching device 72. It may be possible that neither a MIM structure nor a metal wiring line is provided at a position that is above the photodiode 12*x* and that overlaps the photodiode 12*x* in a plan view.

One of the source or the drain of the second reset transistor 37*c* is electrically connected to the photodiode 12*x* of the third photoelectric converter 12*c*. Electric charge generated at the photodiode 12*x* passes through the one of the source or the drain of the second reset transistor 37*c* and is transferred to the second capacitive element 60*c*. The photodiode 12*x* and the one of the source or the drain of the second reset transistor 37*c* are directly electrically connected to each other. Note that a transfer transistor may be interposed between the photodiode 12*x* and the one of the source or the drain of the second reset transistor 37*c*. It may be possible that neither a MIM structure nor a metal wiring line is provided at a position that is above the photodiode 12*x* and that overlaps the photodiode 12*x* in a plan view. Description can also be valid that is obtained by changing, in these descriptions, an ordinal numeral of "third" to "fourth" and an ordinal numeral of "second" to "third" and changing "c" to "d" at the ends of the reference numerals. Description can also be valid that is obtained by changing, in these descriptions, an ordinal numeral of "third" to "fifth" and an ordinal numeral of "second" to "fourth" and changing "c" to "e" at the ends of the reference numerals.

In the third embodiment, the second layer 102 is arranged between the semiconductor substrate 1 and the first layer 101. The first layer 101 is stacked above the second layer 102.

Similarly to as in the embodiments described above, out of the first photoelectric converter 12*a* and the second photoelectric converter 12*b*, the photoelectric converter closer to the light receiving surface is defined as a proximal photoelectric converter, and the photoelectric converter farther from the light receiving surface is defined as a distal photoelectric converter. In this case, even in the third embodiment, the central wavelength of the wavelength region of light that the proximal photoelectric converter photoelectrically converts is shorter than the central wavelength of the wavelength region of light that the distal photoelectric converter photoelectrically converts.

As is understood from the description above, in the third embodiment, the first photoelectric converter 12*a* is arranged closer to the light receiving surface than the second photoelectric converter 12*b*, the third photoelectric converter 12*c*, the fourth photoelectric converter 12*d*, and the fifth photoelectric converter 12*e* are. Note that the second photoelectric converter 12*b*, the third photoelectric converter 12*c*, the fourth photoelectric converter 12*d*, and the fifth photoelectric converter 12*e* may be arranged closer to the light receiving surface than the first photoelectric converter 12*a* is.

In the third embodiment, the second color filter 19*b*, the third color filter 19*c*, the fourth color filter 19*d*, and the fifth color filter 19*e* and the second condenser lens 21*b*, the third condenser lens 21*c*, the fourth condenser lens 21*d*, and the fifth condenser lens 21*e* are composed of materials that allow ultraviolet light to pass therethrough. Examples of such materials are organic materials.

In the third embodiment, a first state, a second state, and a third state are realized in different forms from those of the second embodiment.

In the first state, the first switching device 71 is OFF, and a predetermined voltage is not applied to the first counter electrode 17*a*. In contrast, the second switching device 72 is ON, and a predetermined voltage is applied to the individual photodiodes 12*x* of the second photoelectric converter 12*b*, the third photoelectric converter 12*c*, the fourth photoelectric converter 12*d*, and the fifth photoelectric converter 12*e* from the corresponding accumulation control lines. Thus, UV information that originates from the first photoelectric converter 12*a* is not obtained, whereas RGGB information that originates from the second photoelectric converter 12*b*, the third photoelectric converter 12*c*, the fourth photoelectric converter 12*d*, and the fifth photoelectric converter 12*e* is obtained. In this case, UV stands for ultraviolet light.

In the second state, the first switching device 71 is ON, and the predetermined voltage is applied to the first counter electrode 17*a*. In contrast, the second switching device 72 is OFF, and the predetermined voltage is not applied to the individual photodiodes 12*x* of the second photoelectric converter 12*b*, the third photoelectric converter 12*c*, the fourth photoelectric converter 12*d*, and the fifth photoelectric converter 12*e* from the corresponding accumulation control lines. Thus, UV information that originates from the first photoelectric converter 12*a* is obtained, whereas RGGB information that originates from the second photoelectric converter 12*b*, the third photoelectric converter 12*c*, the fourth photoelectric converter 12*d*, and the fifth photoelectric converter 12*e* is not obtained.

In the third state, the first switching device 71 is ON, and the predetermined voltage is applied to the first counter electrode 17*a*. The second switching device 72 is OFF, and the predetermined voltage is applied to the individual photodiodes 12*x* of the second photoelectric converter 12*b*, the third photoelectric converter 12*c*, the fourth photoelectric converter 12*d*, and the fifth photoelectric converter 12*e* from the corresponding accumulation control lines. Thus, UV information that originates from the first photoelectric converter 12*a* and RGB information that originates from the third photoelectric converter 12*c*, the fourth photoelectric converter 12*d*, and the fifth photoelectric converter 12*e* are obtained, whereas G information that originates from the second photoelectric converter 12*b* is not obtained.

According to the third embodiment, an ultraviolet light sensor can be realized that preferably visualizes the distribution of intensity of ultraviolet light. Furthermore, imaging information based on visible light can also be obtained without parallax with respect to this ultraviolet light information. As a result, map information can be obtained in which the intensity of ultraviolet light is combined with information regarding objects that can be visually confirmed.

In the following, effects of the present embodiment will be further described. Hydrogen is attracting attention as an alternative energy source to petroleum. However, there is concern about hydrogen leakage and so forth. Specifically, hydrogen combustion flame is invisible, and thus it is difficult to grasp the state of hydrogen combustion flame. Thus, use of hydrogen as an energy source has not sufficiently progressed. Hydrogen combustion flame can be made visible by an ultraviolet camera, which is sensitive to ultraviolet light. However, only by using an ultraviolet camera, the place where hydrogen combustion flame is present cannot be identified. In this regard, according to the technology according to the present embodiment, a surveillance camera can be realized that can output a synthetic image obtained by combining an image of hydrogen combustion flame based on ultraviolet light and an image based on visible light. With such a surveillance camera, the place where hydrogen combustion flame is present can be easily identified. Specifically, with such a surveillance camera, in a case where there is a hydrogen fire at a hydrogen station or the like, an operator can fight the fire safely and reliably while checking, for example, the shape and size of the combustion flame.

Embodiment of Camera System

Figure 22:
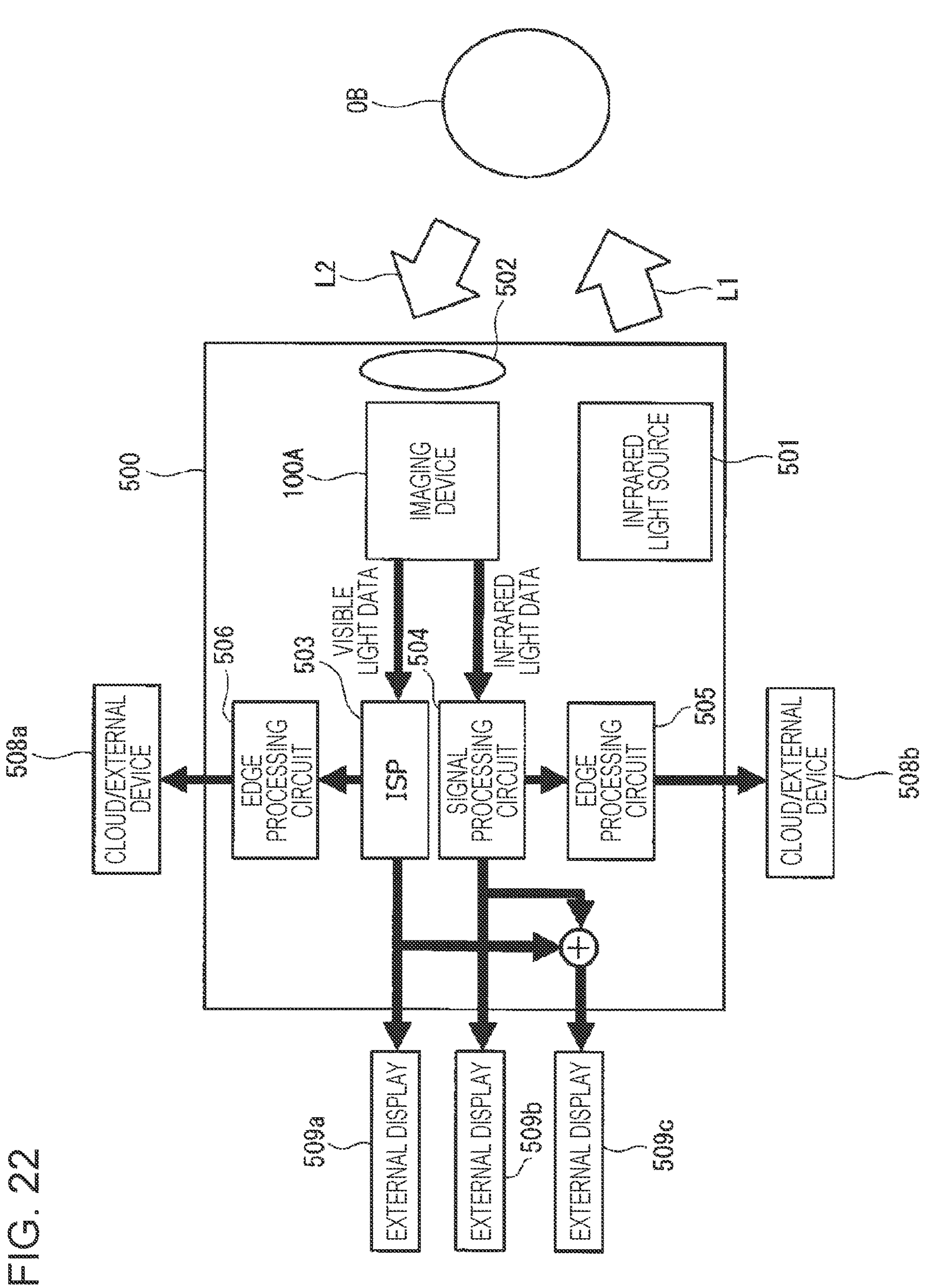
FIG. 22 is a block diagram illustrating the configuration of a camera system.

FIG. 22 illustrates the configuration of a camera system 500. The camera system 500 includes an imaging device 100A, an infrared light source 501, a lens 502, an image signal processor (ISP) 503, a signal processing circuit 504, an edge processing circuit 505, and an edge processing circuit 506. The camera system 500 is configured to process data obtained by the imaging device 100A and output the data to the outside. As the imaging device 100A, any one of the imaging devices that have been described in the first to third embodiments can be used.

Infrared light L1 is emitted from the infrared light source 501 toward an object OB. The imaging device 100A receives light L2 from the object OB through the lens 502. The imaging device 100A outputs data based on visible light and data based on infrared light through two channels. The data based on visible light is processed by the ISP 503. As a result, a full-color image is obtained. The full-color image is transferred to an external display 509*a* and is displayed. The full-color image is processed by the edge processing circuit 506 and is thereafter transferred to a cloud/external device 508*a*. In this case, a cloud/external device refers to at least one of an external device or the cloud. In other words, the cloud/external device refers to the external device, the cloud, both of the external device and the cloud. The data based on infrared light is processed by the signal processing circuit 504. As a result, an image based on infrared light is obtained. The signal processing circuit 504 may be configured to calculate, for example, the distance to the object from the data based on infrared light. The image based on infrared light is transferred to an external display 509*b* and is displayed. The image based on infrared light is processed by the edge processing circuit 505 and is thereafter transferred to a cloud/external device 508*b*. It is also possible to combine the full-color image with the image based on infrared light and display the resulting image on an external display 509*c*.

Instead of the infrared light source 501 or together with the infrared light source 501, an ultraviolet light source may be used. In this case, instead of image data based on infrared light or together with the image data based on infrared light, image data based on ultraviolet light can be obtained.

Various changes may be made to the first to third embodiments and the embodiment of the camera system.

Figure 23:
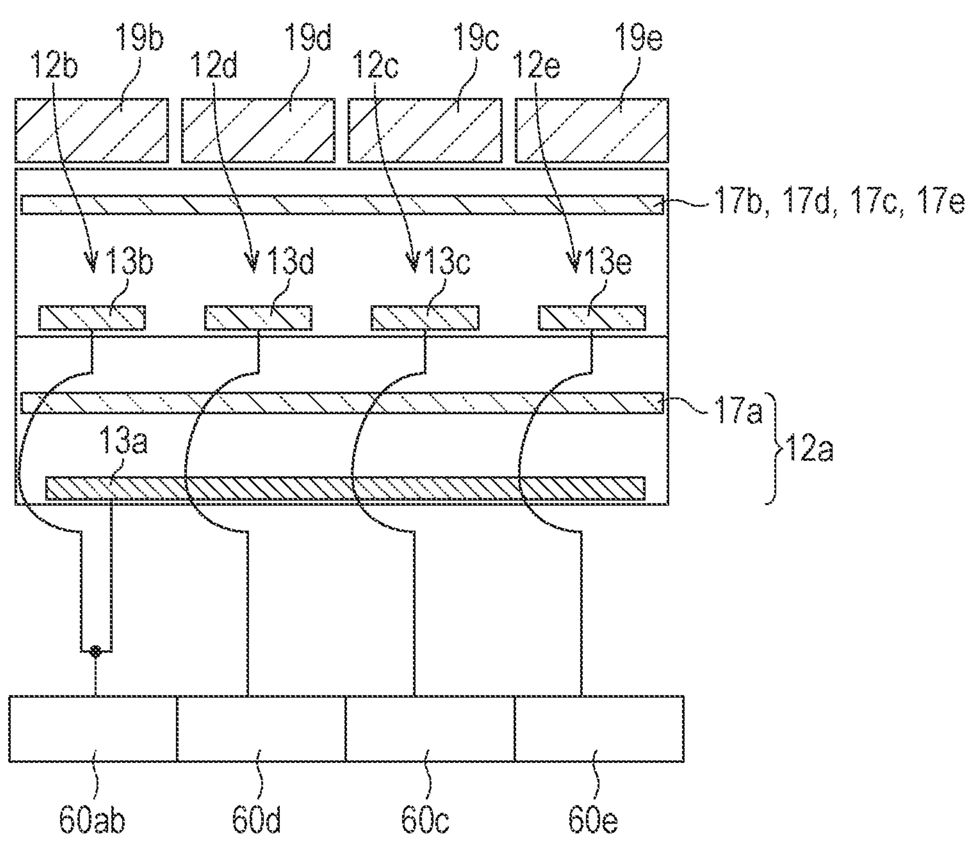
FIG. 23 is a schematic diagram of the imaging device according to the first embodiment.

FIG. 23 illustrates a schematic diagram of the imaging device according to the first embodiment. In the first embodiment, resolution regarding infrared light is lower than resolution regarding RGB, that is, red light, green light, and blue light. In FIG. 23, illustration of the photoelectric conversion layers, condenser lenses, and so forth is omitted. In this regard, the same applies to FIGS. 24 to 26.

Figure 24:
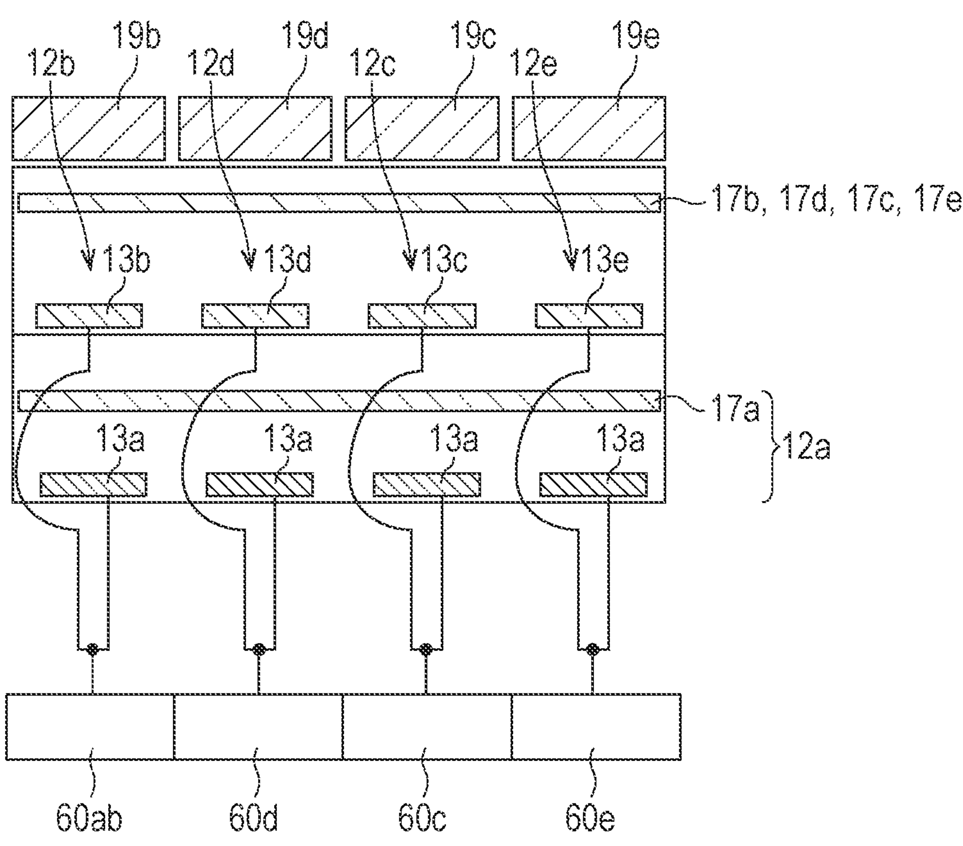
FIG. 24 is a schematic diagram of an imaging device according to a first modification.

FIG. 24 illustrates a schematic diagram of an imaging device according to a first modification obtained by modifying the first embodiment. In the example illustrated in FIG. 24, in the unit pixel 10, one first photoelectric converter 12*a* has four first pixel electrodes 13*a*. A first first pixel electrode 13*a* and the second pixel electrode 13*b* are electrically connected to the first capacitive element 60*ab*. A second first pixel electrode 13*a* and the third pixel electrode 13*c* are electrically connected to the second capacitive element 60*c*. A third first pixel electrode 13*a* and the fourth pixel electrode 13*d* are electrically connected to the third capacitive element 60*d*. A fourth first pixel electrode 13*a* and the fifth pixel electrode 13*e* are electrically connected to the fourth capacitive element 60*e*. According to the example illustrated in FIG. 24, the resolution regarding infrared light can be made equal to the resolution regarding RGB.

Figure 25:
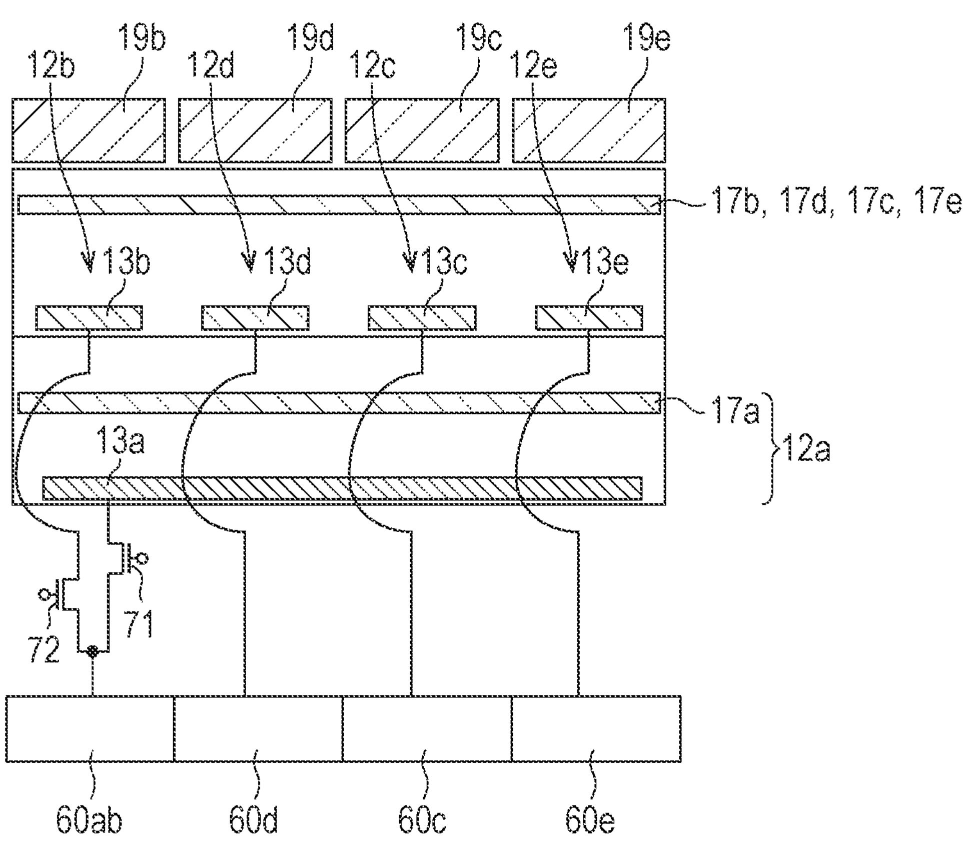
FIG. 25 is a schematic diagram of an imaging device according to a second modification.

The first photoelectric converter 12*a* of the second embodiment may be changed to the photoelectric converter 12 illustrated in FIG. 6. FIG. 25 illustrates a schematic diagram of an imaging device according to a second modification, in which the photoelectric converter 12 illustrated in FIG. 6 is used. In the example illustrated in FIG. 25, the resolution regarding infrared light is lower than the resolution regarding RGB, that is, red light, green light, and blue light.

In the second embodiment described above, the predetermined voltage is not applied to the photodiode 12*x* from the accumulation control line in the first state, and the predetermined voltage is applied to the photodiode 12*x* from the accumulation control line in the second state and the third state. In contrast, in the second modification, a predetermined voltage is not applied to the first counter electrode 17*a* in the first state, and the predetermined voltage is applied to the first counter electrode 17*a* in the second state and the third state.

Figure 26:
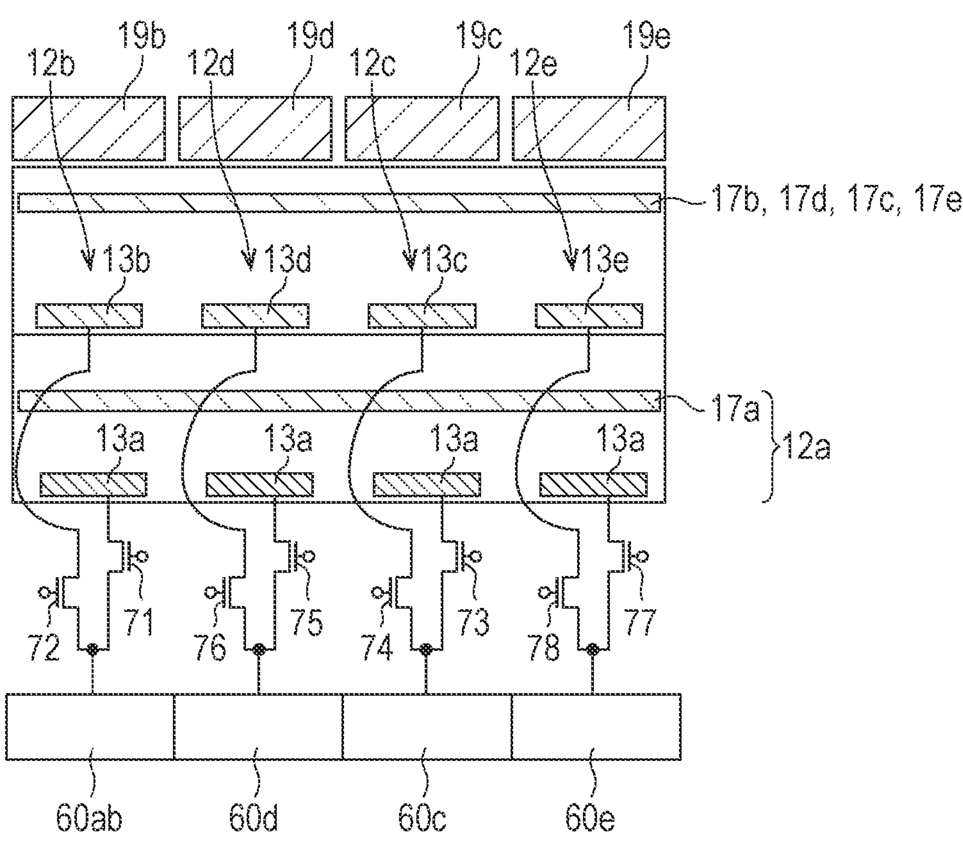
FIG. 26 is a schematic diagram of an imaging device according to a third modification.

FIG. 26 illustrates a schematic diagram of an imaging device according to a third modification. In the third modification, the second modification is further modified. Specifically, in the example illustrated in FIG. 26, in the unit pixel 10, one first photoelectric converter 12*a* has four first pixel electrodes 13*a*. The first first pixel electrode 13*a* is connected to the first capacitive element 60*ab* with the first switching device 71 interposed therebetween. The second pixel electrode 13*b* is connected to the first capacitive element 60*ab* with the second switching device 72 interposed therebetween. The second first pixel electrode 13*a* is connected to the second capacitive element 60*c* with a third switching device 73 interposed therebetween. The third pixel electrode 13*c* is connected to the second capacitive element 60*c* with a fourth switching device 74 interposed therebetween. The third first pixel electrode 13*a* is connected to the third capacitive element 60*d* with a fifth switching device 75 interposed therebetween. The fourth pixel electrode 13*d* is connected to the third capacitive element 60*d* with a sixth switching device 76 interposed therebetween. The fourth first pixel electrode 13*a* is connected to the fourth capacitive element 60*e* with a seventh switching device 77 interposed therebetween. The fifth pixel electrode 13*e* is connected to the fourth capacitive element 60*e* with an eighth switching device 78 interposed therebetween. According to the example illustrated in FIG. 26, the resolution regarding infrared light can be made equal to the resolution regarding RGB. The first to eighth switching devices 71 to 78 are, for example, MOSFETs, bipolar transistors, or the like. The MOSFETs may be n-channel MOSFETs or p-channel MOSFETs.

In the second embodiment and the second modification described above, the first switching device 71 is OFF, and the second switching device 72 is ON in the first state. In the second state and the third state, the first switching device 71 is ON, and the second switching device 72 is OFF. In contrast, in the third modification, in the first state, the first switching device 71, the third switching device 73, the fifth switching device 75, and the seventh switching device 77 are OFF, and the second switching device 72, the fourth switching device 74, the sixth switching device 76, and the eighth switching device 78 are ON. In the second state, the first switching device 71, the third switching device 73, the fifth switching device 75, and the seventh switching device 77 are ON, and the second switching device 72, the fourth switching device 74, the sixth switching device 76, and the eighth switching device 78 are OFF. In the third state, the first switching device 71, the fourth switching device 74, the sixth switching device 76, and the eighth switching device 78 are ON, and the second switching device 72, the third switching device 73, the fifth switching device 75, and the seventh switching device 77 are OFF.

In the first embodiment, the second embodiment, the first modification, the second modification, and the third modification, the second color filter 19*b* may be omitted, and a photoelectric conversion layer that is sensitive to light of the second wavelength region may be used as the second photoelectric conversion layer 15*b*. The third color filter 19*c* may be omitted, and a photoelectric conversion layer that is sensitive to light of the third wavelength region may be used as the third photoelectric conversion layer 15*c*. The fourth color filter 19*d* may be omitted, and a photoelectric conversion layer that is sensitive to light of the fourth wavelength region may be used as the fourth photoelectric conversion layer 15*d*. The fifth color filter 19*e* may be omitted, and a photoelectric conversion layer that is sensitive to light of the fifth wavelength region may be used as the fifth photoelectric conversion layer 15*e*.

In the first embodiment, the third embodiment, the first modification, the second modification, and the third modification, a color filter may be added that allows light of the first wavelength region to pass therethrough, and light may be incident, via the color filter, on the first photoelectric conversion layer 15*a*.

In the second embodiment, the first color filter 19*a* may be omitted, and a photodiode that is sensitive to light of the first wavelength region may be used as the photodiode 12*x* of the first photoelectric converter 12*a*.

In the third embodiment, the second color filter 19*b* may be omitted, and a photodiode that is sensitive to light of the second wavelength region may be used as the photodiode 12*x* of the second photoelectric converter 12*b*. The third color filter 19*c* may be omitted, and a photodiode that is sensitive to light of the third wavelength region may be used as the photodiode 12*x* of the third photoelectric converter 12*c*. The fourth color filter 19*d* may be omitted, and a photodiode that is sensitive to light of the fourth wavelength region may be used as the photodiode 12*x* of the fourth photoelectric converter 12*d*. The fifth color filter 19*e* may be omitted, and a photodiode that is sensitive to light of the fifth wavelength region may be used as the photodiode 12*x* of the fifth photoelectric converter 12*e*.

In the first embodiment, the second embodiment, the first modification, the second modification, and the third modification, the first wavelength region may include the wavelength region of ultraviolet light. In the third embodiment, the first wavelength region may include the wavelength region of infrared light.

The technologies disclosed herein are useful for imaging elements. The imaging elements may be used in imaging devices, optical sensors, and so forth. Examples of the imaging devices include camera systems such as digital still cameras, medical cameras, surveillance cameras, vehicle-mounted cameras, digital single-lens reflex cameras, and digital mirrorless interchangeable-lens cameras.

What is claimed is:

1. An imaging device comprising:

a first photoelectric converter that converts light having a wavelength in a first wavelength region into first electric charge;

a second photoelectric converter that is arranged at a different height from the first photoelectric converter in a thickness direction of the imaging device and that converts light having a wavelength in a second wavelength region into second electric charge; and a single first capacitive element that accumulates the first electric charge and the second electric charge.

2. The imaging device according to claim 1, wherein the first capacitive element has a metal-insulator-metal structure.

3. The imaging device according to claim 1, further comprising:

a first switching device, wherein the first photoelectric converter and the first capacitive element are connected to each other via the first switching device.

4. The imaging device according to claim 1, wherein the first photoelectric converter and the first capacitive element are connected to each other without a switching device between the first photoelectric converter and the first capacitive element.

5. The imaging device according to claim 1, further comprising:

a second switching device, wherein the second photoelectric converter and the first capacitive element are connected to each other via the second switching device.

6. The imaging device according to claim 1, wherein the second photoelectric converter and the first capacitive element are connected to each other without a switching device between the second photoelectric converter and the first capacitive element.

7. The imaging device according to claim 1, wherein the first photoelectric converter includes a first photoelectric conversion layer that generates the first electric charge, the first photoelectric converter includes a first pixel electrode that collects the first electric charge, the second photoelectric converter includes a second photoelectric conversion layer that generates the second electric charge, and the second photoelectric converter includes a second pixel electrode that collects the second electric charge.

8. The imaging device according to claim 7, wherein, in a plan view, the first pixel electrode has a larger area than the second pixel electrode.

9. The imaging device according to claim 7, wherein the first photoelectric converter further includes a first counter electrode, the first photoelectric conversion layer is arranged between the first counter electrode and the first pixel electrode, the second photoelectric converter further includes a second counter electrode, the second photoelectric conversion layer is arranged between the second counter electrode and the second pixel electrode, and the first counter electrode and the second counter electrode are electrically separated from each other.

10. The imaging device according to claim 1, wherein in a case where, out of the first photoelectric converter and the second photoelectric converter, a photoelectric converter closer to a light receiving surface of the imaging device is defined as a proximal photoelectric converter, and a photoelectric converter farther from the light receiving surface is defined as a distal photoelectric converter, a central wavelength of a wavelength region of light that the proximal photoelectric converter photoelectrically converts is shorter than a central wavelength of a wavelength region of light that the distal photoelectric converter photoelectrically converts.

11. The imaging device according to claim 1, wherein the first wavelength region includes a wavelength region of infrared light.

12. The imaging device according to claim 1, wherein the first wavelength region includes a wavelength region of ultraviolet light.

13. The imaging device according to claim 1, wherein the second wavelength region includes a wavelength region of visible light.

14. The imaging device according to claim 1, further comprising:

a plurality of unit pixels arranged in a matrix shape, wherein each of the plurality of unit pixels includes the first photoelectric converter, the second photoelectric converter, the first capacitive element, a third photoelectric converter, and a second capacitive element, the first wavelength region includes a wavelength region of infrared light or ultraviolet light, the second wavelength region includes a wavelength region of first color light, the third photoelectric converter converts the first color light into third electric charge, and the second capacitive element accumulates the third electric charge.

15. The imaging device according to claim 14, wherein each of the plurality of unit pixels further includes a fourth photoelectric converter, a fifth photoelectric converter, a third capacitive element, a fourth capacitive element, a first switching device, and a second switching device, wherein the fourth photoelectric converter converts second color light into fourth electric charge, the fifth photoelectric converter converts third color light into fifth electric charge, the third capacitive element accumulates the fourth electric charge, the fourth capacitive element accumulates the fifth electric charge, the second photoelectric converter, the third photoelectric converter, the fourth photoelectric converter, and the fifth photoelectric converter are configured such that whether to allow the second photoelectric converter, the third photoelectric converter, the fourth photoelectric converter, and the fifth photoelectric converter to be sensitive to light is controlled in a collective manner, the first photoelectric converter and the first capacitive element are connected to each other via the first switching device, and the second photoelectric converter and the first capacitive element are connected to each other via the second switching device.

* * * * *